United States Patent
Constantin et al.

(10) Patent No.: US 12,301,172 B2
(45) Date of Patent: May 13, 2025

(54) POWER AMPLIFIER LINEARIZING MODULE AND POWER AMPLIFIER SYSTEM EQUIPPED THEREWITH

(71) Applicant: SOCOVAR S.E.C., Quebec (CA)

(72) Inventors: Nicolas G. Constantin, Notre-Dame-de-l'ile Perrot (CA); Smarjeet Sharma, Arnhem (NL)

(73) Assignee: ECOLE DE TECHNOLOGIE SUPERIEURE, Montreal (CA)

( * ) Notice: Subject to any disclaimer, the term of this patent is extended or adjusted under 35 U.S.C. 154(b) by 581 days.

(21) Appl. No.: 17/642,393

(22) PCT Filed: Sep. 11, 2020

(86) PCT No.: PCT/CA2020/051232
§ 371 (c)(1),
(2) Date: Mar. 11, 2022

(87) PCT Pub. No.: WO2021/046654
PCT Pub. Date: Mar. 18, 2021

(65) Prior Publication Data
US 2022/0337199 A1    Oct. 20, 2022

Related U.S. Application Data

(60) Provisional application No. 62/899,793, filed on Sep. 13, 2019, provisional application No. 62/972,179, filed on Feb. 10, 2020.

(51) Int. Cl.
*H03F 1/32* (2006.01)
*H03F 1/02* (2006.01)
(Continued)

(52) U.S. Cl.
CPC ......... *H03F 1/3247* (2013.01); *H03F 1/0227* (2013.01); *H03F 3/245* (2013.01);
(Continued)

(58) Field of Classification Search
CPC ...... H03F 1/3247; H03F 1/0227; H03F 3/245; H03F 2200/102; H03F 2200/451; H03F 3/19; H04B 2001/0425
(Continued)

(56) References Cited

U.S. PATENT DOCUMENTS 5,420,536 A    5/1995  Faulkner et al.
5,623,226 A    4/1997  Whitmarsh et al.
(Continued)

FOREIGN PATENT DOCUMENTS

AU    PL782893        3/1993
AU    2016307964 A1   3/2018
(Continued)

OTHER PUBLICATIONS

Nonlinear three-Port Representation of PAs for Embedded Self-Calibration of Envelope-Dependent Dynamic Biasing Implementation Pub: Nov. 28, 2019 Digital Object Identifier 10.1109/ACCESS.2019.29567221 Authors: Smarjeet Sharma and Nicolas Constantin.
(Continued)

*Primary Examiner* — Andrea Lindgren Baltzell
*Assistant Examiner* — Khiem D Nguyen
(74) *Attorney, Agent, or Firm* — IP Delta Plus Inc.

(57) ABSTRACT

The present power amplifier linearizing module linearizes operation of a power amplifier and operates in parametrizing mode and operation mode. A processing module executes a feed-forward transfer functions set, which includes at least: a transfer function P and a summing function. The transfer function P derives a change signal $\Delta V_a$ relative to the control signal component received and the summing function summing the incremental change signal $\Delta V_a$ to an input signal to generate an adjusted input signal. A transfer function G uses the adjusted input signal to generate an RF signal representative of the amplifying of the adjusted input signal
(Continued)

based on the control signal component. The processing module determines a linearizing control signal component based on the generated RF signal representative.

11 Claims, 37 Drawing Sheets

(51) Int. Cl.
  *H03F 3/24* (2006.01)
  *H04B 1/04* (2006.01)

(52) U.S. Cl.
  CPC ..... *H04B 1/0475* (2013.01); *H03F 2200/102* (2013.01); *H03F 2200/451* (2013.01); *H04B 2001/0425* (2013.01)

(58) Field of Classification Search
  USPC ..... 330/149, 136, 297, 127; 455/126, 114.1, 455/114.2, 114.3, 127.1, 127.2, 115.1, 455/115.2, 115, 3
  See application file for complete search history.

(56) References Cited

U.S. PATENT DOCUMENTS

| | | | |
|---|---|---|---|
| 6,107,872 | A | 8/2000 | Schoepe et al. |
| 6,111,462 | A | 8/2000 | Mucenieks et al. |
| 6,961,554 | B1 | 11/2005 | Constantin |
| 7,602,244 | B1 | 10/2009 | Holmes et al. |
| 7,719,354 | B2 | 5/2010 | Constantin |
| 8,019,701 | B2 | 9/2011 | Sayyar-Rodsari et al. |
| 8,963,636 | B1 | 2/2015 | Krett et al. |
| 10,320,345 | B2 | 6/2019 | Sharma et al. |
| 2001/0041547 | A1 | 11/2001 | Kazakevich et al. |
| 2003/0001672 | A1 | 1/2003 | Cavers et al. |
| 2003/0207680 | A1 | 11/2003 | Yang et al. |
| 2004/0100323 | A1 | 5/2004 | Khanifar et al. |
| 2005/0270103 | A1 | 12/2005 | Constantin |
| 2006/0199552 | A1 | 9/2006 | Blech et al. |
| 2006/0238245 | A1 | 10/2006 | Carichner et al. |
| 2006/0285481 | A1 | 12/2006 | Lane et al. |
| 2007/0222519 | A1 | 9/2007 | Deng et al. |
| 2008/0144707 | A1 | 6/2008 | Tsfati et al. |
| 2009/0197547 | A1 | 8/2009 | Wang |
| 2010/0277252 | A1 | 11/2010 | Gorbachov |
| 2011/0018628 | A1 | 1/2011 | Yang et al. |
| 2011/0095819 | A1 | 4/2011 | Velazquez |
| 2011/0181324 | A1 | 7/2011 | Gesche et al. |
| 2012/0135697 | A1 | 5/2012 | Park et al. |
| 2012/0208477 | A1 | 8/2012 | Nath et al. |
| 2013/0070811 | A1 | 3/2013 | Kim et al. |
| 2013/0329833 | A1 | 12/2013 | Bai |
| 2014/0333376 | A1 | 11/2014 | Hammi |
| 2015/0180594 | A1 | 6/2015 | Chakaborty et al. |
| 2016/0261241 | A1 | 9/2016 | Hammi et al. |
| 2017/0244365 | A1 | 8/2017 | Hammi et al. |
| 2018/0131452 | A1 | 5/2018 | Sharma |
| 2018/0198424 | A1 | 7/2018 | Sharma et al. |
| 2018/0241347 | A1 | 8/2018 | Petrovic et al. |
| 2018/0316312 | A1 | 11/2018 | Sharma et al. |
| 2020/0244232 | A1* | 7/2020 | Cope ................... H03F 1/0272 |

FOREIGN PATENT DOCUMENTS

| | | |
|---|---|---|
| CA | 2404824 C | 8/2006 |
| CA | 2505189 C | 9/2012 |
| CN | 204180019 U | 2/2015 |
| CN | 104580044 A | 4/2015 |
| CN | 204334364 U | 5/2015 |
| CN | 105119581 A | 12/2015 |
| CN | 106126804 A | 11/2016 |
| CN | 105224985 A | 10/2017 |
| CN | 107908814 A | 4/2018 |
| CN | 109660219 A | 4/2019 |
| CN | 106571780 A | 11/2019 |
| CN | 107453717 A | 9/2020 |
| CN | 109088681 A | 10/2021 |
| EP | 0706259 A1 | 7/2000 |
| EP | 1366566 A2 | 12/2003 |
| EP | 1675257 B1 | 6/2006 |
| EP | 1897314 B1 | 3/2008 |
| EP | 2005577 B1 | 12/2008 |
| EP | 2164170 A1 | 3/2010 |
| EP | 2859655 B1 | 9/2016 |
| EP | 2106648 B1 | 8/2018 |
| IN | 106452377 A | 2/2019 |
| SG | 191912 A1 | 8/2013 |
| WO | 2014205725 A1 | 12/2014 |
| WO | 15163800 A1 | 10/2015 |
| WO | 2018068871 A1 | 4/2018 |

OTHER PUBLICATIONS

T. H. Miers and V. A. Hirsch, "A thorough investigation of dynamic bias on linear GaAs FET power amplifier performance," 1992 IEEE MTT-S Microwave Symposium Digest, Albuquerque, NM, USA, 1992, pp. 537-540 vol.2.

J. Nam and B. Kim, "The Doherty Power Amplifier With On-Chip Dynamic Bias Control Circuit for Handset Application," In IEEE Transactions on Microwave Theory and Techniques, vol. 55, No. 4, pp. 633-642, Apr. 2007.

B. Sahu and G. A. Rincon-Mora, "A High Efficiency WCDMA RF Power Amplifier With Adaptive, Dual-Mode Buck-Boost Supply and Bias-Current Control," in IEEE Microwave and Wireless Components Letters, vol. 17, No. 3, pp. 238-240, Mar. 2007.

S. Forestier, P. Bouysse, R. Quere, A. Mallet, J. M. Nebus and L. Lapierre, "Joint optimization of the power-added efficiency and the error-vector measurement of 20-GHz pHEMT amplifier through a new dynamic bias-control method," in IEEE Transactions on Microwave Theory and Techniques, vol. 52, No. 4, pp. 1132-1141, Apr. 200.

N. Deltimple, L. Leyssenne, E. Kervé, Y. Deval and D. Belot, "Dynamic biasing techniques for RF power amplifier linearity and efficiency improvement," 2010 IEEE International Conference on Integrated Circuit Design and Technology, Grenoble, 2010, pp. 232-235.

P. Medrel, T. Reveyrand, A. Martin, P. Bouysse, J. M. Nébus and J. Sombrin, "Time domain envelope characterization of power amplifiers for linear and high efficiency design solutions," WAMICON 2013, Orlando, FL, 2013, pp. 1-6.

F. F. Tafuri, D. Sira, O. K. Jensen and T. Larsen, "Efficiency enhancement of an envelope tracking power amplifier combining supply shaping and dynamic biasing," 2013 European Microwave Conference, Nuremberg, 2013, pp. 1491-1494.

Po-Chih Wang et al., "A 2.4-GHz +25dBm P-1dB linear power amplifier with dynamic bias control in a 65-nm CMOS process," ESSCIRC 2008—34th European Solid-State Circuits Conference, Edinburgh, 2008, pp. 490-493.

K. Onizuka, K. Ikeuchi, S. Saigusa and S. Otaka, "A 2.4 GHz CMOS Doherty power amplifier with dynamic biasing scheme," 2012 IEEE Asian Solid State Circuits Conference (A-SSCC), Kobe, 2012, pp. 93-96.

S. Sharma, N. G. Constantin and Y. Soliman, "Positive envelope feedback for linearity improvement in RFIC PAs," 2017 27th International Conference Radioelektronika, Brno, 2017, pp. 1-5.

S. Kang, D. Baek and S. Hong, "A 5-GHz WLAN RF CMOS Power Amplifier With a Parallel-Cascoded Configuration and an Active Feedback Linearizer," in IEEE Transactions on Microwave Theory and Techniques, vol. 65, No. 9, pp. 3230-3244, Sep. 2017.

B. K. Thangarasu, K. Ma and K. S. Yeo, "A 0.029 mm2 8 Gbit/s current-mode AGC amplifier with reconfigurable closed-loop control in 65 nm CMOS," 2017 IEEE MTT-S International Microwave Symposium (IMS), Honololu, HI, 2017, pp. 107-110.

M. El-Shennawy, N. Joram and F. Ellinger, "A 55 dB range gain interpolating variable gain amplifier with improved offset cancellation," 2016 12th Conference on Ph.D. Research in Microelectronics and Electronics (PRIME), Lisbon, 2016, pp. 1-4.

(56) References Cited

OTHER PUBLICATIONS

J. Joung, C. K. Ho and S. Sun, "Power Amplifier Switching (PAS) for Energy Efficient Systems," in IEEE Wireless Communications Letters, vol. 2, No. 1, pp. 14-17, Feb. 2013.
Y. Yang, J. Yi, J. Nam, B. Kim, "Behavioral modeling of high power amplifiers based on measured two-tone transfer characteristics", Microwave J. (Euro-Global Edition), vol. 43, pp. 90-104, Dec. 2000.
G. P. Gibiino, G. Avolio, D. M. M.—. Schreurs, A. Santarelli and F. Filicori, "A Three-Port Nonlinear Dynamic Behavioral Model for Supply-Modulated RF PAs," in IEEE Transactions on Microwave Theory and Techniques, vol. 64, No. 1, pp. 133-147, Jan. 2016.
C. Pedro and S. A. Maas, "A comparative overview of microwave and wireless power-amplifier behavioral modeling approaches," in IEEE Transactions on Microwave Theory and Techniques, vol. 53, No. 4, pp. 1150-1163, Apr. 2005.
A. S. Tehrani, H. Cao, S. Afsardoost, T. Eriksson, M. Isaksson and C. Fager, "A Comparative Analysis of the Complexity/Accuracy Tradeoff in Power Amplifier Behavioral Models," in IEEE Transactions on Microwave Theory and Techniques, vol. 58, No. 6, pp. 1510-1520, Jun. 2010.
G. P. Gibiino, A. Santarelli, D. Schreurs and F. Filicori, "Two-Input Nonlinear Dynamic Model Inversion for the Linearization of Envelope-Tracking RF PAs," in IEEE Microwave and Wireless Components Letters, vol. 27, No. 1, pp. 79-81, Jan. 2017.
S.A Maas, Nonlinear Microwave and RF Circuits, 2nd ed., Norwood, MA, USA: Artech House, 2003, pp. 235-250.
Hyunchul Ku and J. S. Kenney, "Estimation of error vector magnitude using two-tone intermodulation distortion measurements [power amplifier]," 2001 IEEE MTT-S International Microwave Symposium Digest (Cat. No. 01CH37157), Phoenix, AZ, 2001, pp. 17-20 vol. 1.
N.B. De Carvalho and Jose Pedro, "Compact formulas to relate ACPR and NPR to two-tone IMR and IP3", Microwave J., Dec. 1999.
B. Park et al., "Highly Linear mm-Wave CMOS Power Amplifier," in IEEE Transactions on Microwave Theory and Techniques, vol. 64, No. 12, pp. 4535-4544, Dec. 2016.
K. W. Lau, Q. Xue and C. H. Chan, "A Novel Biasing Technique for Low Adjacent Channel Power in Microwave Power Amplifiers," 2007 Asia-Pacific Microwave Conference, Bangkok, 2007, pp. 1-4.
C. J. Clark, C. P. Silva, A. A. Moulthrop, M. S. Muha, "Power-amplifier characterization using a two-tone measurement technique", IEEE Trans. Microw. Theory Tech., vol. 50, No. 6, pp. 1590-1602, Jun. 2002.
J. C. Pedro, N. B. Carvalho, C. Fager, and J. A. Garcia, "Linearity versus efficiency in mobile handset power amplifiers: a battle without a loser," in Proc. Microw. Eng. Eur., Aug. 2004.
Skyworks Solutions, Inc., "SE5003L1-R: High-Power (+19 dBm) 802.11ac WLAN Power Amplifier with Integrated Power Detector," SE5003L1-R datasheet, Oct. 2013.
C. Fager, J. C. Pedro, N. B. de Carvalho, H. Zirath, F. Fortes and M. J. Rosario, "A comprehensive analysis of IMD behavior in RF CMOS power amplifiers," in IEEE Journal of Solid-State Circuits, vol. 39, No. 1, pp. 24-34, Jan. 2004.
Sharma and N. G. Constantin, "Formulations for the Estimation of IMD Levels in an Envelope Feedback RFIC Amplifier: An Extension to Dynamic AM and PM Behavior," in IEEE Transactions on Computer-Aided Design of Integrated Circuits and Systems, vol. 32, No. 12, pp. 2019-2023, Dec. 2013.

* cited by examiner

SIMULATED VS PREDICTED VALUES OF OPTIMUM DYNAMIC BIAS FOR PA2

| P$_{out}$ (average) of PA2 (dBm) | | 14.0 | 14.2 | 14.4 | 14.6 | 14.8 |
|---|---|---|---|---|---|---|
| Values under constant (DC) bias | | | | | | |
| IMD$_{3hi}$ (dBc) | | -22.84 | -22.75 | -22.70 | -22.58 | -22.50 |
| Values from pre-distortion predicted using Adjusted PA linearizing module with G only | | | | | | |
| Dynamic Bias | Value (mV) | 37.6 | 38.5 | 39.8 | 40.5 | 42.0 |
| IMD$_{3hi}$ | Value (dBc) | -24.86 | -25.10 | -25.35 | -25.60 | -25.80 |
| | Δ (dB) | 2.02 | 2.35 | 2.65 | 3.02 | 3.30 |

Figure 13

SIMULATED VS PREDICTED VALUES OF OPTIMUM DYNAMIC BIAS FOR PA3

| $P_{out}$ (average) of PA3 (dBm) | | 12.1 | 12.3 | 12.5 | 12.7 | 12.9 |
|---|---|---|---|---|---|---|
| Values under constant (DC) bias | | | | | | |
| $IMD_{3hi}$ (dBc) | | -23.25 | -23.15 | -23.00 | -22.90 | -22.75 |
| Values from pre-distortion predicted using PA linearizing module with G only | | | | | | |
| Dynamic Bias | Value (mV) | 30.8 | 31.7 | 32.5 | 33.4 | 34.2 |
| $IMD_{3hi}$ | Value (dBc) | -27.75 | -28.00 | -28.25 | -28.50 | -28.80 |
| | Δ (dB) | 4.50 | 4.85 | 5.25 | 5.60 | 6.05 |

Figure 14

- All polynomials ($F_i$, $H_i$, $P_i$, $G_i$) may be linear or non-linear
- $V_{in}$ may be RF or baseband; $V_{out}$ is RF; $V_{ctrli}$ (that is $V_{ctrl3}$, ...$V_{ctrl(n)}$) may be RF or baseband
- Different polynomials $F_i$ may share some coefficients; similarly, different polynomials $H_i$, $P_i$, $G$ respectively may share some coefficients Bias$_i$ may be RF-dependent or baseband-dependent Supply$_i$ may be RF-dependent or baseband-dependent Bias$_i$ may be RF-dependent or baseband-dependent Supply$_i$ may be RF-dependent or baseband-dependent

POWER AMPLIFIER LINEARIZING MODULE AND POWER AMPLIFIER SYSTEM EQUIPPED THEREWITH

TECHNICAL FIELD

The present disclosure relates to the field of power amplifiers, and more particularly to power amplifier linearizing module and a power amplifier system equipped with such a power amplifier linearizing module.

BACKGROUND

Dynamic biasing plays an important role in the design of many Radio Frequency Integrated Circuit (RFIC) Power Amplifier (PA). Dynamic biasing involves variation of a bias signal of the PA's Radio Frequency (RF) transistors around its quiescent Direct Current (DC) level as a function of a control signal, for the purpose of improving a linearity-power efficiency trade-off. Such control signal may be a function of the PA's average power level or PA instantaneous power level such as RF power or envelope power levels. For example, dynamic biasing as a function of the average RF power level is used to improve the power added efficiency (PAE) of RF amplifiers, and some examples are described in:

K. W. Lau, Q. Xue and C. H. Chan, "A Novel Biasing Technique for Low Adjacent Channel Power in Microwave Power Amplifiers," 2007 *Asia-Pacific Microwave Conference*, Bangkok, 2007, pp. 1-4;

T. H. Miers and V. A. Hirsch, "A thorough investigation of dynamic bias on linear GaAs FET power amplifier performance," 1992 *IEEE MTT-S Microwave Symposium Digest*, Albuquerque, NM, USA, 1992, pp. 537-540 vol. 2;

J. Nam and B. Kim, "The Doherty Power Amplifier With On-Chip Dynamic Bias Control Circuit for Handset Application," in *IEEE Transactions on Microwave Theory and Techniques*, vol. 55, no. 4, pp. 633-642, April 2007; and B. Sahu and G. A. Rincon-Mora, "A High Efficiency WCDMA RF Power Amplifier With Adaptive, Dual-Mode Buck-Boost Supply and Bias-Current Control," in *IEEE Microwave and Wireless Components Letters*, vol. 17, no. 3, pp. 238-240, March 2007.

One example of the use of dynamic biasing as a function of the average RF power level for PA gain regulation and efficiency optimization is described in: S. Forestier, P. Bouysse, R. Quere, A. Mallet, J. M. Nebus and L. Lapierre, "Joint optimization of the power-added efficiency and the error-vector measurement of 20-GHz pHEMT amplifier through a new dynamic bias-control method," in *IEEE Transactions on Microwave Theory and Techniques*, vol. 52, no. 4, pp. 1132-1141, April 2004. Other examples of dynamic biasing as a function of the average RF power level are also discussed in the literature.

More particularly, examples of open-loop and feed-forward implementations that use a dynamic bias signal varying as a function of the PA's envelope power level, to improve PA performances, are discussed in:

Nicolas Constantin. "Dynamic Biasing System for an Amplifier," U.S. Pat. No. 7,719,354 B2, May 18, 2010;

N. Deltimple, L. Leyssenne, E. Kerhervé, Y. Deval and D. Belot, "Dynamic biasing techniques for RF power amplifier linearity and efficiency improvement," 2010 *IEEE International Conference on Integrated Circuit Design and Technology*, Grenoble, 2010, pp. 232-235;

P. Medrel, T. Reveyrand, A. Martin, P. Bouysse, J. M. Nebus and J. Sombrin, "Time domain envelope characterization of power amplifiers for linear and high efficiency design solutions," *WAMICON* 2013, Orlando, FL, 2013, pp. 1-6;

F. F. Tafuri, D. Sira, O. K. Jensen and T. Larsen, "Efficiency enhancement of an envelope tracking power amplifier combining supply shaping and dynamic biasing," 2013 *European Microwave Conference*, Nuremberg, 2013, pp. 1491-1494;

Po-Chih Wang et al., "A 2.4-GHz+25 dBm P-1 dB linear power amplifier with dynamic bias control in a 65-nm CMOS process," *ESSCIRC* 2008-34*th European Solid-State Circuits Conference*, Edinburgh, 2008, pp. 490-493; and K. Onizuka, K. Ikeuchi, S. Saigusa and S. Otaka, "A 2.4 GHz CMOS Doherty power amplifier with dynamic biasing scheme," 2012 *IEEE Asian Solid State Circuits Conference* (A-SSCC), Kobe, 2012, pp. 93-96.

A recently proposed positive envelope feedback technique, described in a publication by S. Sharma, Y. Soliman and N. G. Constantin, titled "Positive envelope feedback for linearity improvement in RFIC PAs," presented at the 2017 27*th International Conference Radioelektronika*, Brno, 2017, pp. 1-5, demonstrates the use of instantaneous dynamic biasing in a closed-loop system to improve the linearity-efficiency trade-off of PAs.

The use of active Field-Effect Transitor (FET) elements to provide dynamic negative feedback aimed at compensating PA's gain compression at high power levels has been discussed in a publication by S. Kang, D. Baek and S. Hong, titled "A 5-GHz WLAN RF CMOS Power Amplifier With a Parallel-Cascoded Configuration and an Active Feedback Linearizer," published in *IEEE Transactions on Microwave Theory and Techniques*, vol. 65, no. 9, pp. 3230-3244, September 2017. Other examples of dynamic negative feedback in PAs are also provided in the literature.

Examples of closed-loop systems that use dynamic feedback are not limited to PAs. Some examples of variable gain amplifier (VGA) implementations that rely on closed-loop negative feedback for gain control are discussed in:

B. K. Thangarasu, K. Ma and K. S. Yeo, "A 0.029 mm² 8 Gbit/s current-mode AGC amplifier with reconfigurable closed-loop control in 65 nm CMOS," 2017 *IEEE MTT-S International Microwave Symposium (IMS)*, Honololu, HI, 2017, pp. 107-110; and M. El-Shennawy, N. Joram and F. Ellinger, "A 55 dB range gain interpolating variable gain amplifier with improved offset cancellation," 2016 12*th Conference on Ph.D. Research in Microelectronics and Electronics (PRIME)*, Lisbon, 2016, pp. 1-4.

A PA's response to an envelope varying RF signal in the above implementations is governed by complex nonlinear mechanisms, and dynamically changing the PA's bias as a function of the envelope adds further complexity to the PA's response.

Moreover, the increasingly complex front-end PA modules in mobile transceivers may make use of different hardware states as part of a hardware reconfiguration scheme. One such example which uses PA switching is illustrated in a publication authored by J. Joung, C. K. Ho and S. Sun, titled "Power Amplifier Switching (PAS) for Energy Efficient Systems," published in *IEEE Wireless Communications Letters*, vol. 2, no. 1, pp. 14-17, February 2013. Other examples of PA modules in mobile transceivers making use of different hardware states as part of a hardware reconfiguration scheme are described in the literature.

Such complex mechanisms inevitably introduce variations in the PA performances from one mobile unit to another. In this context, a self-calibration technique embedded within the mobile unit that would allow optimizing the dynamic biasing (average-power dependent or envelope-dependent or RF-dependent) taking into account the performance variation from one unit to another would be of interest for current and future mobile wireless equipment. An example where embedded self-calibration would be useful is when the PA is subjected to dynamic biasing through the modulation of the gate bias as a function of the PA's envelope to improve the PAE-linearity trade-off, such as that discussed in:

S. Sharma, N. G. Constantin and Y. Soliman, "Positive envelope feedback for linearity improvement in RFIC PAs," 2017 27th *International Conference Radio-elektronika*, Brno, 2017, pp. 1-5; and S. Kang, D. Baek and S. Hong, "A 5-GHz WLAN RF CMOS Power Amplifier With a Parallel-Cascaded Configuration and an Active Feedback Linearizer," in *IEEE Transactions on Microwave Theory and Techniques*, vol. 65, no. 9, pp. 3230-3244, September 2017.

There is therefore a need for a power amplifier linearizing module adapted for self-calibrating a power amplifier embedded for example in a mobile unit, which would perform adjustments to the power amplifier of the specific mobile unit, to reduce a spread in performance, and thereby ensuring improved PAE-linearity trade-off on a per mobile unit.

SUMMARY

The present power amplifier (PA) linearizing module linearizes operation of a power amplifier. The power amplifier linearizing module comprises a first input port for receiving an input signal, a second input port for receiving a control signal component and a processing module. The processing module is adapted for operating in parametrizing mode and in operation mode and for executing a feed-forward transfer functions set. The feed-forward transfer functions set includes at least: a transfer function P and a summing function. The processing module executes the transfer function P of the feed-forward transfer functions set for deriving an incremental change signal $\Delta V_a$ relative to the control signal component received and executes a summing function for summing the incremental change signal $\Delta V_a$ to the input signal to generate an adjusted input signal. The processing module further executes a transfer function G using the adjusted input signal to generate an RF signal representative of the amplifying of the adjusted input signal based on the control signal component. The processing module determines a linearizing control signal component based on the generated RF signal representative of the amplifying of the adjusted input signal, to be applied to the power amplifier based on the input signal.

BRIEF DESCRIPTION OF THE DRAWINGS

Embodiments of the disclosure will be described by way of example only with reference to the accompanying drawings, in which:

FIG. 13 illustrates data for simulated vs determined (predicted on the Figure) values of Optimum Dynamic Bias for the second PA implementation (PA2) of FIG. 12;

FIG. 14 illustrates data for simulated vs determined (predicted on the Figure) values of Optimum Dynamic Bias for the third PA implementation (PA3) of FIG. 12;

DETAILED DESCRIPTION

Figure 1:
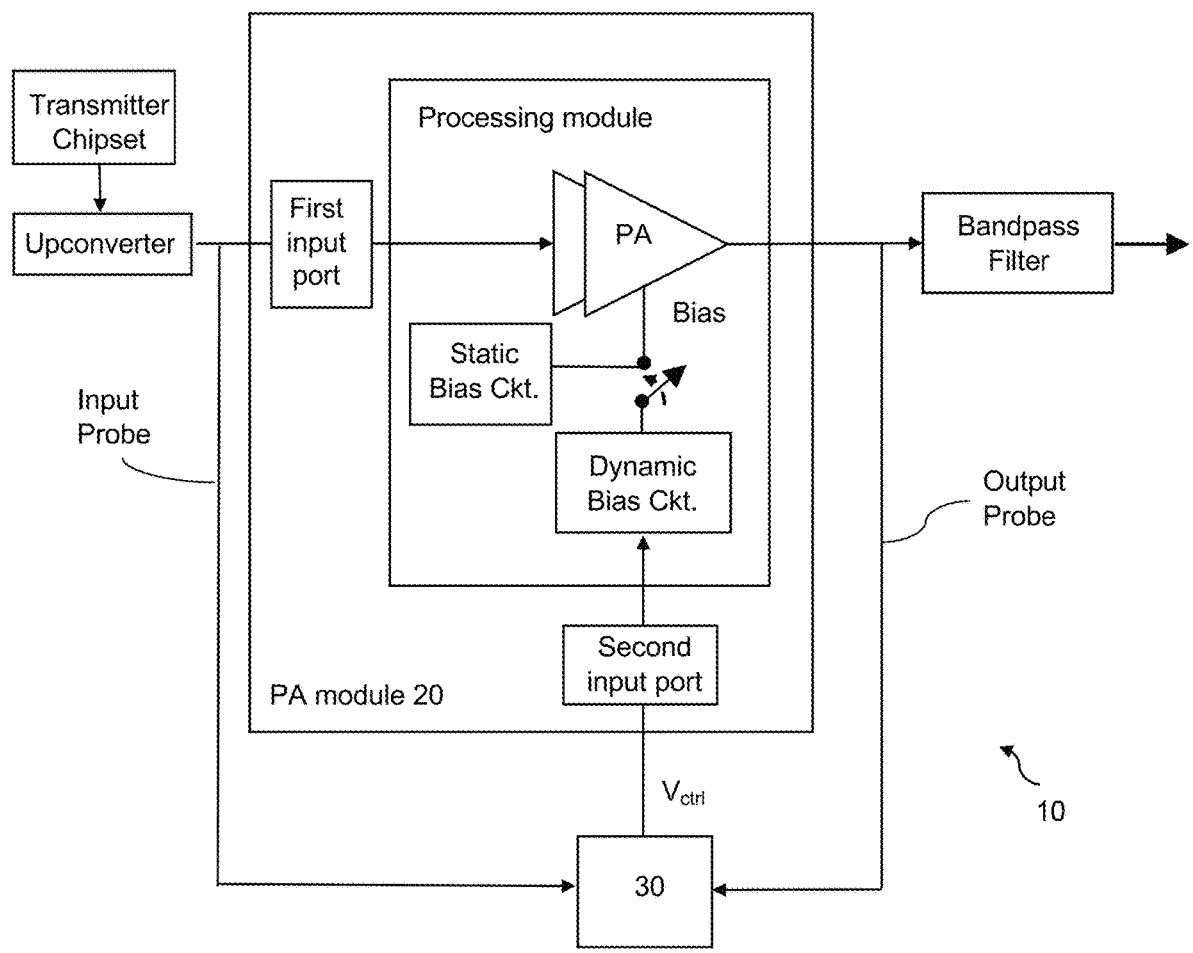
FIG. 1 is a schematic illustration of a Power Amplifier (PA) system 10, which comprises a Power Amplifier (PA) 20 and a PA linearizing module (shown on some of the Figures as X) 30.

The foregoing and other features will become more apparent upon reading of the following non-restrictive description of illustrative embodiments thereof, given by way of example only with reference to the accompanying drawings. Like numerals represent like features on the various drawings.

In the present description, the following expressions should be interpreted as follows:

Baseband signal: unmodulated Radio Frequency signal.

Modulated signal: baseband signal modulated on a carrier. The baseband signal may be modulated in frequency and/or phase.

Power Amplifier (PA): electronic component adapted to receive a low-power Radio Frequency signal and generate therefor a higher-power Radio Frequency signal. The electronic component may perform one or several additional functionalities, such as for example amplifier mixer, frequency mixing, phase-shifting or any other additional functionality well known in the art.

Power Amplifier system: a system that comprises at least one Power Amplifier (PA) and at least one Power Amplifier (PA) linearizing module, which is used for receiving a modulated input signal, amplifying the modulated input signal an outputting a modulated amplified signal.

PA linearizing module: software, hardware (processor or processor module, memory, or any other hardware adapted for performing some or all of tasks of the PA linearizing module described herein) adapted for being parametrized and adapted for controlling the at least one PA in such a manner as to linearize at least one characteristic of the amplified signal: instantaneous-amplitude variations of the amplified signal as a function of time; phase variations of the signal as a function of time; simultaneous instantaneous-amplitude and phase variations of the amplified signal as a function of time; instantaneous-amplitude and/or phase variations of the amplified signal represented by any of the various mathematical formulations that are commonly used in the scientific community in the area of RF transmitters and/or receivers for communication systems for the purpose of describing qualitatively or quantitatively the instantaneous-amplitude and phase characteristics of the amplified modulated RF signal at the output of a nonlinear amplifying system and/or to describe how these same characteristics deviate from the instantaneous-amplitude and phase characteristics of the original modulated RF signal applied to any input of this nonlinear amplifying system, including, but not limited to the following descriptive formulation examples: (i) a time-domain mathematical expression representing qualitatively or quantitatively a modulated RF signal in a way that allows describing simultaneously the instantaneous-amplitude variations with time as well as describing the phase variations with time and with respect to a phase reference that may be in the form of a time-domain sine function or a time-domain cosine function or a combination of both these functions or in the form of any other function that may constitute a phase and/or time reference that allows quantifying the phase characteristics of a modulated RF signal; (ii) a frequency-domain mathematical expression representing qualitatively or quantitively a modulated RF signal in a way that may allow describing its frequency spectrum and in a way that may allow quantifying this signal over its full frequency spectrum and/or at any given frequency in its spectrum using qualitative or quantitative terms of amplitude and phase, such as, but not limited to: phasor-based expressions that include complex numbers, or discrete-signals that are commonly used in the area of digital signal processing.

Transfer function: any type of mathematical function or mathematical representation (including tables and matrices) which can be parametrized before and/or during operation. The transfer function may be linear, nonlinear, polynomial, based on real and/or complex numbers. Multiple transfer functions may be used concurrently and/or sequentially. The transfer function may affect amplitude, frequency and/or a phase.

For simplicity purposes, the expressions Power Amplifier (PA) and PA linearizing module will be used in the singular form, but the present PA system is not limited to such an implementation, and to that effect, the expressions the PA and the PA linearizing module should be construed as at least one PA and at least one PA linearizing module respectively.

The expression Power Amplifier nonlinearities will be used in the plural form throughout the present specification, but the present PA linearizing module and PA system are not limited to addressing multiple nonlinearities of the PA concurrently.

The PA linearizing module may emulate by means of transfer functions one or several of the following components concurrently, separately, sequentially or inter-dependently: a combiner, a nonlinear baseband-to-RF converter or a nonlinear frequency band-to-frequency band converter, and/or a nonlinear RF amplifying function.

The PA linearizing module is parametrized under any of the following modes: a constant mode, a dynamic mode or a combination of constant mode and dynamic mode, which will be both described further on. Values of the parameters or coefficients of the transfer functions of the PA linearizing module are extracted during parametrization, and/or dynamically extracted during operation.

The PA linearizing module determines a control signal $V_{ctrl}$ to be applied to the PA to linearize the amplification of the PA and/or improve the efficiency of the PA. The PA linearizing module may be embedded within the PA system or added to an electronic device such as for example a mobile unit. Thus, the PA linearizing module may for example be embedded in a mobile unit, and be parametrized taking into consideration the mobile unit transmitter front-end, and in operation dynamically control the power amplifier(s) of the mobile unit taking into consideration the mobile unit transmitter particularities. The PA linearizing module dynamically adjusts the PA control signal for the PA and particularities of the signal flow it has been parametrized for, thereby providing a customized PA linearizing module on a per mobile unit basis. This novel approach provides a PA linearizing module which compensates for part-to-part variation of the PA and the mobile unit behavior. The different tests discussed further, based on both simulation and experimental implementations, highlight the simplicity and accuracy of the present PA linearizing module and the PA linearizing module parametrization compared to prior art PA linearization solutions, and use of the PA linearizing module for embedded PA self-calibration using open-loop or closed-loop.

Parametrization of the transfer functions of the PA linearizing module may be performed with one-tone signals, 2-tone signals, 3-tone signals, multi-tone signals, broadband signals and modulated signals. In operation mode, the transfer functions operate using broadband signals or modulated signals. For clarity purposes, the names of the input signals and output signal of the transfer functions differ in parametrization mode and operation mode. More precisely, the following names are used in the parametrization mode:

$V_{in}$: parametrizing input signal;
$V_O$: parametrizing output signal;
while the corresponding following names are used in the operation mode:
$V_{in}$: input signal; and
$V_O$: output signal or amplified input signal.

Reference is made to FIG. 1, which schematically illustrates an example of PA system 10 with embedded RF front-end self-calibration. The control signal $V_{ctrl}$ corresponds to a control signal to be applied at a gate of the PA 20. The control signal $V_{ctrl}$ is computed by the PA linearizing module 30, as will be discussed further. The PA linearizing module 30 is parametrized on a per PA basis, and when the PA is embedded in a mobile unit, on a per mobile unit basis, by parametrizing the PA linearizing module 30 for example by starting from a minimum number of quasi-static power measurements over a narrow power range only, using Input Probe and Output Probe. The PA linearizing module 30 provides for a sufficiently high order of PA nonlinearity, is straightforward to extract and store and is adapted for embedding into mobile equipment for PA self-calibration (hence excluding commercially available tools/software). Thus, the control signal $V_{ctrl}$ added to the DC bias of the PA (or any other port of the PA that influence a behavior of the PA) is generated by the parametrized PA linearizing module 30. The PA linearizing module 30, once parametrized, determines the value of the control signal $V_{ctrl}$ at different power levels. The PA linearizing module 30 may be used for embedded front-end self-calibration on a per mobile basis in any of the following ways:

measuring both quasi-static input and output power over any of a narrow power range up to a large power range;

measuring quasi-static input or output power over any of a narrow power range up to a large power range;

measuring both dynamic, input power and dynamic output power over a narrow power range up to a large power range;

measuring dynamic input power or dynamic output power over a narrow power range up to a large power range; and/or any other method suitable for performing self-calibration.

Examples of nonlinear representation of PAs are found in the literature, such as:

Y. Yang, J. Yi, J. Nam, B. Kim, "Behavioral modeling of high power amplifiers based on measured two-tone transfer characteristics", *Microwave J. (Euro-Global Edition)*, vol. 43, pp. 90-104, December 2000;

G. P. Gibiino, G. Avolio, D. M. M. -. Schreurs, A. Santarelli and F. Filicori, "A Three-Port Nonlinear Dynamic Behavioral Model for Supply-Modulated RF PAs," in *IEEE Transactions on Microwave Theory and Techniques*, vol. 64, no. 1, pp. 133-147, January 2016;

J. C. Pedro and S. A. Maas, "A comparative overview of microwave and wireless power-amplifier behavioral modeling approaches," in *IEEE Transactions on Microwave Theory and Techniques*, vol. 53, no. 4, pp. 1150-1163, April 2005; and A. S. Tehrani, H. Cao, S. Afsardoost, T. Eriksson, M. Isaksson and C. Fager, "A Comparative Analysis of the Complexity/Accuracy Tradeoff in Power Amplifier Behavioral Models," in *IEEE Transactions on Microwave Theory and Techniques*, vol. 58, no. 6, pp. 1510-1520, June 2010.

In such articles, frequent references are drawn to the Volterra series given by a multi-dimensional time-domain convolution, shown as equation (1) below. The full Volterra series is well known for its ability to model memory effects arising from weakly nonlinear mechanisms in PAs and represents an exact mathematical model in theory.

$$y(t) = \sum_{n=1}^{\infty} \int_{-\infty}^{+\infty} \cdots \int_{-\infty}^{+\infty} \frac{h(\tau_1, \ldots, \tau_n)}{\{x(t-\tau_1) \ldots x(t-\tau_n)\}} d\tau_1 \ldots d\tau_n \quad (1)$$

However, higher order Volterra kernels $h(\tau_1, \ldots, \tau_n)$, which are required to perfectly capture the PA's memory effects, present significant difficulties to extract due to the inherent complexity of the Volterra series, as explained in the publication authored by J. C. Pedro and S. A. Maas, titled "A comparative overview of microwave and wireless power-amplifier behavioral modeling approaches," and published in *IEEE Transactions on Microwave Theory and Techniques*, vol. 53, no. 4, pp. 1150-1163, April 2005.

Due to such difficulties in the extraction procedure, works based on using Volterra series for representing PAs often limit themselves to first-order Volterra kernels only, under the assumption that higher order Volterra kernels can be ignored without sacrificing the necessary level of accuracy. For example, the first order approximation of (1) is used for the modified Volterra series applied to a multi-tone excitation in the article authored by G. P. Gibiino, G. Avolio, D. M. M. -. Schreurs, A. Santarelli and F. Filicori, titled "A Three-Port Nonlinear Dynamic Behavioral Model for Supply-Modulated RF PAs," and published in *IEEE Transactions on Microwave Theory and Techniques*, vol. 64, no. 1, pp. 133-147, January 2016, and this modified Volterra series is represented as shown in equation (2).

$$y(t) \cong F[x(t)] + \int_{-\infty}^{+\infty} \frac{g_1(x(t), \tau_1)}{\{x(t-\tau_1) - x(t)\}} d\tau_1 \quad (2)$$

where $F[x(t)]$ represents the PA's quasi-static nonlinearity only. As shown in (2), the PA's quasi-static nonlinearity captured using $F[x(t)]$ is processed separately from the PA's dynamic nonlinearity captured using the first-order Volterra kernels.

In the context of embedded self-calibration within a mobile unit as discussed herein, the advantages of transfer functions using first order Volterra series over other equations-based representations is debatable, since in this context, the need for simplicity in the PA linearizing module parametrization steps and the computation algorithms largely outweighs the requirement for mathematically exact formulations. Moreover, even the extraction of first-order Volterra coefficients have been shown to present challenges, as discussed in the article authored by G. P. Gibiino, A. Sentarelli, D. Schreurs and F. Filicori, titled "Two-Input Nonlinear Dynamic Model Inversion for the Linearization of Envelope-Tracking RF PAs," and published in *IEEE Microwave and Wireless Components Letters*, vol. 27, no. 1, pp. 79-81, January 2017. By extension, it may be inferred that the extraction of higher order Volterra kernels can quickly become laboriously complex. Additionally, the use of higher order Volterra-based transfer functions in the context of re-tuning from one mobile unit to another during the operation of the mobile device presents difficulties in terms of complex parametrization sequences starting from low-order through to higher-order Volterra kernel extractions as explained in Chapter 4 of a book authored by S. A Maas, titled Nonlinear Microwave and RF Circuits, 2nd ed., Norwood, MA, USA: Artech House, 2003, pp. 235-250. Another key consideration is that the applicability of Volterra-based approach for closed-form analytical representation of closed-loop systems, which rely on RF and/or envelope feedback signals, has not been demonstrated.

The present PA linearizing module offers comparable accuracy as previous PA representations, with the added advantage of providing a closed-form analytical PA representation. The present PA linearizing module addresses these needs by:

(i) being based on transfer functions such as for example distinct sets of nonlinear complex polynomials that may emulate a combiner, a nonlinear baseband-to-RF converter and a nonlinear RF amplifying function. The PA linearizing module may capture the effects of dynamic biasing, including memory effects under multi-tone excitation, and improves linearity in terms of third-order intermodulation distortion ($IMD_3$), as well as reducing Adjacent Channel Power (ACP);

(ii) simplifying the computational requirements for dynamic control, in particular for high-order non-linearity and with comparable accuracy to earlier proposed Volterra based approaches;

(iii) simplifying parametrization of the transfer functions of the PA linearization module in a mobile unit for achieving embedded self-calibration;

(iv) providing embedded optimization of dynamic control performances on a per mobile unit basis; and (v) providing a closed-form analytical representation of open-loop and closed-loop envelope-based dynamic control, providing the determination of closed-loop feedback parameters to ensure stability and optimal linearity.

The parameters of the transfer functions of the PA linearizing module may be mathematically derived for example with the use of a multi-tone input excitation and a multi-tone dynamic control signal, with arbitrary amplitude and phase for each tone, taking into consideration high degree nonlinearities. It is well known that multi-tone representations may be strongly correlated to spectral regrowth under modulated excitations, as discussed in:

Hyunchul Ku and J. S. Kenney, "Estimation of error vector magnitude using two-tone intermodulation distortion measurements [power amplifier]," 2001 *IEEE MTT-S International Microwave Symposium Digest* (Cat. No. 01CH37157), Phoenix, AZ, 2001, pp. 17-20 vol. 1;

N. B. De Carvalho and Jose Pedro, "Compact formulas to relate ACPR and NPR to two-tone IMR and IP3", *Microwave J.*, December 1999; and B. Park et al., "Highly Linear mm-Wave CMOS Power Amplifier," in *IEEE Transactions on Microwave Theory and Techniques*, vol. 64, no. 12, pp. 4535-4544, December 2016.

Additionally, though the proposed PA linearizing module 30 is demonstrated in FIG. 1 for the PA's dynamic control (under open-loop and closed-loop conditions), the proposed PA linearizing module can be used to control other PA nonlinear dynamic mechanisms such as supply modulation.

The present PA linearizing module 30 transfer functions may emulate a combiner, a nonlinear baseband-to-RF converter and/or a nonlinear amplifying function, for the nonlinear processing of the dynamic bias signal. The PA linearizing module 30 transfer functions may accurately determine PA performances under larger peak-to-average excitation, with a distinct representation of the nonlinear transfer function from the baseband dynamic bias signal to the RF output signal, as required for embedded self-calibration applications.

Description of the Proposed PA Linearizing Module for Dynamic Control

Figure 2:
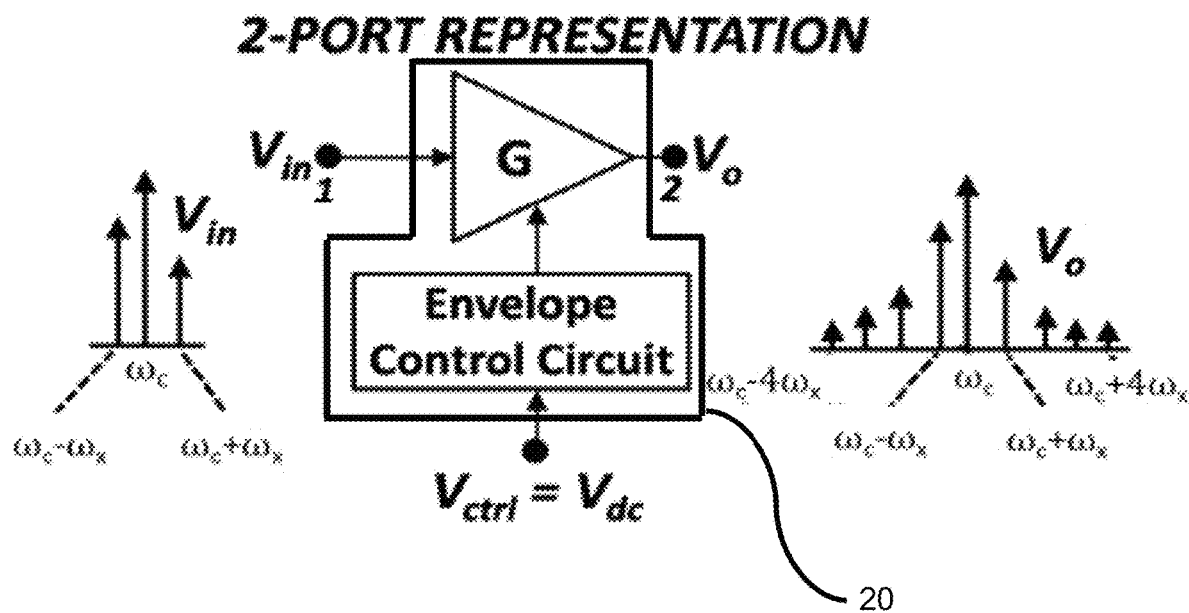
FIG. 2 illustrates a transfer function G under multi-tone parametrization, where a multi-tone parametrization input signal $V_{in}$ is injected at an input port of the transfer function G by applying a constant control signal $V_{ctrl}=V_{dc}$, and where $V_o$ represents the multi-tone parametrization output signal at an output port.

Reference is now made to FIG. 2, which is a block diagram representing a PA under constant control signal $V_{ctrl}=V_{dc}$. The PA is represented by a transfer function G, where the output signal $V_o$ can be derived from the input $V_{in}$ using equation (3):

$$v_o(t)=a_1 v_{in}(t)+a_3 v_{in}^3(t)+a_5 v_{in}^5(t)+\cdots \quad (3)$$

Equation (3) relies on an inherent assumption that the PA output has a bandpass filter to limit the RF output spectrum to a frequency range of interest around a carrier frequency $\omega_c$. Therefore, only the odd order terms of equation (3) are needed. The complex coefficients $a_1$, $a_3$, $a_5$ etc. of polynomial of the transfer function G account for the PA's dynamic AM-AM and AM-PM behavior when the control signal $V_{ctrl}=V_{dc}$. Only one example of the transfer function G is shown here i.e. a fifth order transfer function G with coefficients $a_1$, $a_3$, $a_5$ as shown in equation (3). Higher order implementations of the transfer function G is also possible; for example a $7^{th}$ order transfer function G with coefficients $a_1$, $a_3$, $a_5$, $a_7$; a $9^{th}$ order transfer function G with coefficients $a_1$, $a_3$, $a_5$, $a_7$, as etc. A publication authored by C. J. Clark, C. P. Silva, A. A. Moulthrop, M. S. Muha, titled "Power-amplifier characterization using a two-tone measurement technique", and published in *IEEE Trans. Microw. Theory Tech.*, vol. 50, no. 6, pp. 1590-1602, June 2002, demonstrated that the memory effects of a PA and its impact on the PA's IMD characteristics in response to a multi-tone input excitation can be accurately captured using the PA dynamic AM-AM and AM-PM responses. Such memory effects are dependent on the carrier frequency $\omega_c$, on envelope amplitude variations of a modulated RF signal, and on an envelope frequency set by a two-tone frequency spacing $\omega x$. The set-up shown in FIG. 2 uses a three-tone excitation, hence the approximations detailed in the previously mentioned publication remain valid and the experimental set-up shown in FIG. 2 of the same publication by Clark et al. can be used for the extraction of the PA's dynamic AM-AM and AM-PM, which is then used for parametrizing the transfer function G of FIG. 2.

The output signal $V_o$ of the transfer function G may be varied by modifying the control signal $V_{ctrl}$. Gain control by dynamically adjusting the current through electronic control of the bias/supply circuit is one example of a variation of the parameters of the transfer function G. Other ways of varying the parameters of the transfer function G by modifying the control signal $V_{ctrl}$ are also possible.

Figure 3:
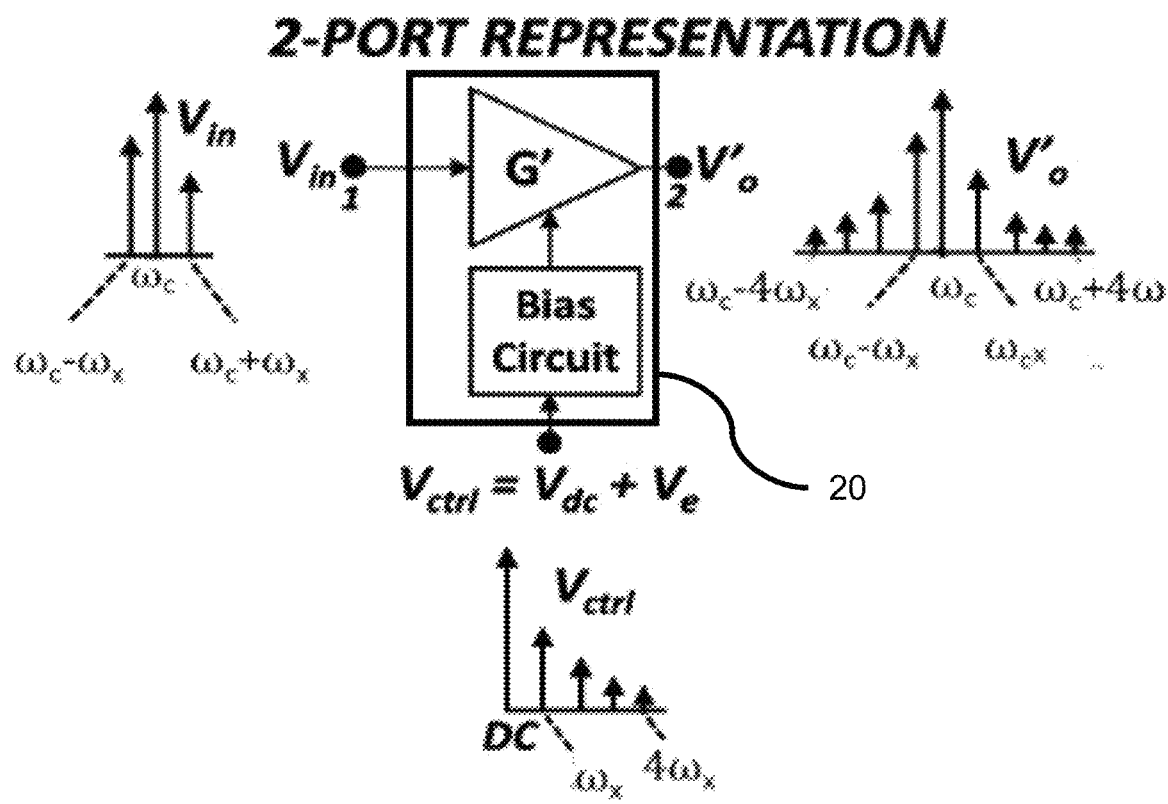
FIG. 3 illustrates the transfer function G of FIG. 2 under dynamic control signal $V_{ctrl}$, where $V_e$ is a dynamic bias component, and G' is a transfer function representative of the operation of the PA with a dynamic control signal $V_{ctrl}=V_{dc}$ $V_e$, and $V'_o$ at output represents the multi-tone parametrization output signal under dynamic parametrization.

Focusing now on dynamic control of the transfer function G' as an envelope dependent control, reference is made to FIG. 3 which shows an implementation where the dynamic bias component $V_e$ varying at a frequency of the input signal tone spacing $\omega x$ (as well as containing its higher order harmonics) is applied. The dynamic bias component $V_e$ is well known in techniques aimed at improving PA performances using envelope-dependent amplification control schemes and described in some of the previously cited publications.

Dynamic control as an envelope dependent control requires changing the control signal from static $V_{ctrl}=V_{dc}$ to dynamic $V_{ctrl}=V_{dc}+V_e$. The input signal $V_{in}$ remains unchanged, and a change in the output signal from $V_o$ to $V_o'$ under dynamic bias is captured by a change in the transfer function from G to G' (FIG. 3). G' therefore captures the PA's nonlinearities arising not only from an envelope modulated input signal, but also the nonlinearities due to a bias signal varying with the frequency of the PA's input/output envelope signal. However, any subsequent change in the control signal $V_{ctrl}$ necessitates parametrizing of another transfer function G", which reflects the PA's nonlinearities with the changed value of the control signal $V_{ctrl}$.

In light of the above, a PA linearization module that compensates for the PA's nonlinearities arising out of a change in the control signal, without resorting to a polynomial extraction routine with every such change, offers an attractive alternative, as well as an analytical representation of the PA's nonlinearities as a function of the control signal $V_{ctrl}$.

Figure 4:
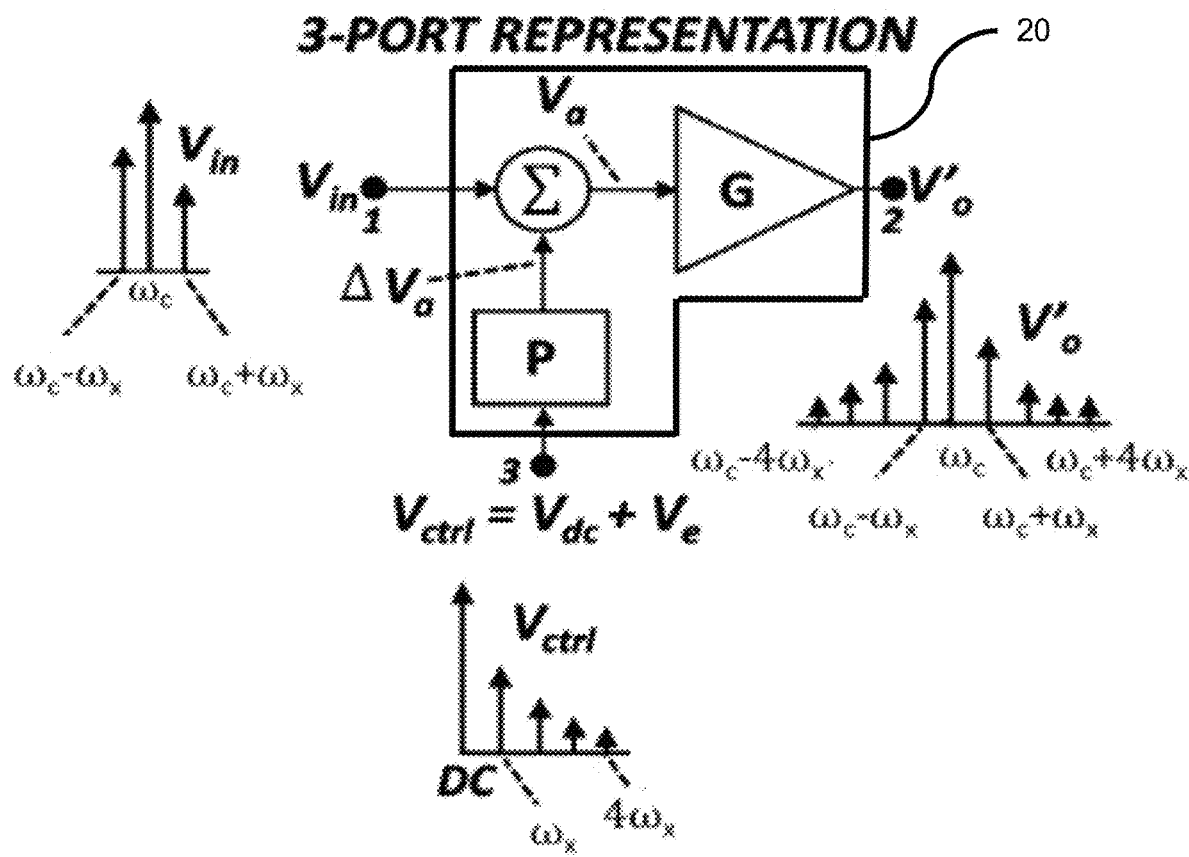
FIG. 4 illustrates a functional representation of the PA linearizing module, under dynamic control signal, where the third port (3) receives the dynamic control signal $V_{ctrl}=V_{dc}$ $V_e$, and G is the transfer function parametrized with the constant control signal $V_{ctrl}=V_{dc}$.

Reference is now made to FIG. 4, which functionally depicts the present PA linearizing module 30 under dynamic control signal $V_{ctrl}$. The change in the transfer function G to the transfer function G' as described in support of FIG. 3 (resulting in a change of the output IMD tones from $V_o$ to $V_o'$) is equivalently accounted for by an incremental change $\Delta V_a$ in a multi-tone input to the transfer function G, where G is parametrized with the control signal $V_{ctrl}=V_{dc}$, i.e. the dynamic control signal is not applied $V_e=0$. However, the incremental change $\Delta V_a$ is derived from the dynamic control signal $V_{ctrl}=V_{dc}+V_e$ using a transfer function P (comprising a set of complex coefficients p, that define a multi-tone baseband to multi-tone RF conversion gain), and the incremental change $\Delta V_a$, summed with the input signal $V_{in}$ to generate an adjusted input signal to be applied to the transfer function G, results in the modulated output signal $V_o'$. The summer and the incremental change $\Delta V_a$ in FIG. 4 are not physically present and represent a mathematical equivalence for illustration purposes only and are implemented as a summing transfer function executed by the processor.

It is worthwhile to note that PA tests and analysis based on multi-tone analysis are of significant help to designers. When limited to a few number of tones, such analysis offer intuitive insight and a relatively simple but accurate description of PA performances without dealing with the more complicated calculations involved when highly complex modulated excitation signals are used. Measurement data of multi-tone tests additionally allow easy and fast benchmarking using widely accepted PA performance measurements (such as $IMD_3$). Besides, the correlation of multi-tone measurements such as $IMD_3$ with other measurements used for complex modulated input signals (such as ACPR, EVM) is also documented in some of the previously mentioned publications.

Additionally, it is well-known that transfer functions that account for higher order nonlinear contributions enhances accuracy; however, the difficulty of extracting higher order kernels when using Volterra series (and given the challenges associated with even extracting first order Volterra coefficients) makes it prohibitively complex to use for applications such as embedded self-calibration. The PA linearizing module proposed here overcomes this limitation by capturing higher-order contributions of the dynamic control signal $V_{ctrl}$ to the modulated output signal during parametrization with the help of lower order polynomials that are easy to extract, thereby enhancing self-calibration accuracy.

For illustration purposes only, considering the proposed PA linearizing module shown in FIG. 4 being limited to a $3^{rd}$ order transfer function G (hence with coefficients $a_1$, $a_3$ only) and a $2^{nd}$ order transfer function P (hence with coefficients $p_1$, $p_2$). Additionally, to simplify without any loss of generality, consider a 1-tone parametrization signal $V_{in}$ at frequency $\omega_c$ and a 1-tone dynamic bias component $V_e$ (in addition to the quiescent DC value) at frequency $\omega_x$. As shown in FIG. 4, the output of the transfer function P being itself applied as input to the transfer function G, allows capturing an overall sixth order nonlinear dependence of the PA's output signal $V_o'$ on the dynamic bias component K. It can be shown through expansion of equation (3) and after simplification, that the value of the third-order output signal $V_o'(\omega_c+2\omega_x)$ shows this sixth-order nonlinear dependence as given by equation (4).

$$V_o'(\omega_c+2\omega_x)=k_2 V_e^2+k_3 V_e^3+k_4 V_e^4+k_5 V_e^5+k_6 V_e^6 \qquad (4)$$

where complex constants $k_2$, $k_3$, $k_4$, $k_5$ and $k_6$ stem from the coefficients of the transfer functions P and G.

For example, the dependence of $k_6$ on $a_3$ and $p_2$ is shown in equation (5).

$$k_6=9/4 \cdot a_3 \cdot p_2^3 \qquad (5)$$

Therefore, solving for $a_1$, $a_3$ and $p_1$, $p_2$ simultaneously allows capturing up to a sixth order dependence of the PA's output signal for the dynamic bias component $V_e$, despite the transfer function P being limited to $2^{nd}$ order and the transfer function G being limited to $3^{rd}$ order. The presence of even order terms in equation (4), although the transfer function G contains odd order terms only (as shown in equation (3)), is due to the fact that the transfer function P includes both even order and odd order baseband-to-RF contributions of the dynamic bias component $V_e$ to the incremental value $\Delta V_a$. These contributions are summed with the modulated input signal $V_{in}$ by the summing transfer function and then processed by the transfer function G, resulting in odd as well as even order terms in equation (4) that contribute to the modulated output signal $V_o'(\omega_c+2\omega_x)$ within the bandpass response of the PA. Additionally, other combinations of the orders of polynomials of the transfer functions G and P allow capturing a higher order dependence of the PA's output signal on the dynamic bias component $V_e$; as one example, a $3^{rd}$ order transfer function P and a $3^{rd}$ order transfer function G would result in an overall $9^{th}$ order dependence of the PA's output signal on the dynamic bias component $V_e$; as another example, a $3^{rd}$ order transfer function P and a $5^{th}$ order transfer function G would result in an overall $15^{th}$ order dependence of the PA's output signal on the dynamic bias component $V_e$ etc.

On the other hand, extracting the same $6^{th}$ order nonlinear dependence on the dynamic bias component $V_e$ when using Volterra-based transfer functions would require increasing the order in equation (2), with the significant added complexity associated with the extraction of higher order Volterra kernels as discussed before.

PA Linearizing Module—Parametrization

Parametrization of the PA linearizing module 30 with a three-tone parametrizing input signal $v_{in}(t)$ applied to the PA input is represented by equation (6).

$$v_{in}(t)=\Sigma_{i=-1}^{1} V_{in}(\omega_c+i\omega_x) \cdot \cos((\omega_c+i\omega_x)t+\theta_{\omega_c+i\omega_x}) \qquad (6)$$

where $V_{in}(\omega_c+i\omega_x)$ and $\theta_{\omega_c+i\omega_x}$ represent the magnitude and phase respectively for each tone of $v_{in}(t)$.

$V_{in}(-\omega_c-i\omega_x)=V_{in}(\omega_c+i\omega_x)$, $\theta_{-\omega_c-i\omega_x}=-\theta_{\omega_c-i\omega_x}$ where j is the complex imaginary unit. An equivalent bilateral form of equation (6) is given by equation (7).

$$v_{in}(t) = \frac{1}{2}\sum_{\omega_r=\omega_c,-\omega_c} \left( \sum_{i=-1}^{1} V_{in}(\omega_r + i\omega_x) \cdot e^{j\theta_{\omega_r+i\omega_x}} \cdot e^{j(\omega_r+i\omega_x)t} \right) \qquad (7)$$

While equations (6) and (7) are limited to a 3-tone parametrization signal, it is possible to extend the input signal $v_{in}(t)$ to include higher number of tones; for example, it may be a 5-tone parametrization signal, a 7-tone parametrization signal etc. The following description can further be extrapolated for such multi-tone parametrization signals.

The multi-tone dynamic bias component $V_e(t)$ applied to the control signal $V_{ctrl}$ (and added to $V_{dc}$) is in turn represented by equation (8).

$$v_e(t)=\Sigma_{i=1}^{m} V_e(i) \cdot \cos(i\omega_x t+\Phi_i) \qquad (8)$$

In equation (8), m refers to a number of significant tones (excluding DC) present in the dynamic bias component. For example, m equals 4 in FIG. 4 since the number of tones is 4, ranging from $\omega_x$ to $4\omega_x \cdot V_e(i)$ and $\Phi_i$ represent the magnitude and phase respectively for each tone of $v_e(t)$. Other values of m are also possible.

The nonlinear amplification of the dynamic bias component $V_e(t)$ through the transfer function P (FIG. 4) gives the incremental change signal $\Delta v_a(t)$ as expressed by equation (9).

$$\Delta v_a(t)=\Sigma_{i=-s}^{s} \Delta V_a(\omega_c+i\omega_x) \cdot \cos((\omega_c+i\omega_x)t+\gamma_{\omega_c+i\omega_x}) \qquad (9)$$

Where: $-\Delta V_a(\omega_c+i\omega_x)$ and $\gamma_{\omega_c+i\omega_x}$ represent the magnitude and phase respectively for each tone of $\Delta v_a(t)$;
$\Delta V_a(-\omega_c-i\omega_x)=\Delta V_a(\omega_c+i\omega_x)$, $\gamma_{-\omega_c-i\omega_x}=-\gamma_{\omega_c+\omega_x}$; and
j is the complex imaginary unit.

In equation (9), s is related to the number of significant tones present in the $\Delta v_a(t)$ signal, e.g. s=4 indicates that there are 9 tones in the $\Delta v_a(t)$ signal, at frequencies $\omega_c-4\omega_x$, $\omega_c-3\omega_x \ldots 0 \ldots \omega_c+3\omega_x$, $\omega_c+4\omega_x$. Other values of s are also possible. A bilateral form of equation (9) is given by equation (10).

$$\Delta v_a(t) = \frac{1}{2} \sum_{\omega_r=\omega_c,-\omega_c} \left( \sum_{i=-s}^{s} \Delta V_a(\omega_r + i\omega_x) \cdot e^{j\gamma_{\omega_r+i\omega_x}} \cdot e^{j(\omega_r+i\omega_x)t} \right) \quad (10)$$

The tones $\Delta V_a(\omega_r+i\omega_x) \cdot e^{j\gamma_{\omega_r+i\omega_x}}$ present in equation (10) are now expanded in terms of amplitude and phase to clearly show the relationship of these tones to the multi-tone dynamic bias component $V_e(t)$. With the help of coefficients $p_{iql}$ of the transfer function P, the value of the tones present in $\Delta v_a(t)$ is given by equation (11) below.

$$\{\Delta V_a(\omega_r + i\omega_x)e^{j\gamma_{\omega_r+i\omega_x}}\}|_{\omega_r=\omega_c} = \sum_{q=1}^{m} \sum_{l=1}^{n} p_{iql}\{V_e(q) \cdot \cos(\phi_q)\}^l \quad (11)$$

In equation (11), n refers to the order of the transfer function P. Order n of the transfer function P can be any integral order e.g. it can be 1, 2, 3, 4 etc. i varies from −s to +s, where s is as defined in equation (10). $V_e(q)$, $\phi_q$ and m are defined in equation (8). To understand the indexing of $p_{iql}$ in equation (11), consider (for example) the coefficient $p_{312}$. In equation (11), index 2 in $p_{312}$ represents that it captures the $2^{nd}$ order contribution of the dynamic bias component $V_e(1)$ for the tone at frequency $1 \cdot \omega_x$ in the dynamic bias component (given by index 1 in $p_{312}$), to the $3^{rd}$ side tone $\Delta V_a(\omega_c+3\omega_x)$ (given by index 3 in $p_{312}$). The extraction procedure of the polynomial coefficients $p_{iql}$ of the transfer function P is detailed further herein.

The incremental signal $\Delta v_a(t)$ is added to the input three-tone parametrization signal $v_{in}(t)$ to obtain $V_a(t)$ as shown by equation (12).

$$v_a(t) = v_{in}(t) + \Delta v_a(t) \text{ i.e.} \quad (12)$$

$$v_a(t) = \frac{1}{2}\sum_{\omega_r=\omega_c,-\omega_c}\left(\sum_{i=-1}^{1} V_{in}(\omega_r + i\omega_x) \cdot e^{j\theta_{\omega_r+i\omega_x}} \cdot e^{j(\omega_r+i\omega_x)t}\right) +$$

$$\frac{1}{2}\sum_{\omega_r=\omega_c,-\omega_c}\left(\sum_{i=-s}^{s}\left(\sum_{q=1}^{m}\sum_{l=1}^{n} p_{iql}\{V_e(q)\cdot\cos(\phi_q)\}^l\right)\cdot e^{j(\omega_r+i\omega_x)t}\right)$$

The $v_a(t)$ signal given by equation (12), and which describes the sum of two signals, is now applied as input to the nonlinear amplification defined using the transfer function G to obtain the output multi-tone parametrization signal $v'_o(t)$ under dynamic control, as demonstrated in equation (13).

$$v'_o(t) = a_1 v_a(t) + a_3 v_a^3(t) + a_5 v_a^5(t) \quad (13)$$

By replacing $v_a(t)$ in equation (13) with its value given by equation (12), expanding the resulting expression and then grouping the terms at each resulting frequency together gives closed-form expressions for the value of each tone present in the PA's output multi-tone parametrization signal, in terms of the parameters and signals listed in equations (12) and (13) i.e. in terms of the coefficients of the transfer functions G and P, and the parametrizing input signals $v_{in}(t)$ and dynamic bias component $v_e(t)$. The number of terms as well as the explicit form of the expression for the output parametrization signal $v'_o(t)$ in equation (13) resulting from such an expansion being large, they are not shown here for the purpose of conciseness. As noted earlier, equation (13) is shown to represent a $5^{th}$ order polynomial representation of the transfer function G; however, higher order polynomial representations of the transfer function G are also possible e.g. $7^{th}$ order polynomial, $9^{th}$ order polynomial etc. The number of terms as well as the explicit form of the expression of the parametrizing output signal $v'_o(t)$ in equation (13) resulting from the previously mentioned expansion also depends on the order of the transfer function G that is used. However, after regrouping the output terms at the same frequency as described before, a compact representation of the resulting parametrizing output signal $v'_o(t)$ and its bilateral equivalent has the form given by equations (14) and (15) respectively.

$$v'_o(t) = \sum_{i=-u}^{u} {}^uV'_o(\omega_c+i\omega_x) \cdot \cos((\omega_c+i\omega_x)t+\beta_{\omega_c+i\omega_x}) \quad (14)$$

$$v'_o(t) = \frac{1}{2}\sum_{\omega_r=\omega_c,-\omega_c}\left(\sum_{i=-u}^{u} V'_o(\omega_r + i\omega_x) \cdot e^{j\beta_{\omega_r+i\omega_x}} \cdot e^{j(\omega_r+i\omega_x)t}\right) \quad (15)$$

where $V'_o(\omega_c+i\omega_x)$ and $\beta_{\omega_c+i\omega_x}$ represent the magnitude and phase respectively for each tone of the parametrizing output signal $v'_o(t)$.

Here again, $V'_o(-\omega_c-i\omega_x)=V'_o(\omega_c+i\omega_x)$, $\beta_{-\omega_c-i\omega_x}=-\beta\omega_c+i\omega_x$ and j is the complex imaginary unit. u is related to the number of significant tones present in the parametrizing output signal $v'_o(t)$, e.g. u=4 in FIG. 4 since the number of tones is 9, ranging from $\omega_c-4\omega_x$, $\omega_c-3\omega_x \ldots 0 \ldots \omega_c+3\omega_x$, $\omega_c+4\omega_x$. Other values of u are also possible depending on the number of significant tones present in the parametrization output signal. Equation (15) represents the system of equations that relates the parametrizing output signal $V'_o$ IMD levels with a three-tone parametrizing input signal $V_{in}$ and the dynamic bias component $V_e$ for the PA linearizing module 30 proposed here.

While the transfer functions G and P are shown using complex polynomials here, they may also be represented using other nonlinear representations (for instance, using Volterra kernels or other time-domain nonlinear functions or other nonlinear functions defined in the frequency domain).

The multi-tone dynamic bias component $v_e(t)$ is shown with frequency values in (8), which represent a down-conversion to zero Hertz of the multi-tone parametrization input signal $v_{in}(t)$ in (6)-(7). However, the frequency values of the tones in $v_e(t)$ may be of other frequency values. The transfer function P then describes a nonlinear frequency band-to-frequency band converter, the output $\Delta v_a(t)$ of which is added to the input signal $v_{in}(t)$ to generate the signal $v_a(t)$. $v_a(t)$ is then processed by the transfer function G.

The multi-tone parametrization input signal $v_{in}(t)$ in (6)-(7) is shown with equal frequency spacing $\omega x$ between any consecutive tones. However, the frequency spacing between any consecutive tones in the multi-tone parametrization input signal $v_{in}(t)$ in (6)-(7) may be of any arbitrary value.

Parametrization of the proposed PA linearizing module 30 is now complete, and the PA system may now be used in operation mode.

Validation of Parametrized PA Linearizing Module Through Comparison with ADS™ Simulation The formulations of the proposed PA linearizing module 30 herein described have been validated through a benchmarking against an RFIC PA design within a simulation test-bench. The simulation software used was ADS™ Dynamic Link™. All results shown for this design were performed using PEX™ extracted views (for active devices) and post-layout simulations using the electromagnetic (EM) extraction tool EMX™. Details of the RFIC PA design were given in the publication authored by S. Sharma, N. G. Constantin and Y. Soliman, titled "Positive envelope feedback for linearity improvement in RFIC PAs," published at the 2017 $27^{th}$ *International Conference Radioelektronika*, Brno, 2017, pp. 1-5. The validation presented here is not restricted to the use of the previously mentioned simulation software and tools only, and any suitable simulation software and tools may be used as deemed convenient.

The schematic representation of the 5 GHz SOI CMOS PA is shown in FIG. 3a of the same paper authored by S. Sharma, N. G. Constantin and Y. Soliman, titled "Positive envelope feedback for linearity improvement in RFIC PAs," published at the 2017 27$^{th}$ International Conference Radioelektronika, Brno, 2017, pp. 1-5. For open-loop operation, resistance Ra was kept open and the quiescent value of the PA's third stage gate bias was held at $V_{dc}$=0.355V. Dynamic control was performed by externally applying a dynamic bias component $V_e$ directly to the gate of the NMOS in the third stage via 15 nH inductors, using a baseband signal generator component in the simulation test-bench as the parametrization input signal. The parametrization input signal $v_{in}$ was a three-tone RF signal with two side tones held 5 dB lower than a center tone. The center frequency was $f_c$=5.4 GHz and a spacing of $f_x$=50 MHz was used.

Figure 5:
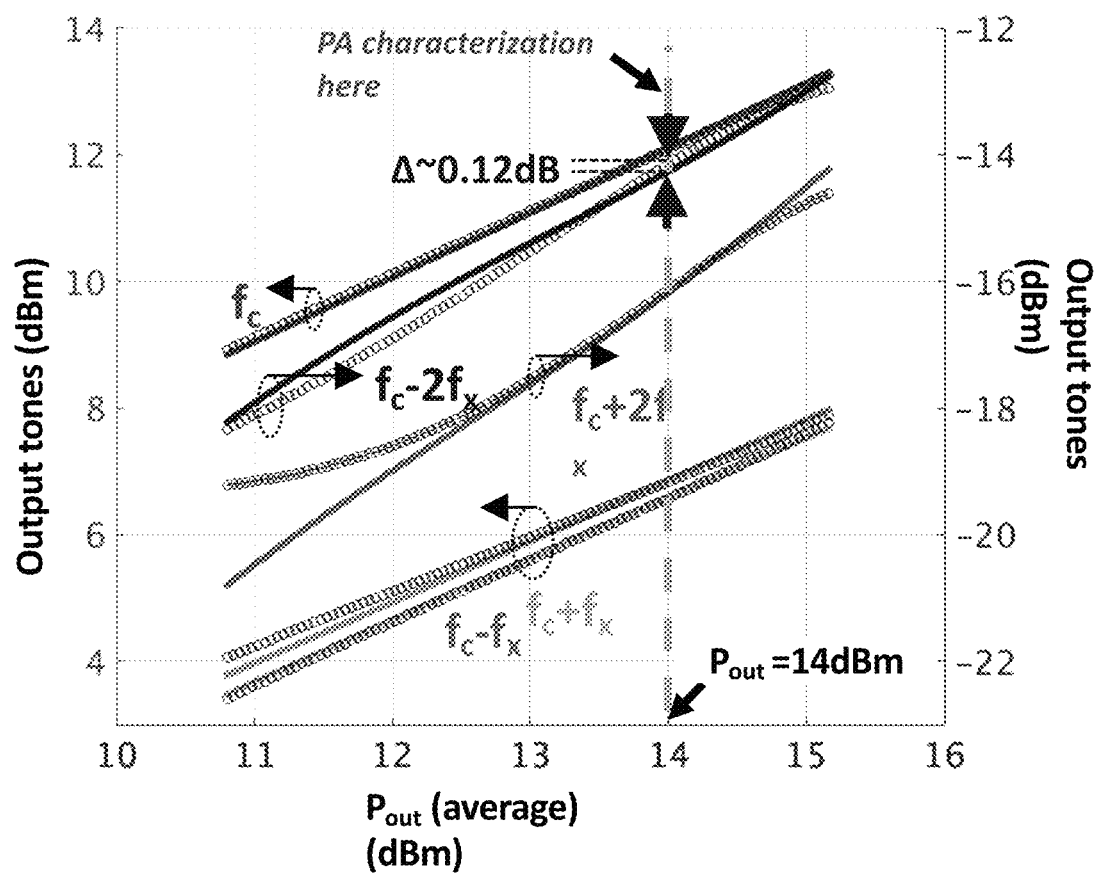
FIG. 5 is a graph comparing simulated values (as shown by solid traces) and determined values (as shown by circular marker traces) for the PA system including the output tones at $f_c-2f_x$ and $f_c+2f_x$ which are due to the PA's nonlinearity under quiescent bias.

With the dynamic bias component held at $V_{dc}$=0.355V and by varying the parametrizing input signal $V_{in}$ over an input power range of interest, the parameters of the transfer function G given by equation (16) of the present PA linearizing module were extracted. Reference is now made concurrently to FIG. 5, which compares simulated and determined values in operation. As shown in FIG. 5, an excellent match between the PA's simulated and determined output tones was observed (less than 0.12 dB error for the $f_c$−2$f_x$ tone, which itself is ~26 dB below the $f_c$ tone, at the parametrization power level of 14 dBm). A 5$^{th}$ order polynomial was sufficient for the transfer function G and unlike other prior art transfer functions, the coefficients remained unchanged over the power range of interest. In other cases of different PA implementations, higher order of transfer function G were also possible, such as 7$^{th}$ order, 9$^{th}$ order etc.

$$v_o(t)=(8.19+j\cdot1.48)\cdot v_{in}(t)+(-4.98-j\cdot1.56)\cdot v_{in}^3(t)+(3.40+j\cdot2.14)\cdot v_{in}^5(t) \quad (16)$$

Increase of the error at lower average output power levels in FIG. 5 did not affect the accuracy of the PA linearizing module at 14 dBm, since this error pertained to the transfer function G only (not the transfer function P). It will be shown further herein that the full representation (i.e. including both the transfer functions G and P) accurately captured the PA's IMD performance over a significant power range across the range of power levels.

With parameters of the transfer function G extracted, the dynamic bias component $V_e$ at frequency $f_x$ was added to the DC bias of the PA. By varying the amplitude of the dynamic bias component $V_e$, noting the corresponding output multi-tone parametrization signals and solving the system of equations (12)-(15) for these measurements, the complex coefficients of the second order transfer function P of the present PA linearizing module represented in equation (11) were extracted. The resulting transfer function P was given by equation (17). In other cases of different PA implementations, higher order transfer functions P are also possible, such as 3$^{rd}$ order, 4$^{th}$ order, 5$^{th}$ order etc.

$$\Delta v_a(t)=\frac{1}{2}(1.27-j\cdot0.07)\cdot v_e(t)\cdot\cos(\omega_c t)+\frac{1}{2}(1.09-j\cdot0.31)\cdot v_e(t)\cdot\cos((\omega_c+\omega_x)t)+\{\frac{1}{2}(0.56-j\cdot0.31)\cdot v_e(t)+\frac{1}{4}(-1.85+j\cdot0.12)\cdot v_e(t)^2\}\cdot\cos((\omega_c+2\cdot\omega_x)t)+\frac{1}{2}(1.13+j\cdot0.12)\cdot v_e(t)\cdot\cos((\omega_c-\omega_x)t)+\{\frac{1}{2}(0.69+j\cdot0.15)\cdot v_e(t)+\frac{1}{4}(-1.16-j\cdot0.50)\cdot v_e(t)^2\}\cdot\cos((\omega_c-2\cdot\omega_x)t) \quad (17)$$

Figure 6:
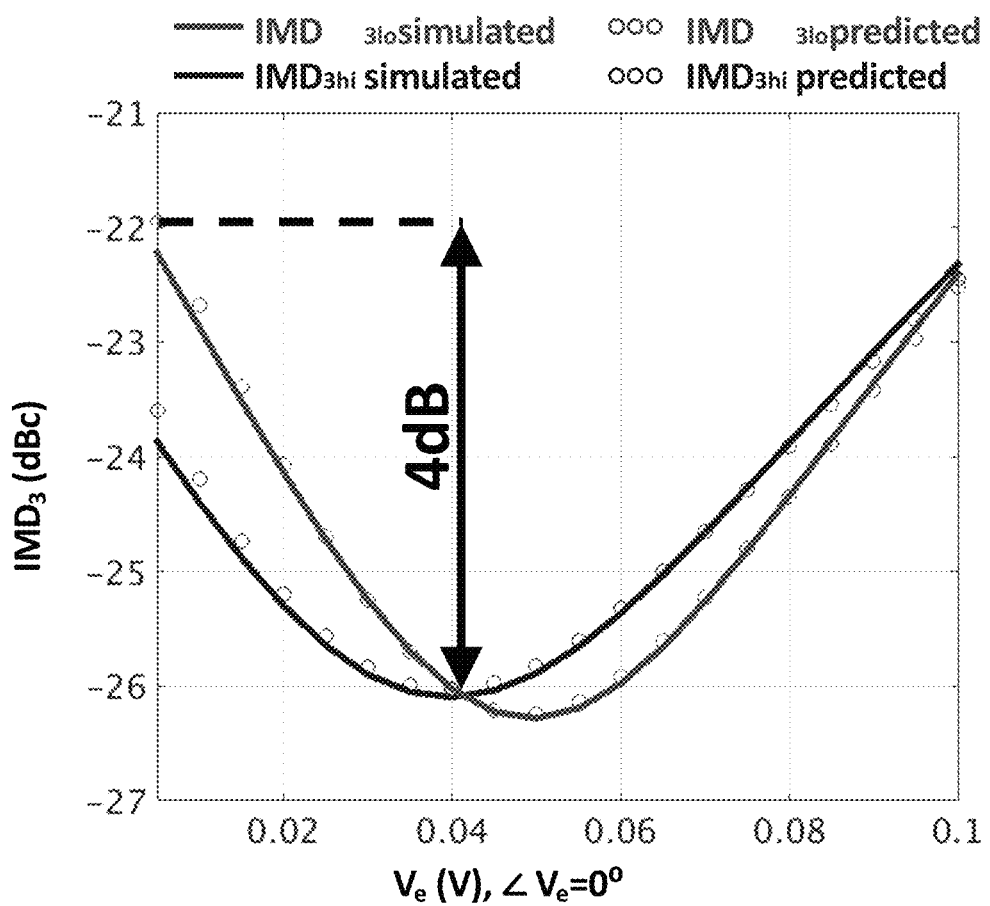
FIG. 6 is a graph comparing simulated values (as shown by solid traces) and determined values (as shown by circular marker traces) for the PA system output $3^{rd}$ order intermodulation distortion ($IMD_3$) product under dynamic control signal and at average output power $P_{out}(avg) \sim -14$ dBm.

Reference is now made to FIG. 6 which shows a graph comparing simulated and determined IMD$_3$ using the present PA linearizing module 30 as a function of the dynamic bias component $V_e$ at the PA's parametrization power level $P_{out}$~14 dBm. The present PA linearizing module 30 determines with negligible error that setting the dynamic bias component $V_e$ to 40 mV, ∠0° yields a 4 dB improvement in IMD$_3$. The 0° phase translates the fact that the delay through the driver stages and the bias interfacing (having minimal reactances) in this specific PA design is negligible for baseband signals. It is sufficient to truncate the transfer function P to 2$^{nd}$ order here, and the extracted parameters for the transfer functions P and G of the PA linearizing module 30 accurately capture the PA's performance over the range of interest of the PA's operating power and dynamic bias levels. Note that experimental results discussed further herein demonstrate a comparable IMD$_3$ improvement of ~4 dB, based on computation using the present PA linearizing module 30 from experimental measurements. Also note that the parametrization output power level of 14 dBm for the current example was arbitrarily selected among different power levels where the PA exhibits an appreciable degree of nonlinearity; in a different case for this or a different PA implementation, other power levels may also be selected for parametrizing the transfer functions P and G of the PA linearizing module 30.

Figure 7:
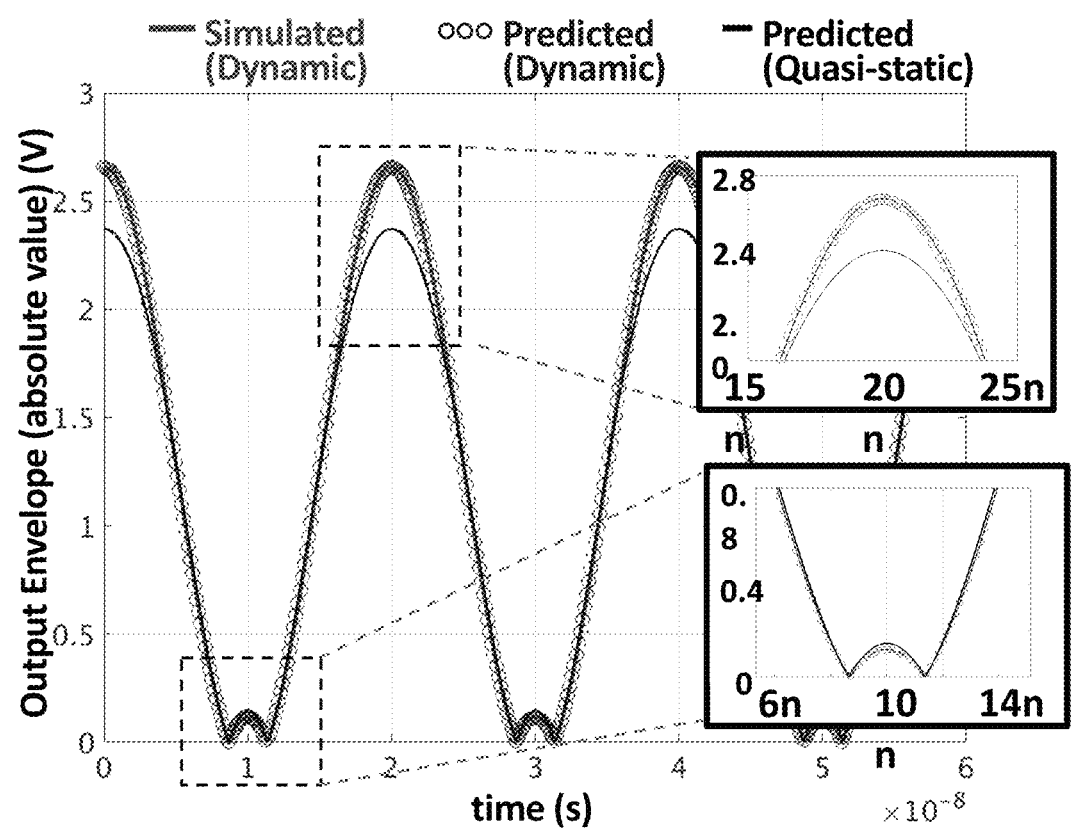
FIG. 7 is a graph comparing simulated and determined time domain form of the PA system amplified modulated signal under dynamic control of the PA linearizing module. The time domain form determined using only the quasi-static representation is also shown for comparison.

A comparison of the simulated and determined time domain form of the PA's amplified modulated output signal with the dynamic bias component $V_e$=40 mV in FIG. 7 further highlights the accuracy of the present PA linearizing module 30.

Feed-Forward Dynamic Control for Optimizing PA Linearity

Figure 8:
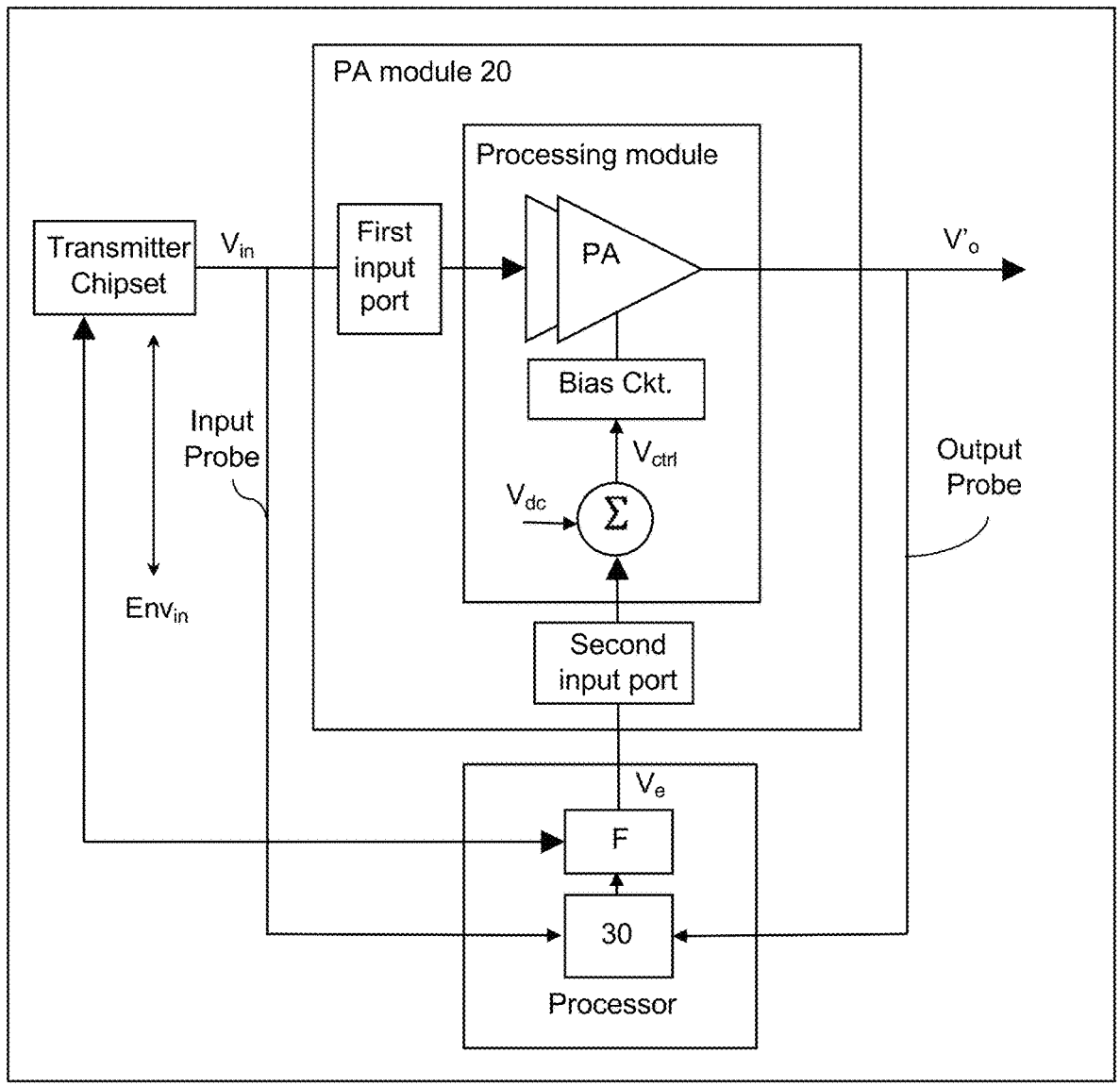
FIG. 8 illustrates an implementation of the PA system 10 wherein the PA linearizing module 30 further comprises a feed-forward dynamic transfer function F, where F is parametrized during a parametrization phase of the PA linearizing module 30 and applied in operation of the PA system 10 to optimize the linearity of the amplified modulated signal at the output of the PA 20.

Reference is now made to FIG. 8, where the extracted $v_{in}(t)-v_o(t)-v_e(t)$ multi-tone relationships described in equations (16) and (17) for the present PA linearizing module 30 is used in a pre-distortion transfer function F embedded as a signal processing element within the baseband chipset of a transmitter front-end or within a separate processor executing the PA linearizing module 30 or of the PA system 10. Note that the baseband processor also generates Env$_{in}$, which is the envelope signal of the PA's input modulated signal $V_{in}$. The parameters of the present PA linearizing module 30 (extracted as previously discussed) may be provided by the PA manufacturer in one possible example of implementation. This pre-distortion transfer function F is aimed at performing adjustment (performed within the mobile unit) on the dynamic bias component $V_e$ to minimize the PA's output IMD$_3$ through feed-forward dynamic control. The pre-distortion transfer function F therefore defines a relationship between the PA's input envelope Env$_{in}$, and the dynamic bias component $V_e$ that allows achieving optimum PA output linearity. In this example, the pre-distortion transfer function F is determined using MATLAB™ starting from the same PA linearizing module used in FIG. 6 that was parametrized at $P_{out}$~14 dBm. In a different implementation, the pre-distortion transfer function F may be suitably extracted using any other available mathematical tool and is not restricted to MATLAB™ only.

Note that though the pre-distortion transfer function F is extracted using the PA linearizing module 30, the PA's improved performance using the pre-distortion transfer function F discussed in the present example is evaluated by applying the pre-distortion transfer function F (defined using the frequency-domain defined device FDD functional block in ADS™) to the 5 GHz SOI CMOS PA design itself (represented by 'PA module' shown in FIG. 8) within the ADS™ circuit simulation environment, and not by merely applying the pre-distortion transfer function F to the parametrized PA linearizing module 30.

Figure 9:
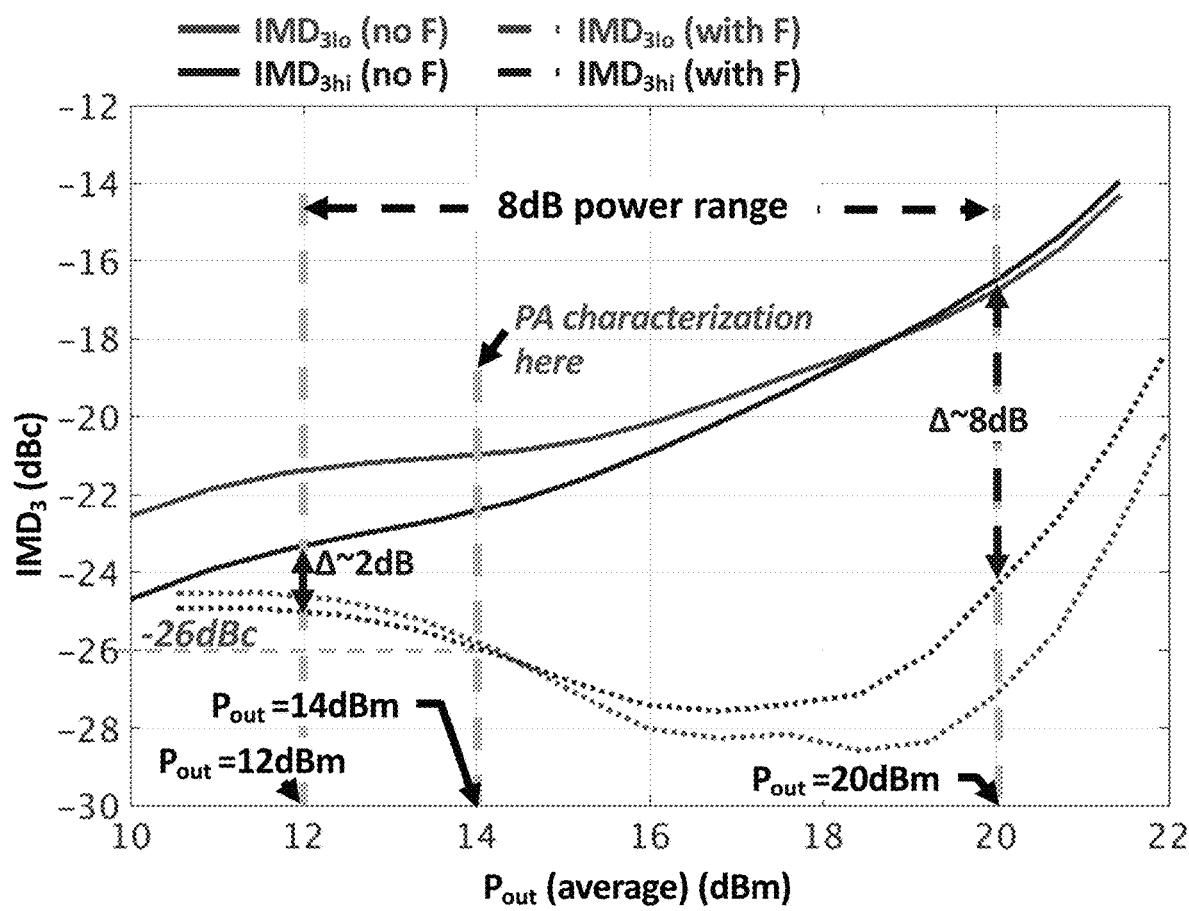
FIG. 9 is a graph comparing the PA system 10 simulated output $IMD_3$ versus $P_{out}$ without and with the effects of the parametrized feed-forward dynamic transfer function F of FIG. 8.

Referring now to FIG. 9, a graph is given showing the PA's output IMD$_3$ vs $P_{out}$ without and with the pre-distortion transfer function F applied to the PA schematic within ADS™. The value of the $IMD_3$ at the parametrization power level $P_{out}$=14 dBm in FIG. 9 is −26 dBc, which is identical to the optimum improved $IMD_3$ value given in FIG. 6 (also simulated at $P_{out}$=14 dBm) and which was obtained by externally applying a dynamic bias component $V_e$. The exact match of the improved $IMD_3$ value in FIG. 6 and FIG. 9 at the parametrization power level of the PA linearizing module clearly validates the accuracy and usefulness of the present PA linearizing module for implementing the embedded feed-forward dynamic control aimed at PA linearization as shown in FIG. 8. As noted earlier, the parametrization output power level of 14 dBm for the current example was arbitrarily selected among different power levels where the PA exhibits an appreciable degree of nonlinearity; in a different case, other power levels may also be selected for parametrization of the PA linearizing module.

The PA's $P_{out}$ values for which the pre-distortion transfer function F achieved significant $IMD_3$ improvement (2 dB to 8 dB improvement) ranges from its maximum output power (~20 dBm) and up to 8 dB back-off (~12 dBm). The 8 dB power range for which significant $IMD_3$ improvement was achieved using the pre-distortion transfer function F was shifted slightly towards the higher range of PA output power levels with respect to $P_{out}$=14 dBm, the parametrization power level of the PA linearizing module. A similar shift was also observed in the power range where PA linearity was improved when it was excited with a modulated signal (as shown in FIG. 10) and discussed further herein.

The same PA system was excited using a modulated signal in ADS™ and its output linearity, calculated using ACP Reduction i.e. ACPR values, was measured without and with the pre-distortion transfer function F. The excitation used was an RF carrier modulated by a Forward Link CDMA signal with a signal bit rate of 1.2288 MHz, with 4 samples/bit and 256 total number of symbols. It was generated using the PtRF_CDMA_IS95_FWD component in the Sources-Modulated library in ADS™. The pre-distortion transfer function F remained unchanged and was not determined using a modulated signal; as described earlier, the pre-distortion transfer function F was determined using the present PA linearizing module derived using multi-tone parametrization signals and parametrized at $P_{out}$=14 dBm. The PA's modulated input signal was processed by the pre-distortion transfer function F. Note that the specific choice of using the RF carrier modulated by a Forward Link CDMA signal and with the specifications described above was arbitrary; in a different case, other modulated excitation signals (such as W-CDMA, OFDM etc.) with different specifications could be selected.

Figure 10:
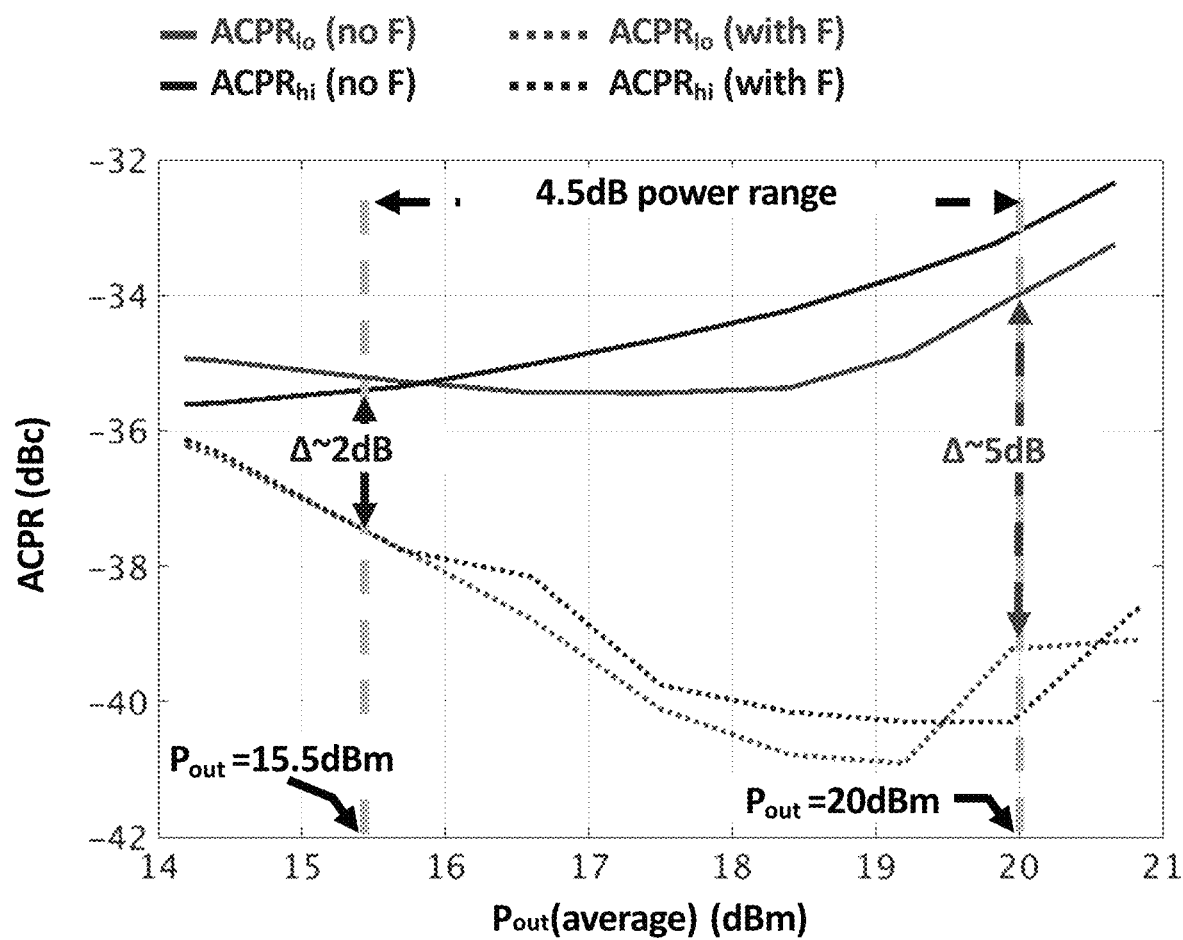
FIG. 10 is a graph comparing the PA system 10 simulated output Adjacent Channel Power Reduction (ACPR) versus $P_{out}$ without and with the effects of the parametrized feed-forward dynamic transfer function F of FIG. 8.
Figure 11:
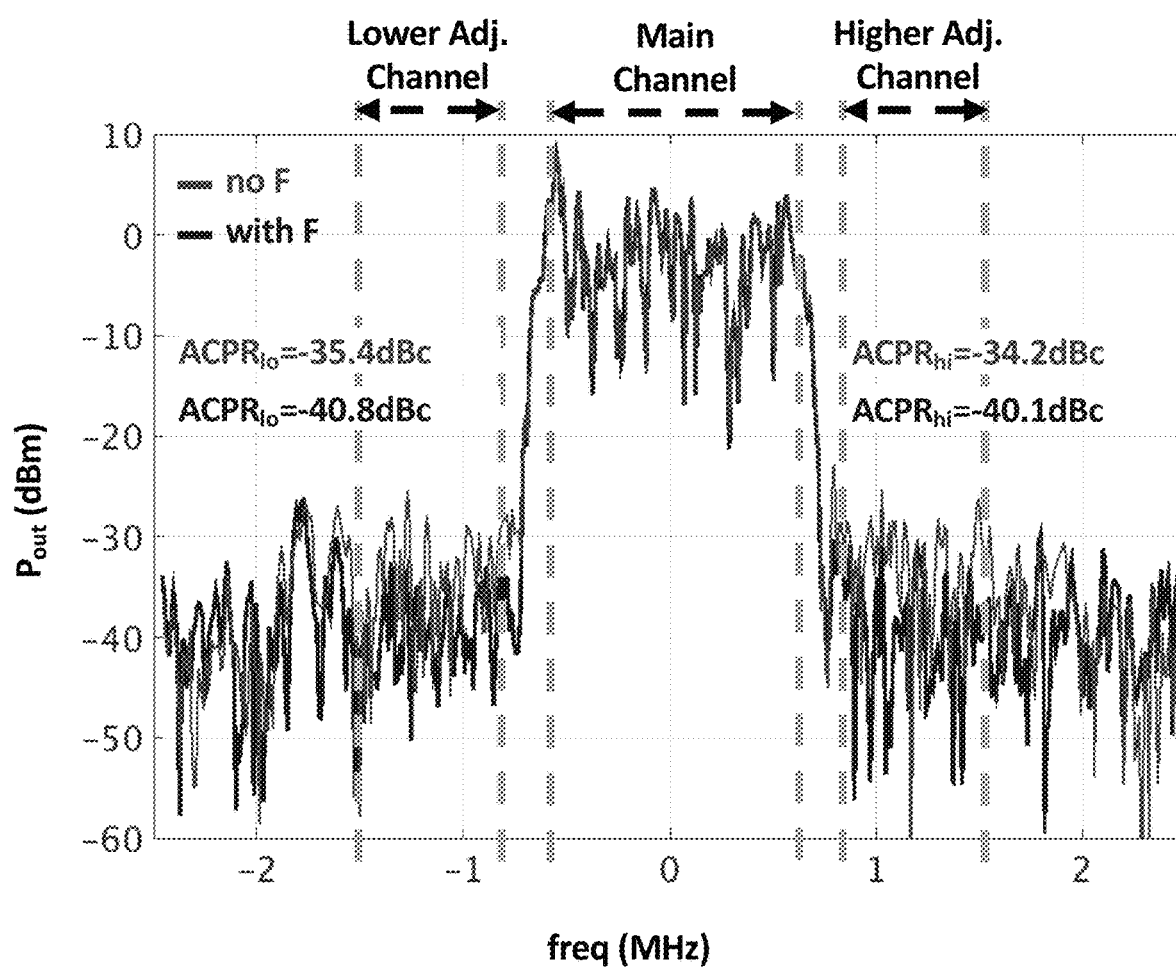
FIG. 11 illustrates the PA system 10 simulated amplified modulated signal (that is centered at carrier frequency) at $P_{out}(avg) \sim 18.3$ dBm, without and with the effects of the parametrized feed-forward dynamic transfer function F of FIG. 8.

As shown in FIG. 10, an ACPR improvement of ~2 dB to ~5 dB was achieved for output power levels ranging from maximum output power ($P_{out}$~20 dBm) to $P_{out}$~15.5 dBm. The modulated output signal centered at the RF carrier frequency for $P_{out}$(average)=18.3 dBm is also shown in FIG. 11, and clearly demonstrated the linearization that was achieved using the pre-distortion transfer function F.

The significant improvement in the PA's linearity at higher output power levels compared to the improvement at the PA's parametrization power $P_{out}$=14 dBm as observed in FIG. 9 and FIG. 10 was specific to this PA system and its nonlinear characteristics. The increased level of nonlinearity at these higher power levels for the PA using the present PA linearizing module resulted in a heightened linearizing effect, dependent also on the pre-distortion transfer function F implemented, as per FIG. 8. This resulted in the observed $IMD_3$ and ACPR improvement for the higher range of output power levels. Such an improved linearity may be attributed to the phenomenon of sweet spots that is well-known among PA designers, and which the proposed pre-distortion transfer function F in FIG. 8 facilitates achieving at power levels close to maximum power. It is also worthwhile to note that there is a ~3.5 dB shift in the output power levels where significant ACPR improvement is achieved with a modulated signal (starting at $P_{out}$~15.5 dBm), when compared to the power levels where significant $IMD_3$ improvement is achieved with a modulated signal (starting at $P_{out}$~12 dBm). This shift stems from the difference between the PA's nonlinear behavior that is captured during parametrization with a 3-tone (sine wave) ~6 dB peak-to-average envelope variation, and the PA's resulting nonlinear behavior due to the CDMA envelope pattern (of the modulated input signal) with a ~7.5 dB peak-to-average envelope variation. Such a shift, however, may be compensated for by computing the pre-distortion transfer function F based on the present PA linearizing module parametrized at different output power levels, and which allows ensuring optimum PA linearity in the power range of interest where ACPR improvement is sought, when it is excited using a modulated input signal.

Therefore, these results demonstrate the pertinence and usefulness of the present PA linearizing module derived from a multi-tone parametrization in the context of embedded adjustment of the applied dynamic control within the mobile unit, for linearity improvement under modulated excitation.

Performance Compensation within Embedded Self-Calibration Against Part-to-Part Variations A second application example is now presented where the proposed PA linearizing module parametrizes and executes the pre-distortion transfer function F (shown in FIG. 8) for linearity optimization of a second PA (PA2) not shown. This second PA2 exhibits some level of performance variation with respect to the previously discussed PA (referred to as PA1 in this section and Figures referred hereto) for which the PA linearizing module was parametrized to linearize PA1 as discussed previously, and as a degree of performance variation is expected from PA1 to PA2, for example if PA1 and PA2 are incorporated in different mobile units. By using an adjusted version of the PA linearizing module of PA1, to compute an adjusted value of the pre-distortion transfer function F in FIG. 8 that is then used for the PA linearizing module of PA2 as part of the embedded optimization within the mobile unit shown for example in FIG. 8 but where PA1 is replaced by PA2, enables an improvement of linearity. In one possible example, this adjustment is performed using quasi-static measurements alone for parametrizing the PA linearizing module used with PA2, and accounts for the performance variation of PA2 with respect to PA1. The simple probing circuitry shown in FIG. 8 that is necessary for these measurements makes it suitable for implementation in embedded self-calibration applications within the mobile unit itself (FIG. 8).

In one possible implementation, the parametrizing parameters of the PA linearizing module for PA1 may be extracted by the PA manufacturer during an advanced engineering phase and provided to the mobile equipment manufacturer. Other scenarios for obtaining the parametrizing parameters of the PA linearizing module for PA1 are also possible. The automatic embedded adjustment (within the mobile equipment) of the PA linearizing module parameters, to account for part-to-part PA performance variation, is hereinafter referred to as embedded self-calibration.

Figure 12:
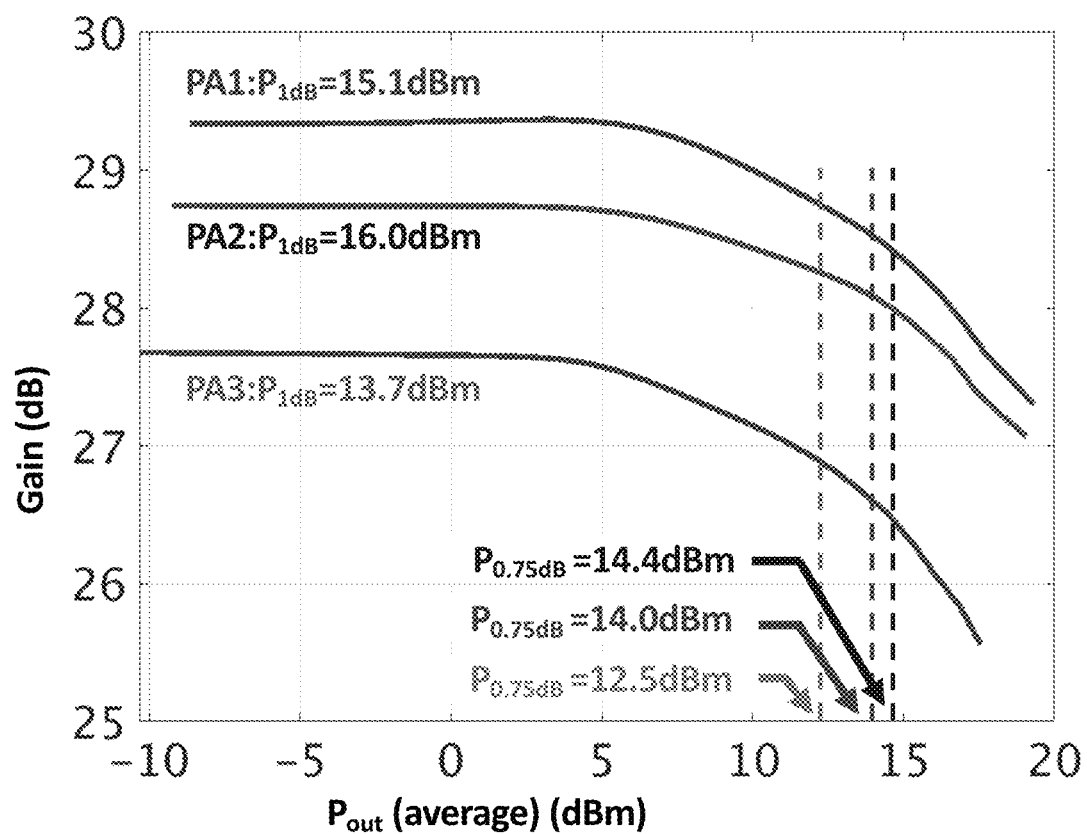
FIG. 12 is a graph comparing gain vs. $P_{out}$ profile for a first PA system (PA1), a second PA implementation (PA2) and a third PA implementation (PA3) examples of Table I (FIG. 13) and Table II (FIG. 14)

For this example, the performance variation in the PA2 implementation is introduced by changing the dynamic bias component of PA linearizing module of PA1, to force a change of 0.9 dB in the output referred $P_{1dB}$ (PA2 shown in FIG. 12). In a different example, this performance variation may be introduced by changing other PA parameters such as the supply voltage, matching networks etc., or any combination thereof. As noted earlier, these levels of performance variation may be expected in a real PA implementation from one PA to another in different mobile units, due to variations arising out of multiple factors: during fabrication with the selected semiconductor technology, inconsistencies during assembly, tolerances in the used encapsulation processes etc.

In an actual implementation, a measurement of a ratio between the probes at the PA's input and output (FIG. 8) should allow detecting such part-to-part variations in the PA's nonlinearities (such as that of PA2) with respect to PA1 specification.

FIG. 13 (also referred to as Table I) shows PA2's $IMD_{3hi}$ values under constant DC bias obtained using simulation of the PA2 schematic in ADS™ for an output power range of 0.8 dB around $P_{out}$~14.4 dBm. $IMD_{3lo}$ values are not shown to keep FIG. 13 concise. The power level of 14.4 dBm was chosen since it is the output power level where the gain of PA1 has compressed by ~0.75 dB (hereafter referred to as $P_{0.75dB}$), and the PA linearizing module for PA1 was previously extracted at $P_{out}$~14.0 dBm, which is also the $P_{0.75dB}$ for PA2 implementation. This $P_{0.75dB}$ point is expected to be in the lower range of power levels where linearization through the pre-distortion function F is effective, as observed in FIG. 9. As noted earlier, the choice of this $P_{0.75dB}$ power level for extraction of the PA linearizing module for PA2 is arbitrary; in a different case, a different power level (e.g. $P_{0.1dB}$, $P_{0.2dB}$, $P_{0.5dB}$ etc.) where the gain of the PA1 has compressed by a different value may be selected.

The PA linearizing module for PA1 is adjusted to account for the performance variation of PA2 with respect to PA1, and therefore for determining the adjusted pre-distortion transfer function F to optimize linearity of PA2. Such functionality requires adjusting the coefficients of the transfer function G starting from their original values, by measurement of the amplitudes of the three tones parametrization input signal and the three tones parametrization output signal (i.e. at frequencies $f_c-f_x$, $f_c$ and $f_c+f_x$) and only at the power level of interest (for example at $P_{out}$=14.4 dBm). For example, such measurements could be done through the input-output probes of FIG. 8, over the narrow power range of envelope variation of the 3-tone parametrization input signal, hence requiring only simple envelope detector circuitry. In an alternative implementation, some of the measurements mentioned previously could be performed using other kinds of probes as may be deemed fit for a particular application. This holds promise for the use of the PA linearizing module in embedded self-calibration applications that are based on incorporating the calibration set-up within the mobile equipment, since the adjustment requires only a minimum number of relatively simple measurements, and simple storage requirements of the PA linearizing module (e.g. within the baseband processor, as shown in FIG. 8).

The optimum dynamic control signal values determined by the adjusted pre-distortion transfer function F using the adjusted PA linearizing module and for linearity improvement of PA2 are also shown in Table I. As shown, $IMD_3$ improvement Δ of 2.02 dB to 3.30 dB over the constant control signal is possible for the targeted power range when using the dynamic control signal values determined using the adjusted PA linearizing module and represents a significant improvement in linearity. This clearly demonstrates the effectiveness of the embedded self-calibration to be used for pre-distortion of PA2, using the set-up embedded within the mobile unit shown in FIG. 8.

The difference in the $IMD_3$ improvement at the output power $P_{0.75dB}$ level between PA1 (~4 dB at $P_{out}$=14 dBm, FIG. 9) and PA2 (2.65 dB at $P_{out}$=14.4 dBm, Table I) may be explained as a result of the two PA systems implementations operating with different control signals conditions, which translates into the applied pre-distortion having a different degree of linearizing effect.

A more drastic change in PA system performance is also considered by forcing a change of 1.4 dB in the PA's output referred $P_{1dB}$ (PA3 in FIG. 12). This time, both the control signal and the output matching network are changed. As noted earlier, in a different example, this performance variation may also be introduced by changing other PA parameters such as the supply voltage, matching networks etc., or any combination thereof. As also noted earlier, such levels of performance variation may be expected in a real PA system from with one PA incorporated in a first mobile unit to another real PA system with another PA incorporated in a second mobile unit, due to variations arising out of multiple factors: during fabrication with the selected semiconductor technology, inconsistencies during assembly, tolerances in the used encapsulation processes etc. The comparison of $IMD_3$ levels of PA3 with or without pre-distortion through the pre-distortion transfer function F is again made at the $P_{0.75dB}$ output power level (12.5 dBm for PA3) and is shown in FIG. 14 (Table II). The $IMD_3$ levels are significantly improved (by more than 5 dB) compared to the constant bias case, by pre-distortion using the adjusted PA linearizing module to account for the performance variation of PA3 compared to PA1. The higher levels of $IMD_3$ improvement for PA3 in Table II compared to PA2 in FIG. 13 (Table I) may be attributed to PA3 operating under stronger nonlinearities, given the change in both the bias and the output matching network for PA3. This introduces the same heightened linearization effect due to the sweet-spot phenomenon previously mentioned and discussed extensively in the literature.

The resulting improvement in $IMD_3$ through pre-distortion is function of the assumption in the discussed examples shown in FIGS. 13 and 14 (Tables I-II) of updating the coefficients of the transfer function G only and using very simple probe circuitry. For performing such measurements, simple probes may be used in the mobile unit, so as to result in an embedded self-calibrated power amplifier system, and therefore an embedded self-calibrated mobile unit. However, simulations show that by adjusting the coefficients of the transfer function P in the PA linearizing module, in addition to the coefficients of the transfer function G as described earlier, allows even further improvement of the $IMD_3$ levels. Within the scope of the current disclosure, adjustments may be made to all or some of the coefficients of any transfer function G and/or transfer function P of the PA linearizing module to account for the performance variation of different PAs.

An example of the necessary measurements necessary for accomplishing such an adjustment of the coefficients of the transfer function P is now presented. A potential approach to accomplish this is to use more precise envelope detectors in the probing circuitry, but over a narrow power range only, for the measurement of two additional tones parametrization output signal (at intermodulation frequencies $f_c-2f_x$ and $f_c+2f_x$) for parametrizing, therefore allowing an adjustment of the coefficients of the transfer function P. The coefficients of the transfer function G may be left to the values obtained through the 3-tone quasi-static measurements for the adjusted PA linearizing module in Table I-II. This one-time measurement (and adjustment) is performed with a 1-tone dynamic control signal at frequency $f_x$. It can be performed from on a per mobile unit basis, and it is sufficient to perform the measurement at the PA's rated power level only. While an example of only one such method for adjusting the coefficients of the transfer function P is described here, the present disclosure is in no way restricted to this method only. Other possible measurements as suitable may be made using different probing circuitry embedded within the mobile unit, and that allows adjusting the coefficients of the transfer function P and the transfer function G when parametrizing the PA linearizing module.

Experimental Validation

As an example of the experimental validation of the PA linearizing module, a commercially available SE5003 GaAs HBT WiFi PA from Skyworks Solutions, Inc. was used, but modified to allow access to the internal amplification control circuitry specifically for testing. This access enabled the application of dynamic control signal to the second and/or third PA stages. Details of this PA design are available in a document titled "SE5003L1-R: High-Power (+19 dBm) 802.11ac WLAN Power Amplifier with Integrated Power Detector," SE5003L1-R datasheet, October 2013.

Figure 15:
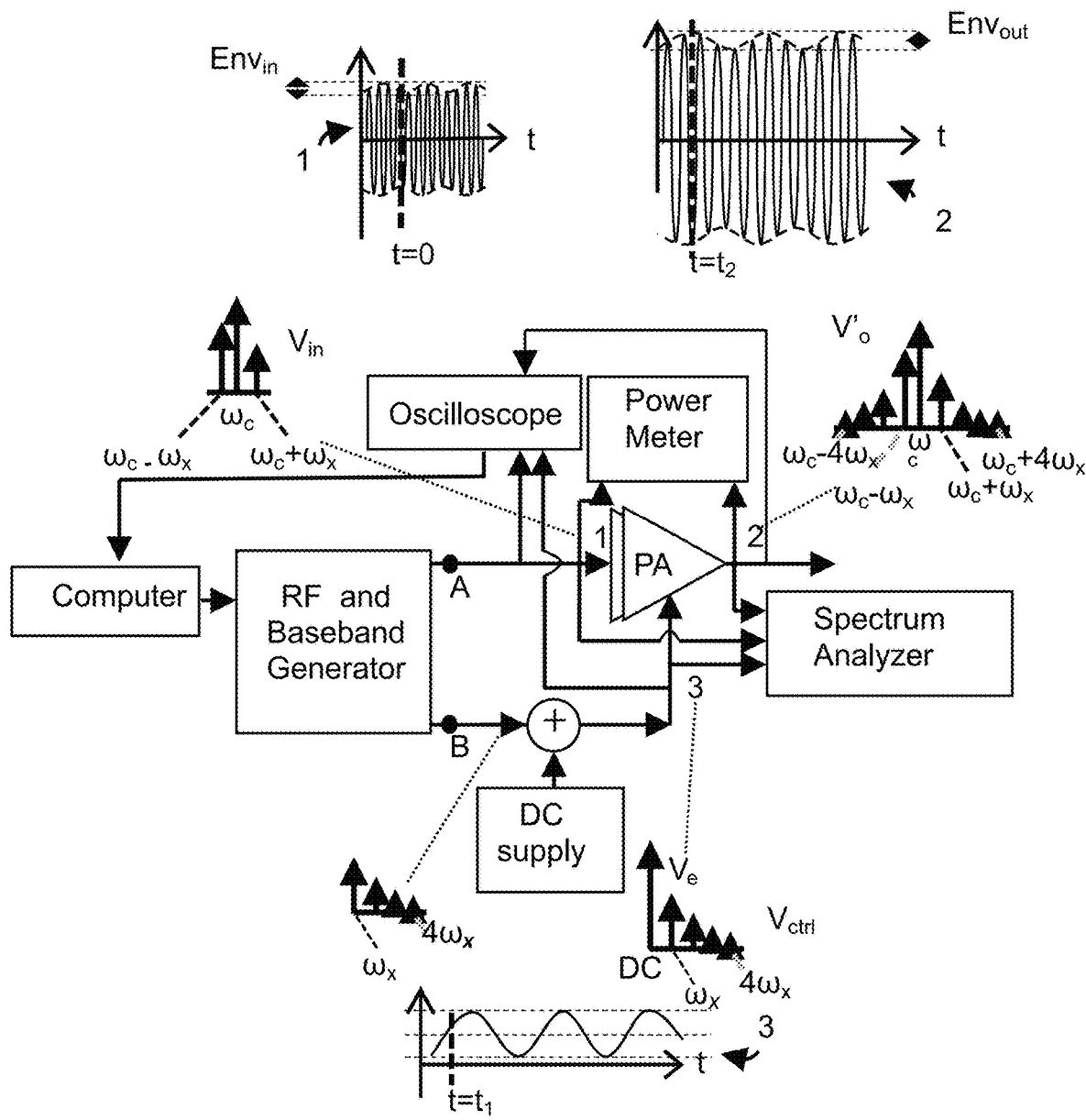
FIG. 15 illustrates a test set-up for another experimental validation of the proposed PA linearizing module 30.

FIG. 15 shows a schematic representation of the test set-up for the dynamic control experiment described next. An RF and Baseband Generator was used to synthesize RF and baseband signals which were applied to port 1 and port 3 respectively of the PA system. The spectral content at port 1, port 2 and port 3 was measured with spectrum analyzers, while power measurements at port 1 and port 2 were done using a power meter.

An important requirement for the testbench in FIG. 15 is that the phase of the base-band multi-tone signal at port 3 be precisely known, calibrated and controlled to extract phase-coherent relationships between the signals at port 1, port 2 and port 3 in addition to allowing the precise control of their amplitude. While amplitude control is easily achieved, phase control must be achieved such that at any instant of time, the phase at port 1, port 2 and port 3 are parametrized with respect to a single time reference. The RF and Baseband Generator achieves this using the oscilloscope measurements of the signals at port 1, port 2 and port 3 (shown by blue dotted arrows in FIG. 15) together with MATLAB™ based algorithms running on the computer that controls the equipment, in order to adjust the phase at port 1, port 2 and port 3 with respect to one single time reference. While what is described previously is one possible method to achieve the requirements of amplitude and phase coherent measurements for the experimental validation of the PA linearizing module described here, it is acknowledged that any other suitable test set-up may be used to perform the same measurements.

The procedure to extract the parametrization values of the PA linearizing module was applied to the SE5003 WiFi PA using a three-tone RF parametrizing input signal with a frequency spacing of 1.5 MHz (i.e. a total signal bandwidth of 3 MHz) and for $P_{out}$(average)=29.2 dBm. The PA was operated in the vicinity of its maximum rated linear output power ($P_{1dB}$~32 dBm). The PA linearizing module was parametrized with the multi-tone dynamic control signal $V_{ctrl}$ (with tones at frequencies $\omega_x$, $2\omega_x$, ... $4\omega_x$) applied to the HBT base in the PA's third stage, since it was observed to have a significantly greater effect on the PA's linearity than applying it to the PA's second stage. The extracted transfer function was similar in form to (16)-(17) but with different coefficients and is not shown here for conciseness.

Note, however, that a third order transfer function P was found to be necessary to accurately capture the PA's non-linearity under dynamic control for the experimental validation discussed here. This increase in order of the transfer function P compared to the previously discussed simulation example of the CMOS PA was necessary to account for the larger nonlinearities associated with the particular HBT PA design used here compared to the CMOS PA previously discussed.

With the parametrization of the PA linearizing module complete, the parametrized PA linearizing module was used to determine the necessary pre-distortion transfer function F through dynamic control signal, i.e. the necessary $V_{ctrl}$ signal in FIG. 15, in order to linearize the SE5003 GaAs HBT WiFi PA at the parametrization power level. Because the variation of the dynamic bias component $V_e$ in the control signal $V_{ctrl}$ at frequency $\omega_x$ is found to have the greatest impact on the PA linearity, the plots in the discussion that follows shows the variation of the PA's output $IMD_3$ with the magnitude and phase of the dynamic bias component $V_e$ tone only, even though higher frequency tones (at $2\omega_x$, $3\omega_x$, $4\omega_x$) are present in the control signal during both parametrization and in the pre-distortion test-cases that are described next. Note that this is not a restriction of the PA linearizing module but is merely a simplification to facilitate presenting the results of FIGS. 16 and 17.

Figure 16:
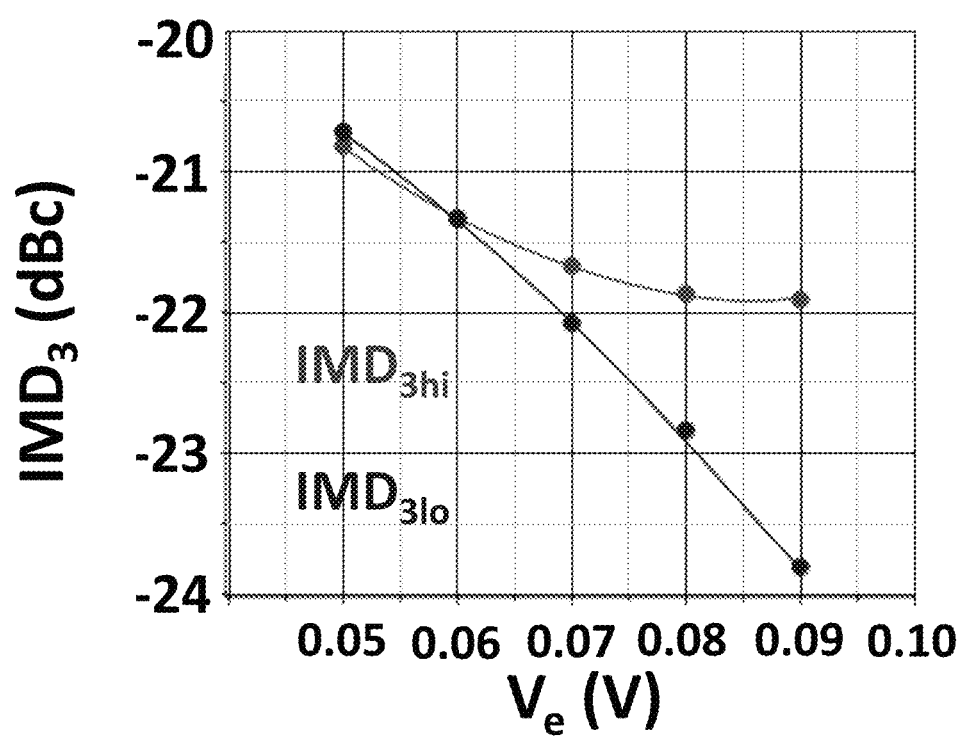
FIG. 16 illustrates measured values (as shown by dotted markers) and determined values (as shown by solid traces) of the PA system 10 $IMD_3$ with dynamic bias component $V_e$, where the dynamic bias component $V_e$ is the control signal $V_{ctrl}$ tone at $\omega_x$ with phase kept constant at 80°, other tones are present in the control signal Vail but are not varied, and the PA system 10 average output power $P_{out}$(average) is 29.2 dBm.
Figure 17:
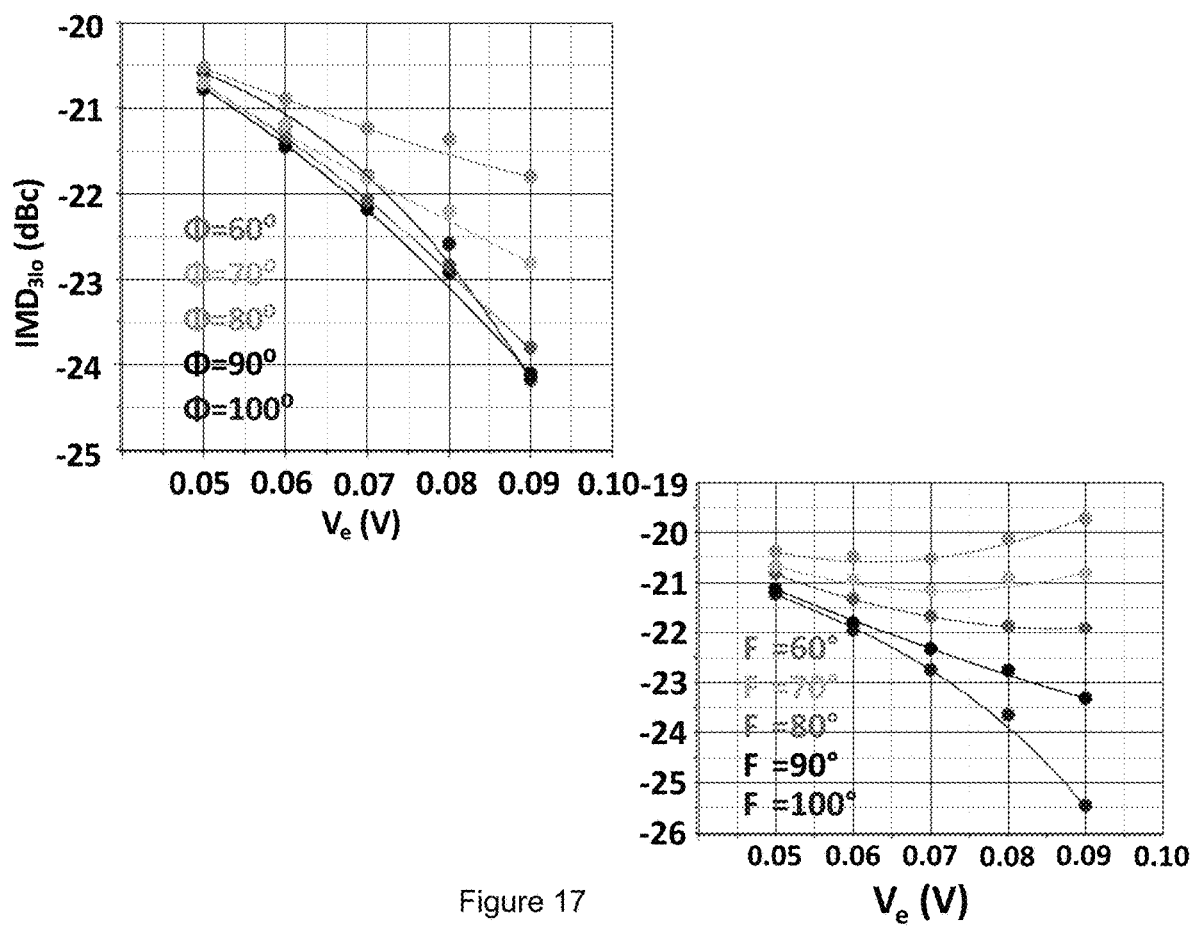
FIG. 17 illustrates the measured values (as shown by dotted markers) and determined values (as shown by solid traces) of the PA system 10 for third-order intermodulation distortion ($IMD_3$) under phase variation, in addition to amplitude variation, of the dynamic bias component $V_e$, in an example where the PA system 10 average output power $P_{out}$(average) is 29.2 dBm.

As shown in FIG. 16, the present PA linearizing module allows determining with negligible error the pre-distortion through the dynamic bias component $V_e$ required to improve the $IMD_3$ by up to 3 dB, using amplitude control only of the dynamic bias component $V_e$. Further $IMD_3$ improvement is also possible by varying the phase of the dynamic bias component $V_e$ in addition to its amplitude. As shown in FIG. 17, the proposed PA linearizing module also allows accurately determining the amplitude and phase (0.09V, <100°) of the dynamic bias component $V_e$ that is necessary to achieve more than 4 dB of $IMD_3$ linearization. Note that this 4 dB does not represent a limiting value of the $IMD_3$ linearization that is possible using the PA linearizing module; different levels of $IMD_3$ linearization may be expected based on the PA design that is used, the order of the transfer functions of the PA linearizing module, the power level applied for parametrizing the PA linearizing module, etc.

Application of Proposed PA Linearizing Module to Closed-Loop PA

Closed-loop PA architectures relying on feedback have been widely demonstrated to improve PA performances. For example, some prior art implementations improve PA linearity by using negative feedback through active elements for gain compensation at high power levels when the PA's gain compression is significant. Some prior art documents use negative feedback in VGA architecture to regulate the system's overall gain. The present PA linearizing module is useful for both PAs and VGAs under closed-loop operation, using either negative or positive feedback.

In this section, the usefulness of the present PA linearizing module is highlighted by applying the present PA linearizing module to the recently proposed positive envelope feedback linearization scheme, where the PA's output envelope signal is applied in positive feedback to the control signal. The present analytical approach using the PA linearizing module is used to determine the conditions for closed-loop stability in an envelope feedback system as well as the design requirements of the feedback elements for optimum linearity, without relying solely on trial and error to optimize the loop elements.

While the following paragraphs are directed at the context of positive envelope feedback PA design, the present PA linearizing module may also be used for closed-loop PAs within an embedded self-calibration set-up within the mobile unit (such as the set-up in FIG. 1) to verify PA stability as well as optimize PA linearity. This will be discussed further herein. Additionally, while the following paragraphs are directed at the context of positive envelope feedback as an example of a closed-loop PA implementation for the application of the PA linearizing module, other closed-loop PA implementations may also be used to demonstrate the applicability of the PA linearizing module.

Description of Device Under Test

The device under test (DUT) is shown in FIG. 3($a$) and FIG. 3($b$) of the previously mentioned paper authored by S. Sharma, N. G. Constantin and Y. Soliman, titled "Positive envelope feedback for linearity improvement in RFIC PAs," published at the 2017 27$^{th}$ International Conference Radio-elektronika, Brno, 2017, pp. 1-5. Both simulation results of the PA schematic (FIG. 3($a$)) and measurements on the prototype (FIG. 3($b$)) are referred to herein below and indicated accordingly.

Figure 18:
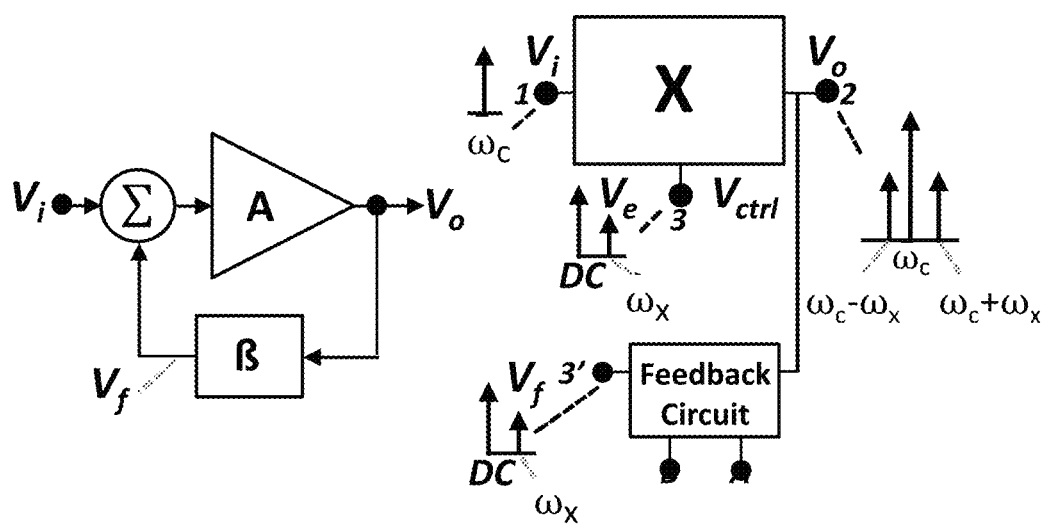
FIG. 18 is a schematic representation of a closed-loop PA system 10 under positive feedback, and equivalent open loop PA linearization module 30.

FIG. 18 is a schematic representation of the closed-loop PA using positive envelope feedback on the left and converts it into an open loop system using the PA linearizing module (X in FIG. 18). The feedback circuit in FIG. 18 is the high input impedance system composed of an envelope detector and a voltage shifter. Two parameters critical to the positive envelope feedback PA implementation of this example are the threshold and the slope of the detector used in the feedback circuit. The values of these two parameters are voltage-controlled, as represented by signals A and B in FIG. 18; Signal A sets a threshold at the source of an NMOS comparator, while Signal B controls the gain of an output PMOS stage.

The parameters of the PA linearizing module are first extracted using the parametrization procedure previously described. At the end of the parametrization procedure, the transfer functions G and P are parametrized for power levels where the PA is under gain compression e.g. behaves non-linearly, and where the application of positive envelope feedback is effective at improving PA performance.

PA Conversion Gain

For determining the expression of loop stability, a conversion gain transfer function C is parametrized from the dynamic control signal $V_{ctrl}$ to the output envelope signal $V_o$ at port 2 in FIG. 18. To parametrize the conversion gain transfer function C, the PA linearizing module is excited using a single baseband tone for the dynamic bias component $V_e$ (at frequency $\omega_x$), a single RF tone of amplitude $V_i$ is used and the resulting output multi-tone signal $V_o$ is measured. The value of $V_i$ is chosen such that the PA is operating under gain compression, e.g. nonlinearly. For $V_o$, the measurement of amplitudes alone and limited to that of the three primary tones (i.e. at frequencies $\omega_c-\omega_x$, $\omega_c$ and $\omega_c+\omega_x$) is sufficient, given that the IMD$_3$ tones have a negligible contribution to the conversion gain. The conversion gain transfer function C, when the input excitation is $V_i$ and the dynamic bias component $V_e$, is given by equation (18).

$$C(V_i, V_e) = a_1 \cdot p_{111} + a_1 \cdot p_{112} \cdot V_e + a_3 \cdot f_1(V_i) + a_3 \cdot f_2(V_e) + a_3 \cdot f_3(V_i, V_e) \quad (18)$$

Feedback Transfer Function

Figure 19:
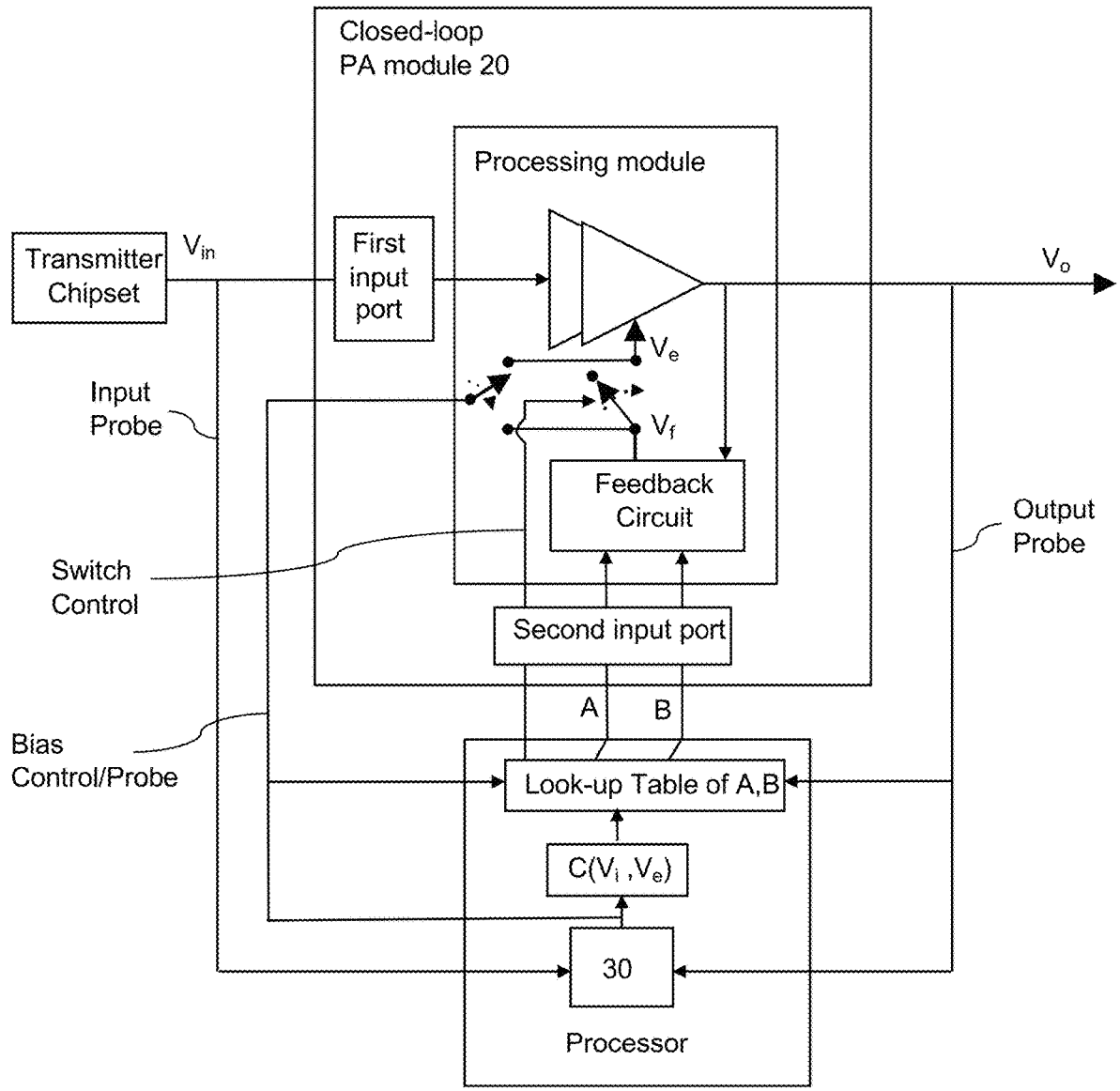
FIG. 19 schematically illustrates an example of the present PA system 10, with the PA linearization module 30 under positive envelope feedback in closed-loop implementation.

Another type of transfer function that can be used in the context of the present PA linearizing module is a feedback transfer function, as shown on FIGS. 18 and 19. A correspondence of the feedback circuit transfer function (from RF input $V_o$ to baseband output $V_f$) as a function of A and B is provided below. For this correspondence, the input of the feedback is excited with the same multi-tone signal $V_o$ as previously discussed. Leaving the feedback circuit connected to the PA output as shown in FIG. 18 ensures that the feedback circuit's transfer function is parametrized with the right input conditions, while also ensuring the correct load conditions at the PA's output. For a particular value of A and B, the output signal $V_f$ is measured and the feedback transfer function is given by equation (19).

$$\frac{V_f(\omega_x)}{Env(V_o)} = f(A, B) \quad (19)$$

where $V_f(\omega_x)$ is the amplitude value of $V_f$ at the frequency $\omega_x$ and $Env(V_o)$, also at frequency $\omega_x$, refers to the envelope of the PA's modulated output RF signal $V_o$.

By repeating the measurement given by equation (19) for various values of A and B, the correspondence of the feedback transfer function is generated and stored as a look-up table.

Conditions for Loop Stability

The conditions for stability of the closed-loop system of FIG. 18 is based on the well-known Barkhausen gain margin and phase margin stability criteria. However, only the gain margin is considered since the positive feedback necessarily introduces a ~360° phase shift across the PA bandwidth, hence it leaves no possibility of phase margin design. Accordingly, the condition for stability is given by equation (20).

$$C(V_i, V_e) \cdot f(A, B) < 1 \text{ i.e.} \quad (20)$$

$$f(A, B) < \frac{1}{a_1 \cdot p_{111} + a_1 \cdot p_{112} \cdot V_e + a_3 \cdot f_1(V_i) + \ldots}$$

Equation (20) is the condition for stability of the closed-loop circuit using positive envelope feedback at the input power level and the dynamic bias component $V_e$. By calculating the conversion gain transfer function C for a few more $V_i$ levels that define the PA's power levels where positive envelope feedback is of interest, the condition to maintain closed-loop stability at these power levels is also determined. For each such calculation, the parametrization signal $V_i$ is kept constant while the dynamic bias component $V_e$ is considered as a small-signal input, and the conversion gain transfer function C as given by (18) is the value of the PA's output envelope over the dynamic bias component $V_e$. The previous look-up table is used to determine the values of A and B that satisfy equation (20) for the conversion gain transfer function C at different power levels, and therefore the conditions to ensure closed-loop stability are known.

Equations (18), (19) and (20) are used to determine the limit value for the conversion gain transfer function C to ensure stability of the closed-loop PA of FIG. 18. The conversion gain transfer function C expressed in equation (21), and the limit condition on the feedback circuit transfer function to ensure stability by equation (22).

$$C(V_i, V_e) = |a_1 \cdot p_{111} + a_1 \cdot p_{112} \cdot V_e + \cdots| = 4.71 V/V$$

i.e. $C(V_i, V_e) = 13.46$ dB  (21)

$f(A, B) < 1/4.71 = 0.21$ i.e. $-13.46$ dB  (22)

Equation (21) gives the value of the conversion gain transfer function C when the PA is operating close to approximately the lowest power level from where the application of positive envelope feedback becomes useful, and corresponds to the power level when the PA starts compressing, e.g. amplifying nonlinearly. Since the PA's gain drops for higher power levels (and consequently its conversion gain from the control signal $V_{ctrl}$ to the RF parametrizing output signal $V_o$ also drops), the value of $f(A, B)$ given by equation (22) represents the critical limiting value that must be satisfied to ensure closed-loop stability. For higher power levels, the value of $f(A, B)$ may be higher than that given by equation (22) without compromising the closed loop PA's stability.

In comparison, simulation of the circuit in FIG. 18 with ADS™ gives a conversion gain of 13.1 dB, which shows that the value equation (21) determined using the present PA linearizing module is quite accurate. The small error between the two values is due to the approximation based on using a 1-tone RF parametrizing input signal V; to derive using equation (18), while the coefficients $a_1$, $a_3$ and $a_5$ were derived using a 3-tone RF parametrizing input signal $V_i$. Equation (22) translates into the limits on the control signals A and B given by equation (23) below. Their actual values are set with an adequate safety margin to guarantee stable behavior of the PA with positive envelope feedback.

Control signal for detector threshold:$A > \sim 2.0 V$

Control signal for detector slope:$B > \sim 1.1 V$ (23)

Adjustment of Detector Profile for Linearity Improvement

With the PA linearizing module parametrized and the limiting values of A and B of the feedback circuit transfer function that ensure stability under closed-loop feedback, the following steps are followed to determine the values of $A_{opt}$ and $B_{opt}$ within this range that optimizes the PA's linearity using positive envelope feedback.

Step 1: The PA linearizing module is used to determine the values of the dynamic bias component $V_e$ at frequency $\omega_x$ required to optimize the open-loop PA's $IMD_3$ under a 3-tone RF parametrization input signal $V_i$, for values of output power $P_{out}$ that lie in the range where positive envelope feedback is useful i.e. at the power levels where the PA is under gain compression, e.g. amplifying nonlinearly.

Step 2: The feedback circuit transfer function look-up table previously obtained is used to determine a single combination of the values of A and B, called $A_{opt}$ and $B_{opt}$, which satisfy the following: 1) $A_{opt}$ and $B_{opt}$ must satisfy the stability derived; and 2) A and B are adjusted to $A_{opt}$ and $B_{opt}$ such that it allows matching the output of the feedback circuit $V_f$ (at frequency $\omega_x$) to the already computed optimum dynamic bias components $V_e$ (also at frequency $\omega_x$) of Step 1, at the corresponding values of the PA's output power $P_{out}$.

With $A_{opt}$ and $B_{opt}$ set accordingly, the loop is now closed. The resulting closed-loop PA with positive envelope feedback transfer function has an improved gain profile which translates into linearity performances close to optimum values, while ensuring PA stability.

By applying Step 1 and Step 2 to the PA linearizing module of FIG. 18, the optimum values of $A_{opt}$ and $B_{opt}$ are found to be 2.6V and 1.6V respectively for the example of the PA under positive envelope feedback described. Closing the positive envelope feedback loop with A and B set to these values, the measured values of the closed-loop PA's adjusted gain is shown in FIG. 4 of the previously mentioned paper authored by S. Sharma, N. G. Constantin and Y. Soliman, titled "Positive envelope feedback for linearity improvement in RFIC PAs," published at the 2017 27th *International Conference Radioelektronika*, Brno, 2017, pp. 1-5. The corresponding values of the dynamic bias signal $V_{dyn}$, which is the output of the feedback circuit, is also shown. The resulting gain flatness over the output power range from 16 dBm to 21 dBm as illustrated is achieved while also guaranteeing closed-loop PA stability, and translates into a linearity improvement.

Embedded Self-Calibration of Open-Loop PA

The inherent simplicity to extract the coefficients of the transfer function G and the transfer function P of the PA linearizing module lends itself favorably for adoption by Radio Frequency Integrated Circuit (RFIC) PA manufacturers at an advanced engineering phase of the development. A single set of extracted coefficients, which describe the PA's typical behavior, may then be provided to a mobile unit manufacturer as parameters for the transfer functions G and P of the PA linearizing module, for use in embedded self-calibration functions within the mobile unit that enable accounting for PA part-to-part variation.

The use of the coefficients of the transfer functions G and P for extracting the pre-distortion transfer function F aimed at PA linearization is described above. Further, a method of self-calibrating this pre-distortion transfer function F, to account for PA performance deviation from its typical behavior, was demonstrated, using the set-up within the mobile unit shown in FIG. 8. Only two probes for a minimum number of quasi-static power measurements, over a narrow power range, were required for this embedded self-calibration in the mobile equipment. The resulting adjustments of the PA linearizing module, and consequently the pre-distortion transfer function F, enable the PA linearity improvements summarized in FIGS. 13 and 14. It was also noted that including a more precise output probe and an additional probe to measure the control signal (such as the Bias Control/Probe in FIG. 19) allow further PA linearity improvement.

The example above describes one possible self-calibration function implementation and targets the open-loop PA's linearity. The present PA linearizing module can also be used for the embedded self-calibration of closed-loop PAs as described below.

Embedded Self-Calibration of Closed-Loop PA

Reference is now made to FIG. 19, which schematically illustrates the PA linearizing module within the PA of the mobile unit (other components of the mobile unit having been removed for clarity purposes) adapted for embedded self-calibration of the closed loop PA using positive envelope feedback. While the example discussed here relates to positive envelope feedback as a specific example of closed-loop PAs, the PA linearizing module may also be applied to other closed-loop PA implementations, such as negative feedback PAs etc. The parameters of the PA linearizing module define the relationship between the signals $V_{in}$, $V_o$ and $V_e$ for the typical open-loop PA. Along with this single set of parameters, the PA manufacturer may also provide to the mobile equipment manufacturer a single look-up table representing the typical feedback transfer function (FIG. 19), extracted through the steps previously described. Knowing this single set of data, that represents parameter values associated to one given PA, allows determining the value of $A_{opt}$ (for optimum value of detector threshold) and $B_{opt}$ (for optimum value of detector slope) that should be used for the typical closed-loop PA under positive envelope feedback.

For a different PA under closed-loop operation within a different mobile equipment, suitable adjustments in the values of $A_{opt}$ and $B_{ow}$ may be carried out to optimize linearity while ensuring stability. To perform this, an embedded adjustment of the parametrization of the PA linearization module and the look-up table stored in the baseband processor within the mobile unit in FIG. 19 is performed, to account for a performance deviation. One possible sequence of steps to accomplish the same are as follows:

(i) The Input Probe, Output Probe and Bias Control/Probe in FIG. 19 are used to update the parameters of the open-loop PA linearizing module (i.e. the transfer functions G and P), through the steps previously described.

(ii) The updated parameters are used to update the conversion gain transfer function C defined by equation (18). Consequently, the new limit value on the feedback transfer function computed with equation (20) and that must be respected to ensure stability is known.

(iii) The Output Probe and the Bias Control/Probe are used to measure the modulated input signal $V_o$ and the baseband signal $V_f$ respectively, to determine the adjusted values of the feedback transfer function $f(A, B)$ equation (19), as shown in FIG. 19. This allows accounting for part-to-part variation, and the look-up table of A, B is suitably updated.

(iv) The updated value of the parameters of the PA linearizing module, the new limit value of $f(A, B)$ and the updated look-up table are now used to adjust the values of $A_{opt}$ and $B_{opt}$ for improved linearity while guaranteeing its closed-loop stability.

Once the adjusted $A_{opt}$ and $B_{opt}$ are set, the electronic switch control in FIG. 19 is used to close the positive envelope feedback loop. The resulting closed-loop PA with positive envelope feedback is expected to have a gain profile that results in improved linearity performances, while ensuring stability.

Beside the open-loop and closed-loop applications discussed above, the present PA linearizing module may be used to optimize other PA performances e.g. gain regulation in PAs that employ the switching ON or OFF of transistor arrays for efficiency improvement. Such switching of transistor arrays may result in undesirable gain variations from one PA part to another. Using the simple probing circuitry shown in FIG. 19 to measure the ratio between the input and output signals, the gain deviation may be cancelled through adjustment of the DC control signal. Afterwards, PA linearity may be optimized following the procedure previously described.

Positive Envelope Feedback

As another example of the application of the present PA linearizing module, it may further be used to determine the conditions to maintain closed-loop stability of the PA under positive envelope feedback, over a range of power levels where positive envelope feedback is useful (and not just at $P_{ref}$, as discussed previously).

Expression of Conversion Gain

As previously mentioned, the closed loop PA system under positive envelope feedback is first converted into an equivalent open-loop system constituted by the PA linearizing module and the feedback circuit as shown in FIG. 18. From previous equations, the truncated form of the conversion gain transfer function C is given by equation (24), the truncation being necessary to ensure simplicity of the given expression and to include only the most significant contributions to the conversion gain transfer function.

$$C(V_i, V_e) = a_1 \cdot p_{111} + a_1 \cdot p_{112} \cdot V_e + a_3 \cdot f_1(V_i) + a_3 \cdot f_2(V_e) a_3 \cdot f_3(V_i, V_e) \quad (24)$$

where: $V_i$=PA's input 1-tone RF parametrization signal,
$V_e$=PA's baseband bias component,
$f_1(V_i), f_2(V_e), f_3(V_i, V_e)$ are nonlinear functions of $V_i$ and $V_e$.

The coefficients $a_1, a_2, \ldots$ and $p_{111}, p_{112}, \ldots$ in equation (24) relate to the parameters of the PA linearizing module.

The extracted parameter values of the PA linearizing module are now substituted in equation (24). The resulting expression, given by equation (25), gives the value of the PA's power-stage conversion gain transfer function $C(V_i, V_e)$ as a function of the input voltage $V_i$ and the dynamic bias component $V_e$.

$$\begin{aligned}C(V_i, V_e) = &(4.693 - j \cdot 0.463) - V_i^2 \cdot (376.55 - j \cdot 189.85) + V_i^4 \cdot \\ &(20123.0 - j \cdot 20871.0) - V_e^2 \cdot (4.65 + 0.094i) + V_e^4 \cdot \\ &(7.60 + 1.20i) - V_e \cdot V_i \cdot (65.36 - 14.05i) + V_e^3 \cdot V_i \cdot \\ &(189.01 - 14.990i) + V_e^2 \cdot V_i^2 \cdot (1827.3 - 603.08i) + \\ &V_e \cdot V_i^3 \cdot (7844.2 - 4792.0i)\end{aligned} \quad (25)$$

Figure 20:
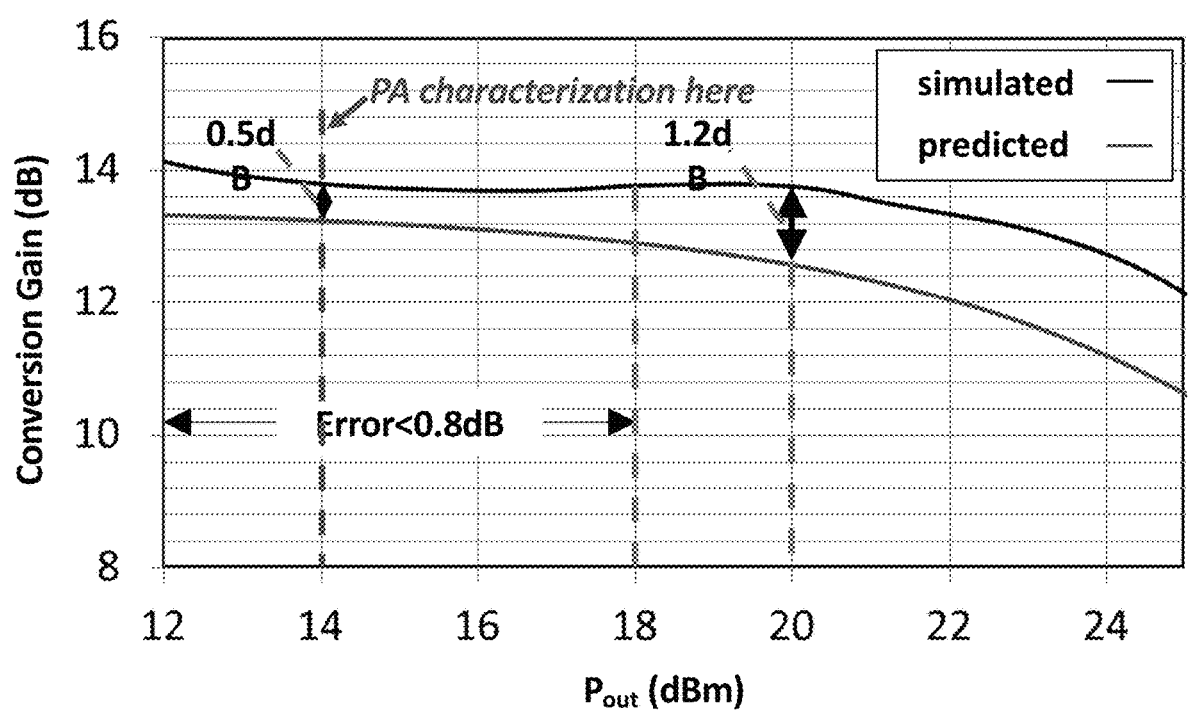
FIG. 20 illustrates the values of the PA system 10 of FIG. 19, and more particularly of comparisons between power-stage conversion gain simulated in ADS™ and determined.
Figure 21:
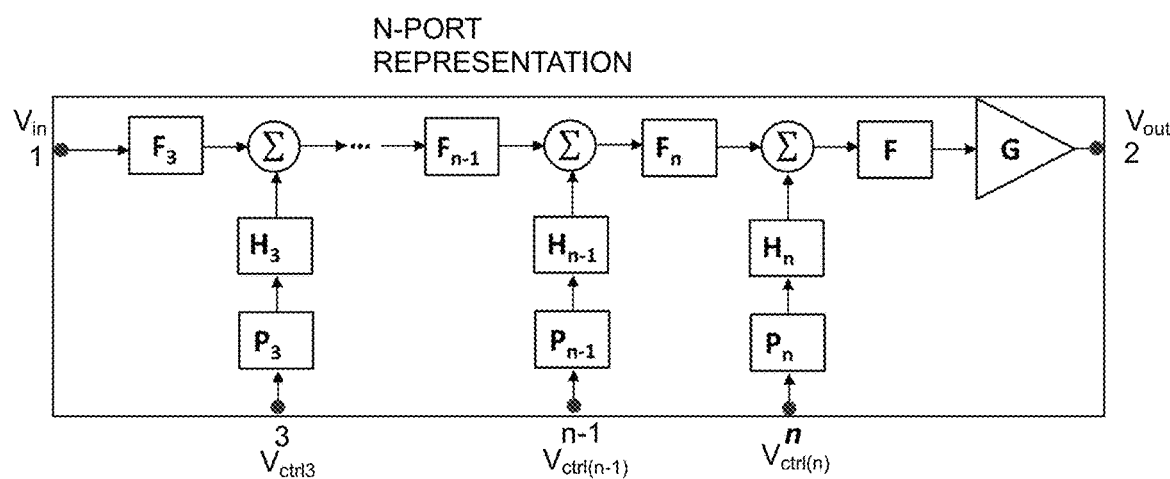
FIG. 21 illustrates the PA linearizing module 30 with multiple consecutive feed-forward dynamic transfer functions.
Figure 22:
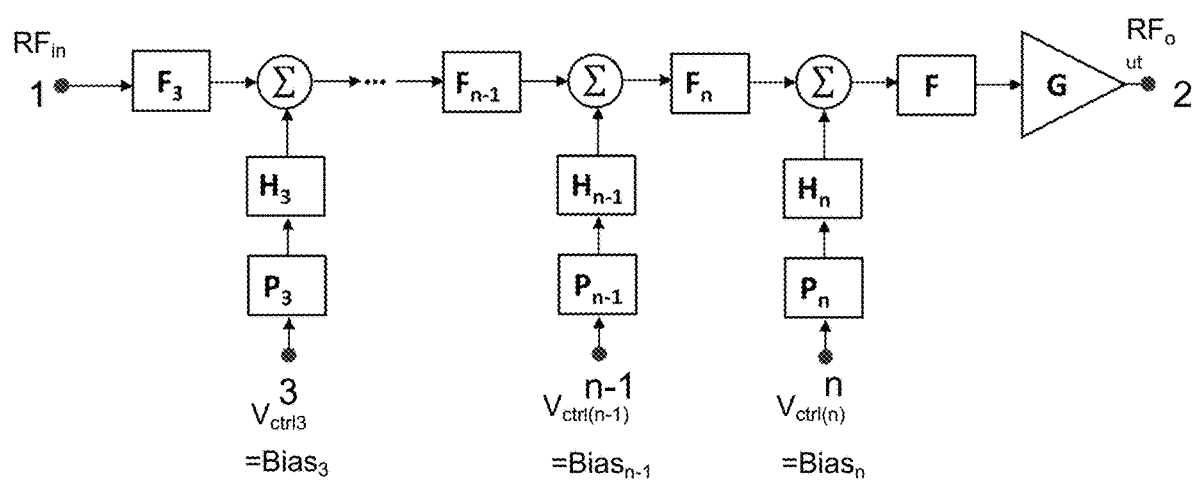
FIG. 22 illustrates the PA linearizing module 30 with multiple consecutive feed-forward dynamic transfer functions of FIG. 21, where the control signals $V_{ctrl(n)}$ are RF or baseband dependent.
Figure 23:
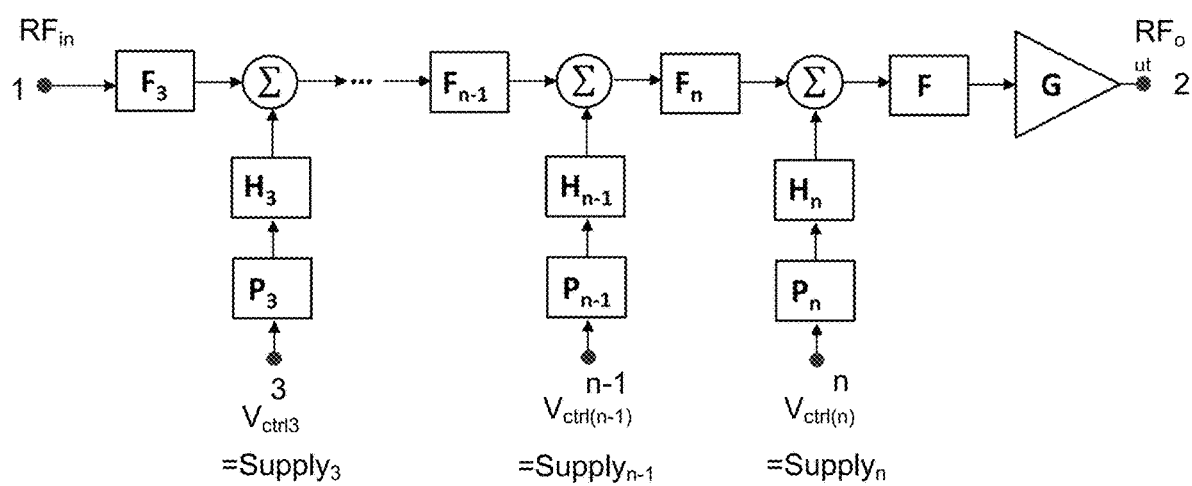
FIG. 23 the PA linearizing module 30 with multiple consecutive feed-forward dynamic transfer functions, where the control signals $V_{ctrl(n)}$ correspond to $Supply_n$ and are RF or baseband dependent.
Figure 24:
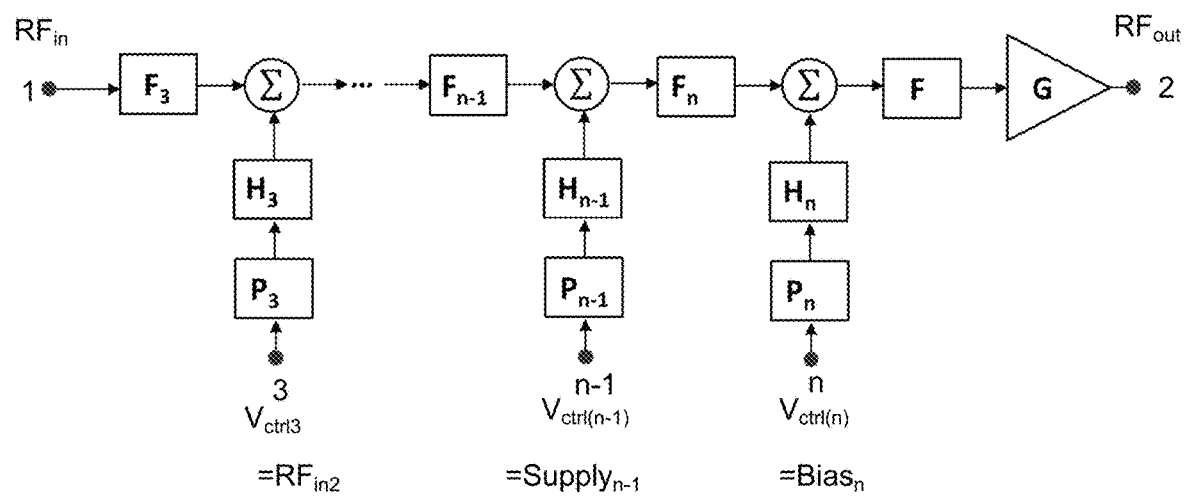
FIG. 24 illustrates the PA linearizing module 30 with multiple consecutive feed-forward dynamic transfer functions, where the control signals $V_{ctrl(n)}$ are RF or baseband dependent, and/or correspond to one of the $Supply_n$ or $Bias_n$.
Figure 25:
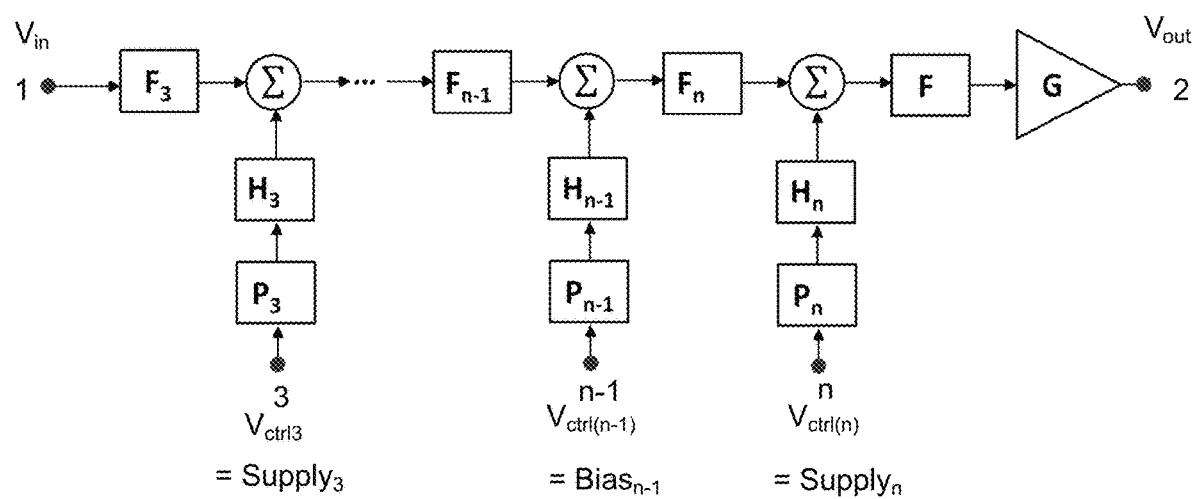
FIG. 25 illustrates the PA linearizing module 30 with multiple consecutive feed-forward dynamic transfer functions, where the control signals $V_{ctrl(n)}$ are RF or baseband dependent, and/or correspond to one of the $Supply_n$ or $Bias_n$.
Figure 26:
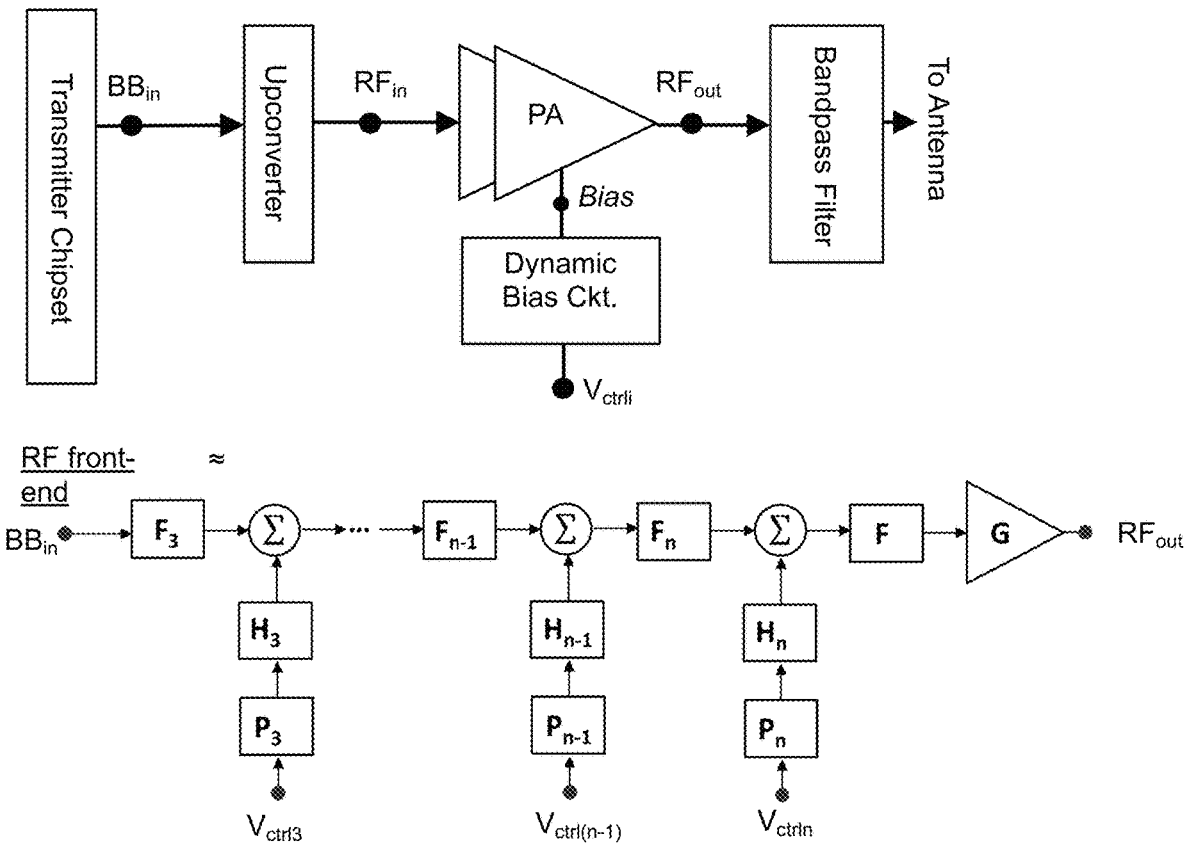
FIG. 26 illustrates the PA system 10 with the PA linearizing module 30 with multiple consecutive feed-forward dynamic transfer functions.
Figure 27:
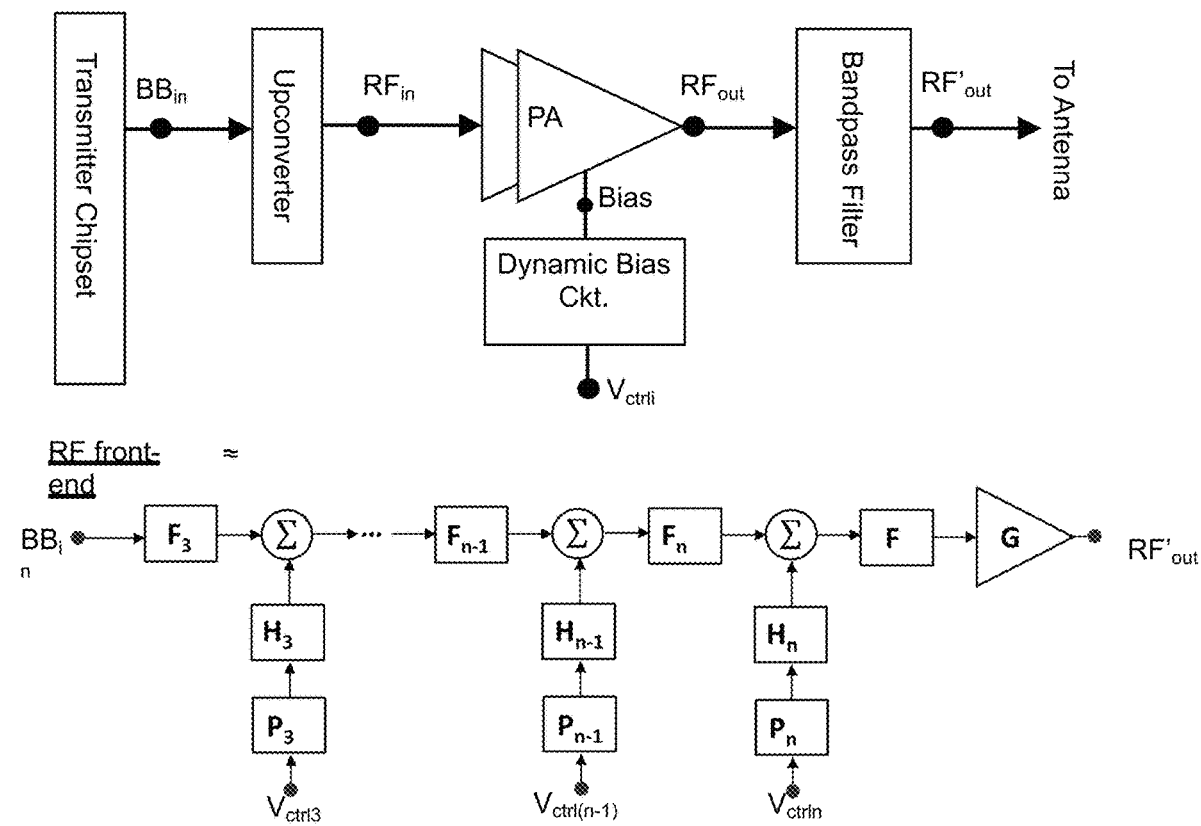
FIG. 27 illustrates the PA system 10 of FIG. 26 further including a bandpass filter.
Figure 28:
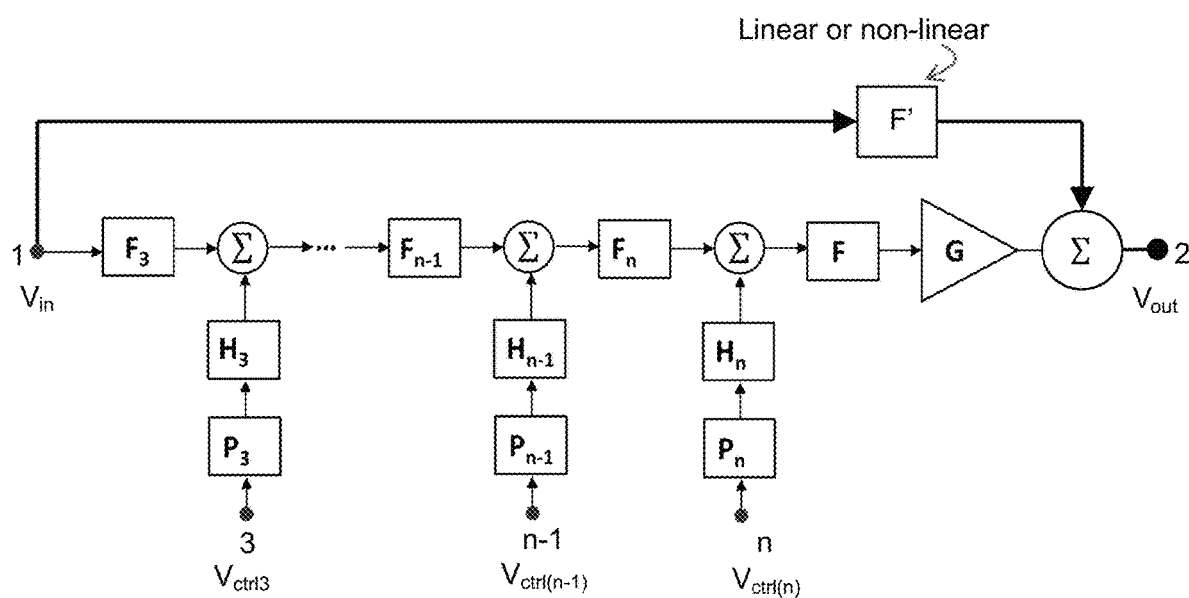
FIG. 28 illustrates the PA linearizing module 30 with a pre-distortion transfer function F'.
Figure 29:
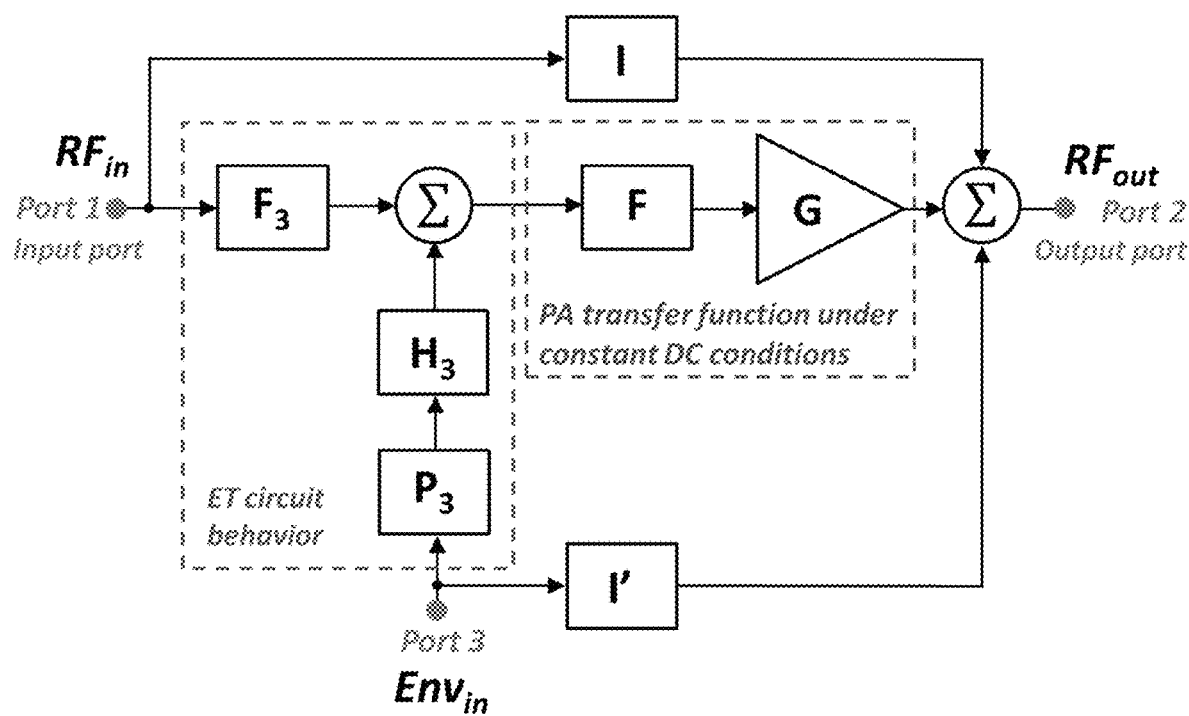
FIG. 29 illustrates the PA linearizing module 30 with pre-distortion transfer functions I and I'.
Figure 30:
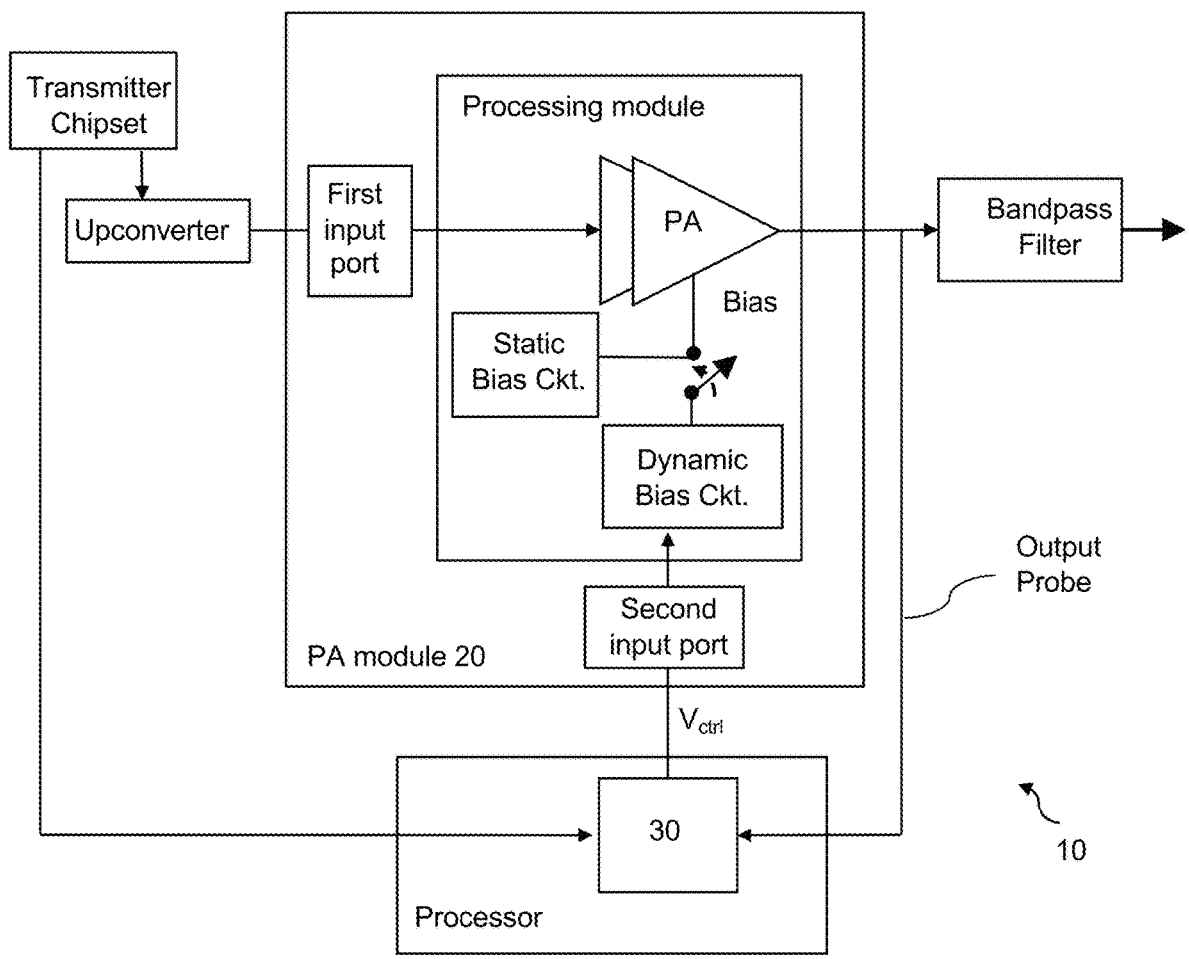
FIG. 30 illustrates the PA system 10, where the Input Probe signal is replaced with a signal from a baseband chipset.

Using equation (25), the conversion gain function transfer $C(V_i, V_e)$ is plotted as a function of the output power in FIG. 20, and also compared against the values obtained from circuit level simulation. The conversion gain transfer function $C(V_i, V_e)$ depends on both $V_i$ and $V_e$. For tracing the plot shown in FIG. 20 for every point on the $P_{out}$ axis, the input signal $V_i$ is kept constant, the dynamic bias component $V_e$ is considered as a small-signal input and the conversion gain is given by the PA's output envelope over the dynamic bias component $V_e$. As shown, there is an error of 0.5 dB between the simulated and determined values at $P_{out}$=14 dBm, which is the power level at which the PA linearizing module was parametrized. This error arises due to the approximation based on using a 1-tone RF parametrizing input signal $V_i$ applied to the formulations of the PA linearizing module to derive the expression of the conversion gain transfer function $C(V_i, V_e)$ given by equation (24), while the coefficients $a_1$, $a_3$ and $a_5$ of the PA linearizing module were extracted under a 3-tone RF parametrizing input signal $V_i$ and aimed at accurately determining the nonlinearities under multi-tone input and dynamic bias excitation.

As can be seen in FIG. 20, the determined and simulated values match well over a significant range of power levels where positive envelope feedback is useful (error of less than 0.8 dB up to $P_{out}$=20 dBm). This error increases as the power level increases, the increasing error being a result of the PA linearizing module being most accurate around the power level used during parametrization ($P_{out}$=14 dBm), and becoming less accurate at power levels away from it.

Note that the power level $P_{out}$=14 dBm used for the parametrization of the PA linearizing module was so chosen such that it is the most accurate at power levels close to the threshold power level $P_{ref}$~14 dBm, since it represents a critical power level for the implementation of positive envelope feedback. For determining the conversion gain transfer function C using equation (24) with better accuracy at higher $P_{out}$, the PA linearizing module should be re-parametrized at these desired levels of higher power and the newly extracted parameter values substituted in equation (24).

With the power-stage conversion gain transfer function C now known, control signals A and B are so adjusted such that together with the attenuation through the feedback components in FIG. 18, the total gain through the positive envelope feedback loop remains less than 0 dB for the range of output power levels of interest and where positive envelope feedback is useful. This ensures that PA stability is guaranteed when the feedback loop is closed.

Reference is now made to FIGS. 21 to 25 which respectively represent examples of multiple consecutive feed-forward transfer functions sets in the PA linearizing module 30, where each Figure represents a different combination of control signals for the respective feed-forward transfer functions sets. Each one of the feed-forward transfer functions set is parametrized independently and in consecutive order as each subsequent feed-forward transfer functions set receives the adjust input signal generated by the previous feed-forward transfer functions set. The feed-forward transfer functions set are parametrized using one or several of the parametrization techniques previously discussed. The parametrizing input signal is received at the first feed-forward transfer functions set, and the adjusted input signal generated by the first feed-forward transfer functions set is used as parametrizing input signal for the second feed-forward transfer functions set, and so forth. Each feed-forward transfer functions set receives a different control signal, a different control signal component, or a different tone of a multi-tone parametrizing control signal. Furthermore, each feed-forward transfer functions set may receive a different type of control signal, for example bias control signals, supply control signals, each bias and supply control signals being RF-dependent or base-band dependent. Each feed-forward transfer functions set may further include a transfer function H (discussed above), and each input signal may first be handled by a transfer function F (as previously discussed). Each feed-forward transfer functions set behaves as previously described, with the exception that instead of receiving the input signal, only the first feed-forward transfer functions set of a group of consecutive feed-forward transfer functions set receives as an input the input signal, and the subsequent feed-forward transfer functions set receive as input the adjusted input signal generated by the immediately previous feed-forward transfer functions set henceforth.

More particularly, the power amplifier linearizing module comprises a first input port for receiving an input signal, a second input port for receiving a plurality of control signal components, and a processing module. The processing module is adapted for assigning each one of the control signal components to a distinct feed-forward transfer functions set. Each distinct feed-forward transfer functions set includes at least a transfer function P and a summing function. The processing module executes each one of the distinct feed-forward transfer functions set by:

1. Deriving an incremental change signal $\Delta V_a$ relative to the control signal component using the transfer function P within any given distinct feed-forward transfer functions set.

2. For any given feed-forward transfer functions set generating a signal at the output of its summer function and that becomes an input signal applied to the summing function of the consecutive feed-forward transfer functions set.

3. For the first feed-forward transfer functions set executing the summing function by summing the input signal and the incremental change signal $\Delta V_a$ to generate an adjusted input signal at the output of this first feed-forward transfer functions set.

4. For each consecutive feed-forward transfer functions set executing the summing function by summing the adjusted input signal generated by the preceding feed-forward transfer functions set to the incremental change signal $\Delta V_a$ to generate the adjusted input signa that may be used as an input to the following feed-forward transfer functions set.

5. The processing module further executes a transfer function G for the adjusted input signal received from the last feed-forward transfer functions set and generates an RF signal representative of the amplifying of the adjusted input signal based on the control signal component.

6. The processing module determines a linearizing control signal component based on the generated RF signal representative of the amplifying of the adjusted input signal, to be applied to the power amplifier.

Reference is also made to FIGS. 26 to 29 which schematically respectively represent examples of groups of feed-forward transfer functions sets in the PA linearizing module 30.

Figure 31:
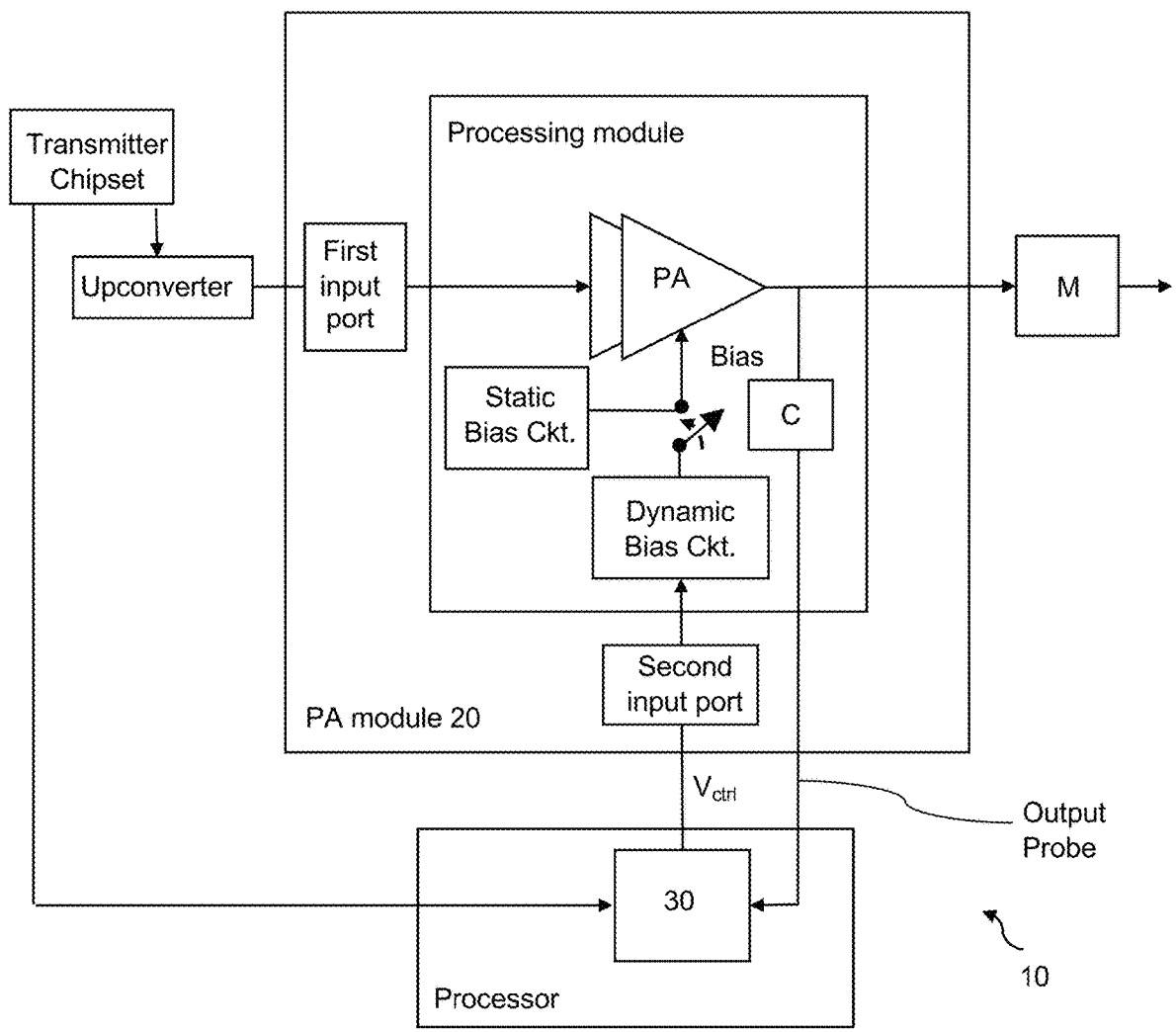
FIG. 31 illustrates the PA system 10, where the Input Probe is replaced with a signal from the baseband chipset, further comprising a transfer function M.
Figure 32:
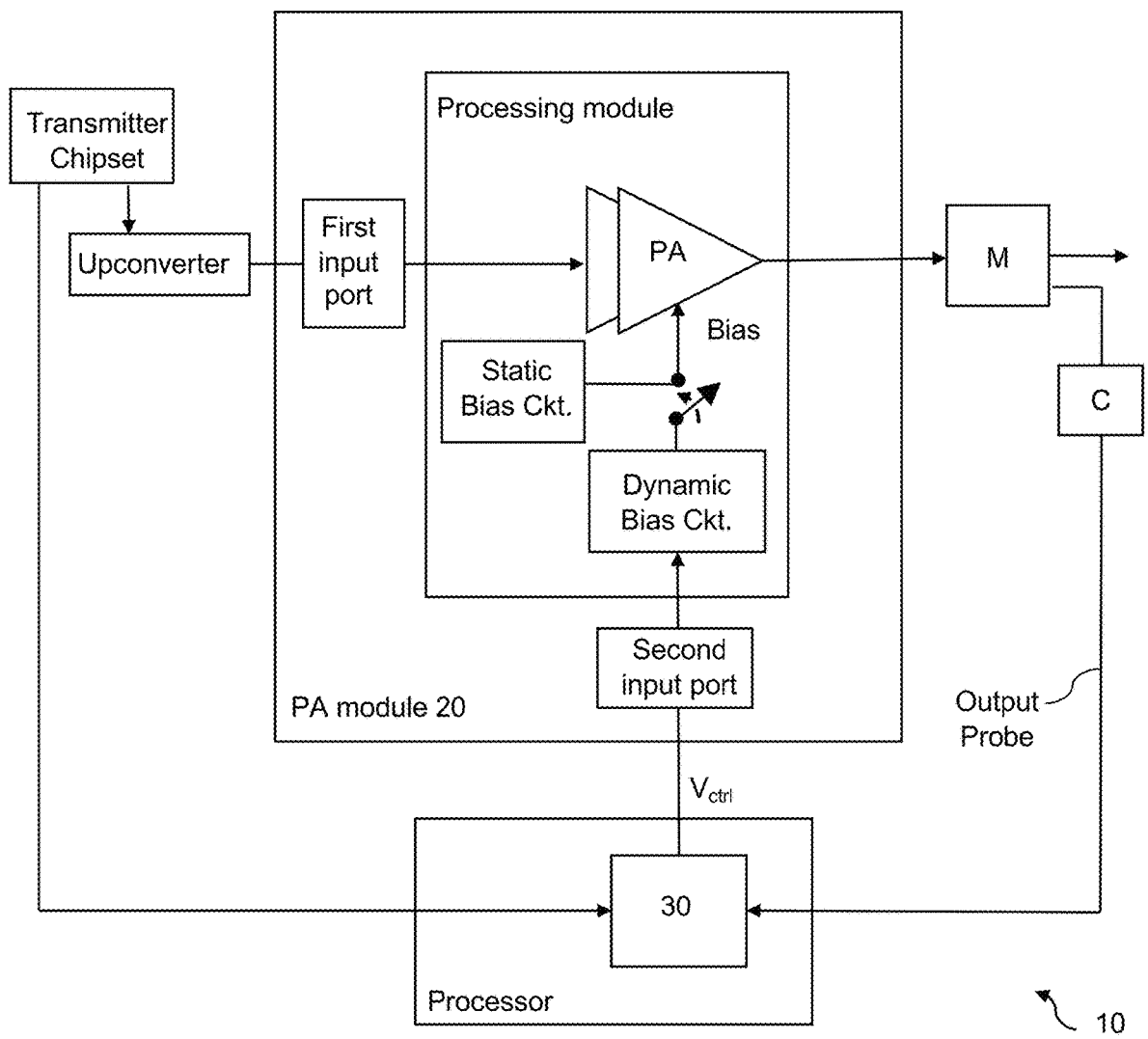
FIG. 32 illustrates the PA system 10, where the output of the PA 20 is connected to a port of the transfer function M, where the input of the transfer function C is connected to a port of the transfer function M and where this same port of the transfer function M that is connected to the input of the transfer function C may be connected to the antenna either directly or through another port of transfer function M or may be connected to any node within transfer function M.
Figure 33:
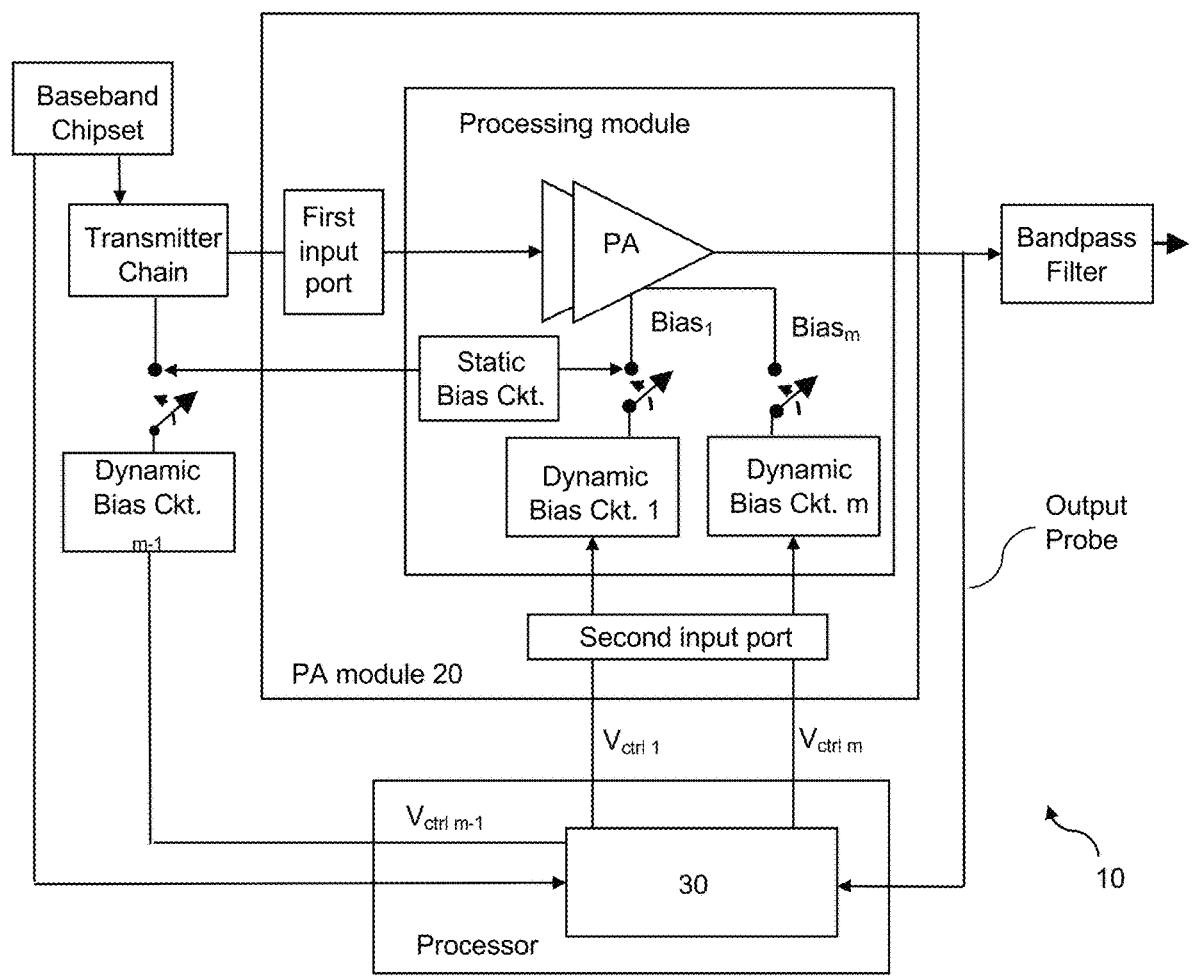
FIG. 33 illustrates the PA system 10, where the PA linearizing module 30 determines multiple control signals $V_{ctrl1}, \ldots V_{ctrlm}$ used for the biasing of one or several circuit blocks (such as gain blocks, mixers, etc.) within a Transmitter chain and within the PA line-up for embedded RF Transmitter self-calibration.

Reference is also made to FIGS. 30 to 33 which respectively schematically represent examples of implementations of the PA system 10. More particularly, FIG. 31 illustrates FIG. 31 illustrates the PA system 10, where the Input Probe is replaced with a signal from the baseband chipset, the output of the PA 20 is concurrently connected to a port of a linear or nonlinear multi-port transfer function C having one or more input ports and one or more output ports and also connected to a port of a linear or nonlinear multi-port transfer function M, where another port of the transfer function C is further connected to the Output Probe, where the transfer function C may represent any circuit block or any type of signal processing such as analog processing or RF processing or digital processing of the signal present at the output of the PA 20, where the transfer function M may represent a multi-port passive or active network component having one or more input ports and one or more output ports such as a duplexer, isolator, filter, coupler, combiner, six-port reflectometer, VSWR detector, etc.

Figure 34:
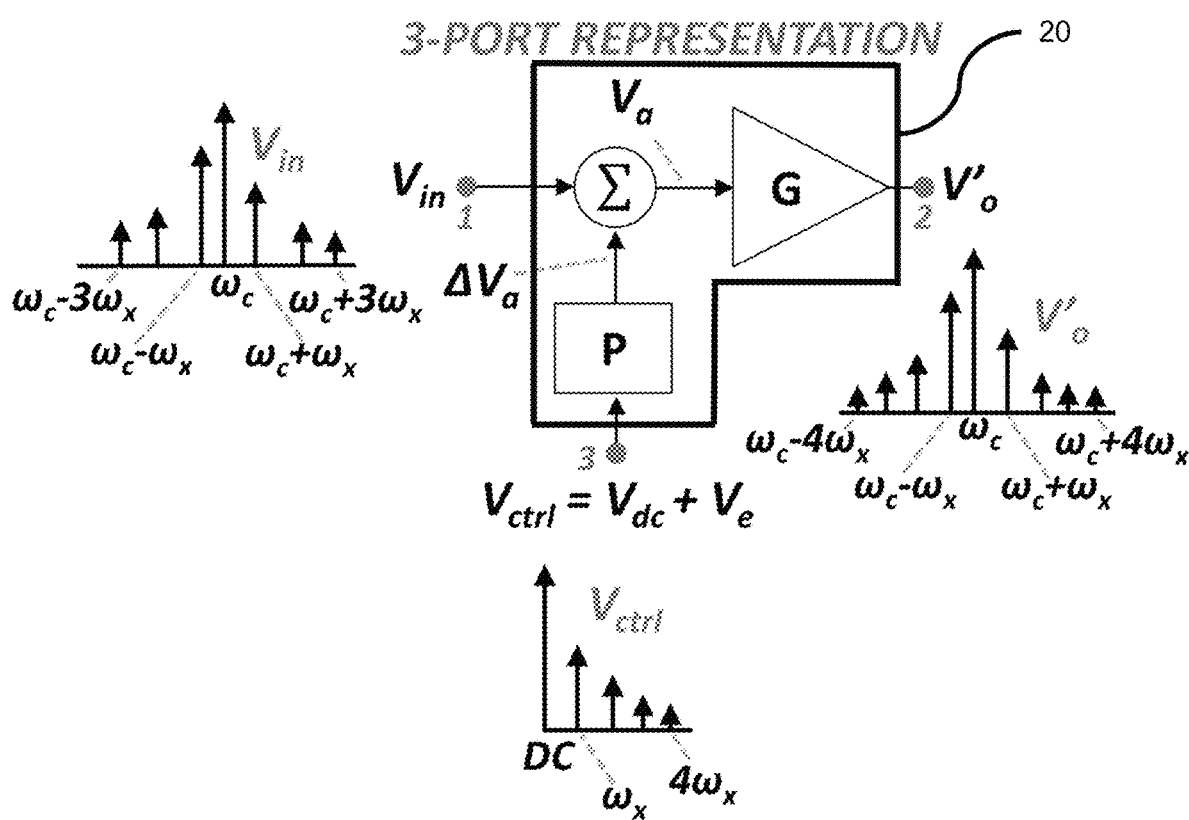
FIG. 34 illustrates the PA linearizing module 30, in parametrization using a multi-tone parametrization input signal $V_{in}$ that contains more than three tones such as a seven-tone signal.

FIG. 34 illustrates the PA linearizing module 30 excited using a multi-tone parametrization input signal $V_{in}$ that contains more than three tones such as a seven-tone signal. Other embodiments of the multi-tone parametrization input signal $V_{in}$ may include (but not limited to) four tones, five tones, six tones etc.

Figure 35:
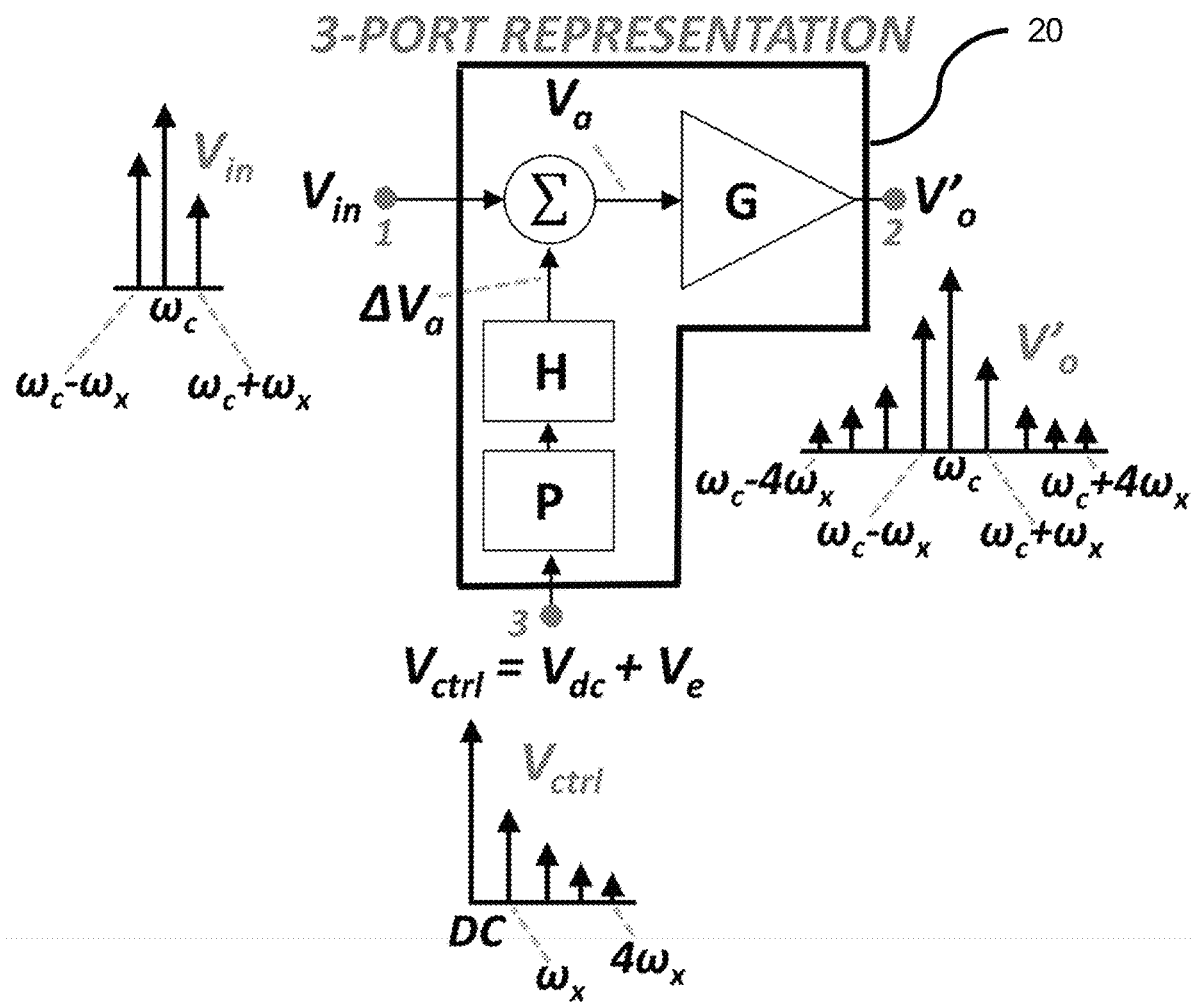
FIG. 35 illustrates another exemplary implementation of the PA linearizing module 30, further including a transfer function H in addition to the transfer P, where the transfer function H is a phase modulator representing AM-PM (Amplitude Modulation-Phase Modulation) pre-distortion through dynamic biasing and the transfer function P represents AM-AM (Amplitude Modulation-Amplitude Modulation) pre-distortion through dynamic biasing.
Figure 36:
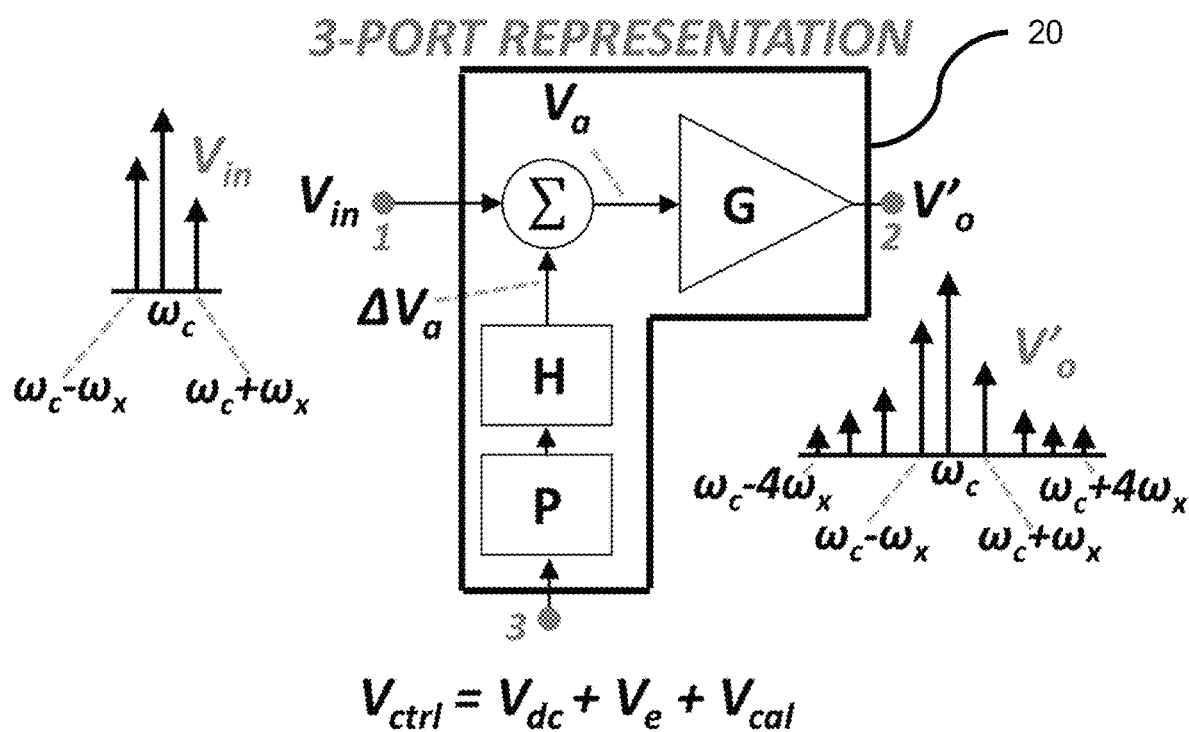
FIG. 36 illustrates another exemplary implementation of the PA linearizing module 30, where the $V_{ctrl}$ signal includes a signal $V_{cal}$, where $V_e$ is an envelope-dependent dynamic control signal, such as an envelope-dependent supply modulation signal in Envelope Tracking PAs, $V_{cal}$ represents a calibration signal, the transfer function H is one of a filter or phase equalizer that represents a frequency dependence of AM-AM & AM-PM predistortion to provide calibration of the AM-AM & AM-PM predistortion over a frequency range (such as a low pass, high pass, band pass, band stop or a combination thereof filtered frequency range), where $V_{cal}$ is centered at one of: the same frequency $\omega_x$ as $V_e$ or centered at a different frequency $\omega_r$, where $V_{cal}$ is added to $V_e$ signal and $V_{dc}$ signal.

FIGS. 35 and 36 illustrate the PA linearizing module 30 where the signal flow includes additional transfer functions related to representing AM-PM pre-distortion (amplitude modulation to phase modulation pre-distortion) through dynamic biasing and to allow calibration of the AM-AM & AM-PM predistortion.

Figure 37:
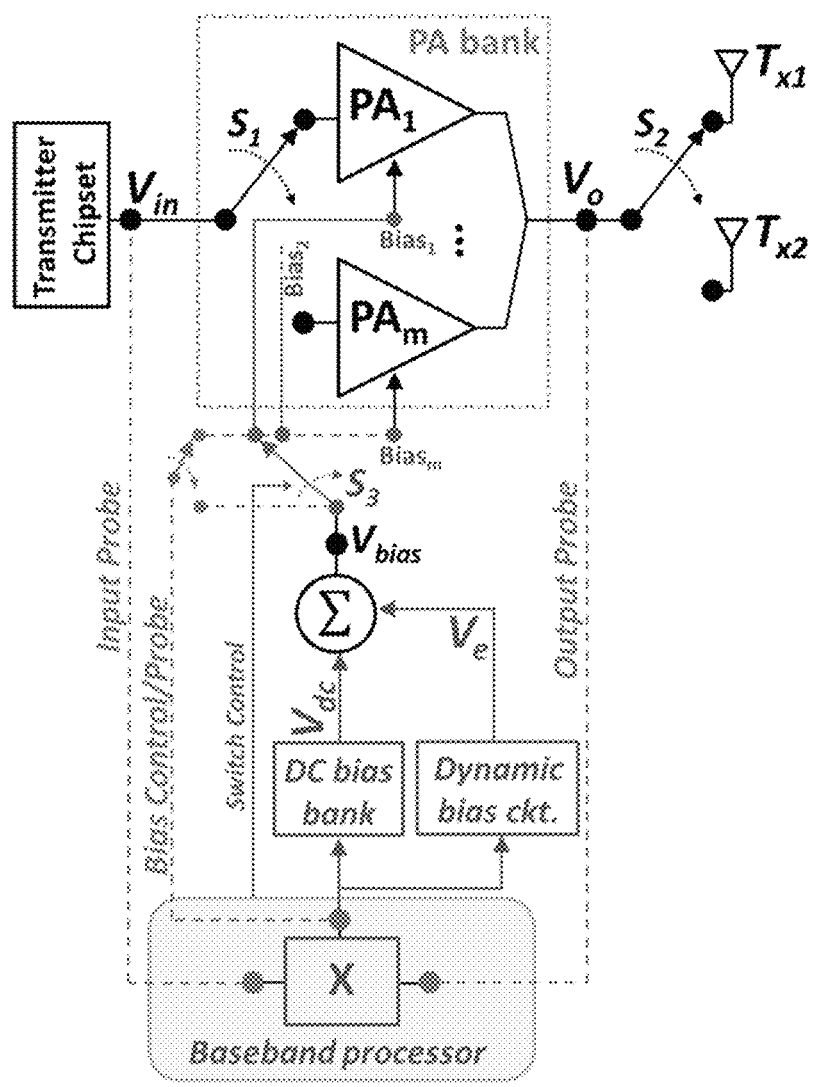
FIG. 37 schematically illustrates another exemplary implementation the PA system 10 where the PA 20 is composed of two or more amplifying blocks which use ON/OFF switching control or biasing or which use continuous control or biasing, the control or biasing include any form of current control in any branch of the amplifying blocks and any form of voltage control at any node within the amplifying blocks, with a PA linearization module 30.

FIG. 37 schematically illustrates the present PA system 10 where the PA 20 is composed of two or more amplifying blocks which use ON/OFF switching control or biasing or which use continuous control or biasing. It shall be understood that the control or biasing include any form of current control in any branch of the amplifying blocks and any form of voltage control at any node within the amplifying blocks. The current control and the voltage control being performed in conjunction with the use of the PA linearization module 30.

To summarize, the present PA linearizing module relies on transfer functions that emulate one or several of the following functions: a combiner, a nonlinear baseband-to-RF converter and a nonlinear RF amplifying function, for the processing of the input modulated RF signal and any envelope-dependent dynamic control signal or any other function affecting negatively the linearity of the PA. The present PA linearizing module simplifies computation and renders possible closed-form analytical parametrization. It allows an accurate determination of multi-tone signals and distortion components at the PA's output as a function of an input RF multi-tone excitation and a multi-tone envelope-dependent dynamic control signal. Hence, it allows determining the necessary adjustments in the dynamic control signal and circuitry, for linearity improvement with modulated signals as well. The PA linearizing module is envisioned as promising for future mobile communication equipment, in terms of performance optimization. The underlying concept of automatic optimization of linearity performance in Radio Frequency Integrated Circuit (RFIC) PAs that employ envelope-dependent dynamic control requires the design and implementation of embedded self-calibration functions within the transmitter front-ends of mobile equipment. It has been demonstrated that, in this proposed context of embedded self-calibration within the mobile unit, the PA linearizing module compares favorably in terms of accuracy with respect to Volterra-based approaches and at the same time allows a simpler parametrization process. The present PA linearizing module allows the optimization of the PA's dynamic control for linearity improvement on a per mobile basis through embedded self-calibration starting from quasi-static measurements of the PA's input and output power. The applicability of the present PA linearizing module performance has been validated through simulation and benchmarking against experimental results, demonstrating accurate parametrization under different dynamic control techniques, for multiple RFIC PA platforms and in different technologies. In one experimental implementation using an industry-designed GaAs PA, it accurately determined the necessary dynamic control adjustments to achieve more than 4 dB reduction in the output intermodulation distortion ($IMD_3$). Similar reduction in Adjacent Channel Power (ACP) was demonstrated with a modulated signal. In a second experimental PA implementation using the recently introduced positive envelope feedback linearization scheme, the present PA linearizing module allows, for the first time, using an analytical approach for determining the condition of PA system stability under closed-loop positive envelope feedback operation, as well as determining the optimum performance requirements for the feedback system components.

The transfer function G generates an RF signal that is intended in the training and operation of the PA linearizing module to determine with high accuracy the actual output RF signal present at the output of the actual physical power amplifier being linearized when the same input signal is applied to the input port of the power amplifier and the same control signal is applied to the bias port of the power amplifier or to any port of the power amplifier that may have an influence on the characteristics of the RF signal at the output of the power amplifier.

Although the present disclosure has been described hereinabove by way of non-restrictive, illustrative embodiments thereof, these embodiments may be modified at will within the scope of the appended claims without departing from the spirit and nature of the present disclosure.

What is claimed is:

1. A power amplifier linearizing module for linearizing operation of a power amplifier, the power amplifier linearizing module comprising:
   a first input port for receiving an input signal;
   a second input port for receiving a control signal component;
   a processing module adapted for operating in a parametrizing mode and in an operation mode and for executing a feed-forward transfer functions set, wherein the feed-forward transfer functions set includes at least: a transfer function P and a summing function,
   wherein the processing module executes the transfer function P of the feed-forward transfer functions set for deriving an incremental change signal $\Delta V_a$ relative to the control signal component received and executes the summing function for summing the incremental change signal $\Delta V_a$ to the input signal to generate an adjusted input signal,
   wherein the processing module further executes a transfer function G using the adjusted input signal and the control signal component to generate an RF signal representative of the amplifying of the adjusted input signal based on the control signal component, and
   wherein the processing module determines a linearizing control signal component based on the generated RF signal representative of the amplifying of the adjusted input signal, to be applied to the power amplifier based on the input signal; and
   a first output port for outputting the linearizing control signal component.

2. The power amplifier linearizing module of claim 1, wherein when the processing module is in parametrization mode, the input signal is a three-tone signal with known magnitude and phase.

3. The power amplifier linearizing module of claim 1, wherein when the processing module is in parametrization mode, the control signal is a multi-tone parametrizing dynamic bias component $v_e(t)$ $v_e(t)$ excluding Direct Current.

4. The power amplifier linearizing module of claim 1, wherein when the processing module is in parametrization mode, the incremental change signal $\Delta V_a$ is a multitone signal defining tone frequency, tone magnitude and tone phase.

5. The power amplifier linearizing module of claim 1, wherein the function transfer P comprises a set of complex coefficients defining a multi-tone baseband to multi-tone RF conversion gain.

6. The power amplifier linearizing module of claim 1, wherein in operation, the linearizing control signal component is a dynamic bias component $v_e(t)$ $v_e(t)$ for controlling the power amplifier.

7. The power amplifier linearizing module of claim 1, further comprising a third input for receiving in operation mode an envelope input signal, and the feed-forward functions set further comprises a pre-distortion transfer function F.

8. The power amplifier linearizing module of claim 1, further comprising a third input for receiving in operation an envelope input signal, and the processing module further executes a conversion gain transfer function C dependent on the input signal and the linearizing control signal component is a dynamic bias component $v_e(t)$ $v_e(t)$ for providing positive envelope feedback.

9. The power amplifier linearizing module of claim 1, wherein when the processing module is in the operation mode, the input signal and the control signal component are modulated RF signals.

10. A power amplifier linearizing module for linearizing operation of a power amplifier, the power amplifier linearizing module comprising:
   a first input port for receiving an input signal;
   a second input port for receiving a plurality of control signal components;
   a processing module adapted for assigning each one of the control signal components to a distinct feed-forward transfer functions set wherein each distinct feed-forward transfer functions set includes at least a transfer function P and a summing function, the processing module executes each one of the distinct feed-forward transfer functions set by:

deriving an incremental change signal $\Delta V_a$ relative to the control signal component using the transfer function P within any given distinct feed-forward transfer functions set, for any given feed-forward transfer functions set generating a signal at the output of its summer function and that becomes an input signal applied to the summing function of the consecutive feed-forward transfer functions set, for the first feed-forward transfer functions set executing the summing function by summing the input signal and the incremental change signal $\Delta V_a$ to generate an adjusted input signal at the output of this first feed-forward transfer functions set, for each consecutive feed-forward transfer functions set executing the summing function by summing the adjusted input signal generated by the preceding feed-forward transfer functions set to the incremental change signal $\Delta V_a$ to generate the adjusted input signal that may be used as an input to the following feed-forward transfer functions set; and wherein the processing module further executes a transfer function G for the adjusted input signal received from the last feed-forward transfer functions set and generates an RF signal representative of the amplifying of the adjusted input signal based on the control signal component, and wherein the processing module determines a linearizing control signal component based on the generated RF signal representative of the amplifying of the adjusted input signal, to be applied to the power amplifier.

11. A power amplifier system comprising:
at least one power amplifier; and
the power amplifier linearizing module of claim 1.

* * * * *